US010578968B2

(12) United States Patent
Yamamoto et al.

(10) Patent No.: US 10,578,968 B2
(45) Date of Patent: *Mar. 3, 2020

(54) PATTERN FORMING METHOD, RESIST PATTERN, AND PROCESS FOR PRODUCING ELECTRONIC DEVICE

(71) Applicant: FUJIFILM Corporation, Tokyo (JP)

(72) Inventors: Kei Yamamoto, Haibara-gun (JP); Naohiro Tango, Haibara-gun (JP); Naoki Inoue, Haibara-gun (JP); Michihiro Shirakawa, Haibara-gun (JP); Akiyoshi Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 50 days.

This patent is subject to a terminal disclaimer.

(21) Appl. No.: 15/470,113

(22) Filed: Mar. 27, 2017

(65) Prior Publication Data
US 2017/0199461 A1 Jul. 13, 2017

Related U.S. Application Data

(63) Continuation of application No. PCT/JP2015/076749, filed on Sep. 18, 2015.

(30) Foreign Application Priority Data

Sep. 30, 2014 (JP) .................. 2014-202626

(51) Int. Cl.
| G03F 7/11 | (2006.01) |
| G03F 7/039 | (2006.01) |
| G03F 7/004 | (2006.01) |
| G03F 7/32 | (2006.01) |
| G03F 7/038 | (2006.01) |
| G03F 7/38 | (2006.01) |
| C08F 220/18 | (2006.01) |
| C08F 220/28 | (2006.01) |
| G03F 7/09 | (2006.01) |
| G03F 7/16 | (2006.01) |
| G03F 7/20 | (2006.01) |
| G03F 7/40 | (2006.01) |
| H01L 21/027 | (2006.01) |

(52) U.S. Cl.
CPC .............. *G03F 7/11* (2013.01); *C08F 220/18* (2013.01); *C08F 220/28* (2013.01); *G03F 7/0045* (2013.01); *G03F 7/0046* (2013.01); *G03F 7/038* (2013.01); *G03F 7/039* (2013.01); *G03F 7/0397* (2013.01); *G03F 7/091* (2013.01); *G03F 7/16* (2013.01); *G03F 7/168* (2013.01); *G03F 7/2041* (2013.01); *G03F 7/325* (2013.01); *G03F 7/327* (2013.01); *G03F 7/38* (2013.01); *G03F 7/40* (2013.01); *H01L 21/0274* (2013.01); *H01L 21/0276* (2013.01); *C08F 2220/283* (2013.01)

(58) Field of Classification Search
CPC ....................................... G03F 7/11
See application file for complete search history.

(56) References Cited

U.S. PATENT DOCUMENTS

| 2009/0042147 | A1 | 2/2009 | Tsubaki |
| 2012/0156617 | A1* | 6/2012 | Kataoka ............... G03F 7/0045 |
| | | | 430/283.1 |
| 2012/0288796 | A1 | 11/2012 | Katayama et al. |
| 2013/0189620 | A1 | 7/2013 | Suka et al. |
| 2013/0244438 | A1 | 9/2013 | Bae et al. |
| 2014/0113223 | A1 | 4/2014 | Kato et al. |
| 2014/0227637 | A1 | 8/2014 | Kato et al. |
| 2014/0234761 | A1 | 8/2014 | Shirakawa et al. |
| 2015/0338743 | A1 | 11/2015 | Iwato et al. |
| 2016/0004156 | A1 | 1/2016 | Sugiyama et al. |

FOREIGN PATENT DOCUMENTS

| JP | 2008-309878 A | 12/2008 |
| JP | 2013-033227 A | 2/2013 |
| JP | 2013-061647 A | 4/2013 |
| JP | 2013-076974 A | 4/2013 |
| JP | 2013-097002 A | 5/2013 |
| JP | 2013-097003 A | 5/2013 |
| JP | 2013-109279 A | 6/2013 |
| JP | 2013-151592 A | 8/2013 |
| JP | 2014-056194 A | 3/2014 |
| JP | 2014-167614 A | 9/2014 |
| JP | 2014-178566 A | 9/2014 |
| JP | 2015-114341 A | 6/2015 |
| KR | 10-2013-0086307 A | 8/2013 |
| KR | 10-2014-0096039 A | 8/2014 |

OTHER PUBLICATIONS

International Search Report of PCT/JP2015/076749, dated Oct. 27, 2015. [PCT/ISA/210].
Communication dated Jan. 30, 2018, from Japanese Patent Office in counterpart application No. 2016-551947.
International Preliminary Report on Patentability and translation of Written Opinion issued from the International Bureau in counterpart International Application No. PCT/JP2015/076749, dated Apr. 13, 2017.

(Continued)

Primary Examiner — Kathleen Duda
(74) Attorney, Agent, or Firm — Sughrue Mion, PLLC

(57) ABSTRACT

The present invention has an object to provide a pattern forming method capable of providing good DOF and EL, a resist pattern formed by the pattern forming method, and a method for manufacturing an electronic device, including the pattern forming method. The pattern forming method of the present invention includes a step a of coating an active-light-sensitive or radiation-sensitive resin composition onto a substrate to form a resist film, a step b of coating a composition for forming an upper layer film onto the resist film to form an upper layer film on the resist film, a step c of exposing the resist film having the upper layer film formed thereon, and a step d of developing the exposed resist film using a developer to form a pattern, in which the active-light-sensitive or radiation-sensitive resin composition contains a hydrophobic resin.

17 Claims, No Drawings

(56) References Cited

OTHER PUBLICATIONS

Communication dated Mar. 20, 2018, from Korean Intellectual Property Office in counterpart application No. 10-2017-7008416.
Communication dated Nov. 12, 2018, from Korean Intellectual Property Office in counterpart application No. 10-2017-7008416.
Communication dated Apr. 11, 2019, from Taiwanese Intellectual Property Office in counterpart Application No. 104131674.

* cited by examiner

PATTERN FORMING METHOD, RESIST PATTERN, AND PROCESS FOR PRODUCING ELECTRONIC DEVICE

CROSS-REFERENCE TO RELATED APPLICATIONS

This application is a Continuation of PCT International Application No. PCT/JP2015/076749 filed on Sep. 18, 2015, which claims priority under 35 U.S.C. § 119(a) to Japanese Patent Application No. 2014-202626 filed on Sep. 30, 2014. The above application is hereby expressly incorporated by reference, in its entirety, into the present application.

BACKGROUND OF THE INVENTION

1. Field of the Invention

The present invention relates to a pattern forming method, a resist pattern formed by the pattern forming method, and a method for manufacturing an electronic device, including the pattern forming method.

More specifically, the present invention relates to a pattern forming method which is used for a process for manufacturing a semiconductor such as an IC, the manufacture of a circuit board for a liquid crystal, a thermal head, or the like, and other lithographic processes for photofabrication, as well as a resist pattern formed by the pattern forming method, and a method for manufacturing an electronic device, including the pattern forming method.

2. Description of the Related Art

In processes for manufacturing semiconductor devices such as an IC in the related art, microfabrication by means of lithography using various resist compositions has been carried out. For example, JP2013-061647A describes "a method for forming an electronic device, including (a) a step of providing a semiconductor base including one or more layers on which a pattern is formed; (b) a step of forming a photoresist layer on the one or more layers on which a pattern is formed; (c) a step of coating a photoresist topcoat composition on the photoresist layer, in which the topcoat composition includes a basic quencher, a polymer, and an organic solvent; (d) a step of exposing the layer with chemical rays; and (c) a step of developing the exposed film with an organic solvent developer".

SUMMARY OF THE INVENTION

The present inventors have investigated the method described in JP2013-061647A, and as a result, they have found that there are some cases where depth of focus (DOF) and exposure latitude (EL) are deteriorated.

The present invention has been made taking consideration of the above aspects, and thus has objects to provide a pattern forming method capable of providing good DOF and EL, a resist pattern formed by the pattern forming method, and a method for manufacturing an electronic device, including the pattern forming method.

The present inventors have found that the objects are accomplished by adopting the following configurations. That is, the present invention provides (1) to (13) below.

(1) A pattern forming method comprising:

a step a of coating an active-light-sensitive or radiation-sensitive resin composition onto a substrate to form a resist film;

a step b of coating a composition for forming an upper layer film onto the resist film to form an upper layer film on the resist film;

a step c of exposing the resist film having the upper layer film formed thereon; and a step d of developing the exposed resist film using a developer to form a pattern, in which the active-light-sensitive or radiation-sensitive resin composition contains a hydrophobic resin.

(2) The pattern forming method as described in (1), in which the content of the hydrophobic resin is 0.01% to 30% by mass with respect to the total solid content of the active-light-sensitive or radiation-sensitive resin composition.

(3) The pattern forming method as described in (1) or (2), in which the hydrophobic resin contains at least one selected from the group consisting of a fluorine atom, a silicon atom, and a $CH_3$ partial structure contained in the side chain moiety of the resin.

(4) The pattern forming method as described in any one of (1) to (3), in which the hydrophobic resin includes a resin containing 0% to 20% by mole of fluorine atom-containing repeating units with respect to all the repeating units.

(5) The pattern forming method as described in any one of (1) to (4), in which the composition for forming an upper layer film contains a resin including 0% to 20% by mole of fluorine atom-containing repeating units with respect to all the repeating units.

(6) The pattern forming method as described in any one of (1) to (5), in which the composition for forming an upper layer film contains a resin including repeating units having at least three $CH_3$ partial structures in the side chain moiety.

(7) The pattern forming method as described in any one of (1) to (6), in which the composition for forming an upper layer film contains a resin including repeating units having a monocyclic or polycyclic cycloalkyl group.

(8) The pattern forming method as described in any one of (1) to (7), in which the composition for forming an upper layer film contains a resin having a glass transition temperature of 50° C. or higher.

(9) The pattern forming method as described in any one of (1) to (8), in which the composition for forming an upper layer film contains at least one compound selected from the group consisting of the following (A1) and (A2):

(A1) a basic compound or a base generator; and (A2) a compound containing a bond or group selected from the group consisting of an ether bond, a thioether bond, a hydroxyl group, a thiol group, a carbonyl bond, and an ester bond.

(10) The pattern forming method as described in any one of (1) to (9), in which the step b is a step of coating a composition for forming an upper layer film onto the resist film, followed by carrying out heating to 100° C. or higher; to form an upper layer film on the resist film.

(11) The pattern forming method as described in any one of (1) to (10), in which the developer is a developer including an organic solvent.

(12) A resist pattern formed by the pattern forming method as described in any one of (1) to (11).

(13) A method for manufacturing an electronic device, comprising the pattern forming method as described in any one of (1) to (11).

According to the present invention, it is possible to provide a pattern forming method capable of providing good DOF and EL, a resist pattern formed by the pattern forming method, and a method for manufacturing an electronic device, including the pattern forming method.

DESCRIPTION OF THE PREFERRED EMBODIMENTS

Hereinafter, specific contents for carrying out the present invention will be described.

Moreover, in citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

"Active light" or "radiation" in the present specification means, for example, a bright line spectrum of a mercury lamp, far ultraviolet rays represented by an excimer laser, extreme ultraviolet rays (EUV light), X-rays, electron beams (EB), or the like. In addition, in the present invention, light means active light or radiation. Furthermore, unless otherwise specified, "exposure" in the present specification includes not only exposure by a mercury lamp, far ultraviolet rays represented by an excimer laser, extreme ultraviolet rays, X-rays, EUV light, or the like, but also writing by particle rays such as electron beams and ion beams.

The pattern forming method of the present invention is directed to a pattern forming method including a step a of coating an active-light-sensitive or radiation-sensitive resin composition onto a substrate to form a resist film, a step b of coating a composition for forming an upper layer film onto the resist film to form an upper layer film on the resist film, a step c of exposing the resist film having the upper layer film formed thereon, and a step d of developing the exposed resist film using a developer to form a pattern, in which the active-light-sensitive or radiation-sensitive resin composition contains a hydrophobic resin.

Accordingly, it is possible to realize enhancement of DOF and EL. The reasons therefor are presumed as follows.

The reasons why DOF and EL are improved by the pattern forming method of the present invention are not clear, but are presumed as follows.

When a deprotection reaction proceeds with an acid as a catalyst in an exposed area, diffusion of a generated acid and film shrinkage due to volatilization of a leaving substance that leaves from an acid-decomposable group proceed at the same time. At this time, the film density of the exposed area increases by the film shrinkage, and thus, the diffusion of the acid in the exposed area is suppressed.

Generally, it is thought that when a contrast between an exposed area and an unexposed area is high, the deprotection reaction contrast and the dissolution contrast increase, and thus, EL and DOF performance are improved, and as a result, improvement of EL and DOF performance can be expected from a small effect of film shrinkage in the exposed area.

Furthermore, it is known that after an active-light-sensitive or radiation-sensitive resin composition is coated onto a substrate, the hydrophobic resin components are unevenly distributed on the surface layer of the coated film.

Usually, in a system having no upper layer film, the effect of improving DOF and EL performance is not recognized even when the resist film includes the hydrophobic resin components. However, in the pattern forming method of the present invention, it is presumed that by further forming the upper layer film on the upper layer of the hydrophobic resin layer unevenly distributed on the resist layer surface, the film shrinkage due to volatilization of the leaving substance can be effectively inhibited, and thus, an effect of improving the contrast of the acid diffusion of the exposed areas and the unexposed area is presumably exerted, and the effect of improving the contrast is considered to contribute to improvement of EL and DOF.

Hereinafter, the pattern forming method of the present invention will be first described, and then the active-light-sensitive or radiation-sensitive resin composition (hereinafter also referred to as "the resist composition of the present invention"), and the composition for forming an upper layer film (hereinafter also referred to as a "topcoat composition"), each of which is used in the pattern forming method of the present invention, will be described.

[Pattern Forming Method]

The pattern forming method of the present invention includes a pattern forming method including a step a of coating an active-light-sensitive or radiation-sensitive resin composition onto a substrate to form a resist film, a step b of coating a composition for forming an upper layer film onto the resist film to form an upper layer film on the resist film, a step c of exposing the resist film having the upper layer film formed thereon, and a step d of developing the exposed resist film using a developer to form a pattern, in which the active-light-sensitive or radiation-sensitive resin composition contains a hydrophobic resin.

<Step a>

In the step a, the resist composition of the present invention is coated on a substrate to form a resist film (active-light-sensitive or radiation-sensitive film). The coating method is not particularly limited, and a spin coating method, a spray method, a roll coating method, a dip method, or the like, known in the related art, can be used, with the spin coating method being preferable.

After coating the resist composition of the present invention, the substrate may be heated (prebaked), if desired. Thus, a film in which insoluble residual solvents have been removed can be uniformly formed. The temperature for prebake is not particularly limited, but is preferably 50° C. to 160° C., and more preferable 60° C. to 140° C.

The substrate on which the resist film is formed is not particularly limited, and it is possible to use a substrate generally used in a process for manufacturing a semiconductor such as an IC, a process for manufacturing a circuit board for a liquid crystal, a thermal head, or the like, and other lithographic processes of photofabrication, and examples thereof include inorganic substrates such as silicon, $SiO_2$, and SiN, and coating type inorganic substrates such as Spin On Glass (SOG).

Prior to forming the resist film, an antireflection film may be applied onto the substrate in advance. As the antireflection film, any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film such as DUV-30 series or DUV-40 series manufactured by Brewer Science, Inc., AR-2, AR-3, or AR-5 manufactured by Shipley Company, L.L.C., or ARC series such as ARC29A manufactured by Chemical Industries, Ltd. can also be used.

<Step b>

In the step b, a composition (topcoat composition) for forming an upper layer film is coated on the resist film formed in the step a, and then heated (prebaked (PB)), if necessary, to form an upper layer film (hereinafter also referred to as a "topcoat") on the resist film. Thus, DOF is improved in the developed resist pattern as described above.

For a reason that the effects of the present invention are more excellent, the temperature for prebaking in the step b (hereinafter also referred to as a "PB temperature") is preferably 100° C. or higher, more preferably 105° C. or higher, still more preferably 110° C. or higher, particularly preferably 120° C. or higher, and the most preferably higher than 120° C.

The upper limit value of the PB temperature is not particularly limited, but is, for example, 200° C. or lower, preferably 170° C. or lower, more preferably 160° C. or lower, and still more preferably 150° C. or lower.

In a case where the exposure of the step c which will be described later is liquid immersion exposure, the topcoat is arranged between the resist film and the immersion liquid, and the resist film functions as a layer which is not brought in direct contact with the immersion liquid. In this case, preferred characteristics required for the topcoat (topcoat composition) are coating suitability onto the resist film, radiation, transparency, particularly to light at 193 nm, and poor solubility in an immersion liquid (preferably water). Further, it is preferable that the topcoat is not mixed with the resist film, and can be uniformly coated on the surface of the resist film.

Moreover, in order to uniformly coat the topcoat composition on the surface of the resist film while not dissolving the resist film, it is preferable that the topcoat composition contains a solvent in which the resist film is not dissolved. It is more preferable that as the solvent in which the resist film is not dissolved, a solvent of components other than an organic developer which will be described later. A method for coating the topcoat composition is not particularly limited, a spin coating method, a spray method, a roll coating method, a dip method, or the like known in the related art can be used.

From the viewpoint of the transparency at 193 nm of the topcoat composition, the topcoat composition contains a resin substantially not having aromatics. Specifically, examples of the resin include a resin having at least one of a fluorine atom or a silicon atom, which will be described later, and a resin having a repeating unit having a $CH_3$ partial structure in the side chain moiety, but is not particularly limited as long as it is dissolved in a solvent in which the resist film is not dissolved.

The film thickness of the topcoat is not particularly limited, but from the viewpoint of transparency to an exposure light source, the film is formed, which has a thickness of usually 5 nm to 300 nm, preferably 10 nm to 300 nm, more preferably 20 nm to 200 nm, and still more preferably 30 nm to 100 nm.

After forming the topcoat, the substrate is heated, if desired.

From the viewpoint of resolution, it is preferable that the refractive index of the topcoat is close to that of the resist film.

The topcoat is preferably insoluble in an immersion liquid, and more preferably insoluble in water.

From the viewpoint of immersion liquid tracking properties, with regard to the receding contact angle of the topcoat, the receding contact angle (23° C.) of the immersion liquid with respect to the topcoat is preferably 50 degrees to 100 degrees, and more preferably 80 to 100 degrees.

In the liquid immersion exposure, in a view that the immersion liquid needs to move on a wafer following the movement of an exposure head that is scanning the wafer at a high speed and forming an exposure pattern, the contact angle of the immersion liquid with respect to the resist film in a dynamic state is important, and in order to obtain better resist performance, the immersion liquid preferably has a receding contact angle in the above range.

When the topcoat is released after the step c which will be described later, an organic developer which will be described later may be used, and another release agent may also be used. As the release agent, a solvent hardly permeating the resist film is preferable. In a view that the release of the topcoat can be carried out simultaneously with the development of the resist film, the topcoat is preferably releasable with an organic developer. The organic developer used for release is not particularly limited as long as it makes it possible to dissolve and remove a less exposed area of the resist film. The organic developer can be selected from developers including a polar solvent such as a ketone-based solvent, an ester-based solvent, an alcohol-based solvent, an amide-based solvent, an ether-based solvent, and a hydrocarbon-based solvent, which will be described later. A developer including a ketone-based solvent, an ester-based solvent, an alcohol-based solvent, or an ether-based solvent is preferable, a developer including an ester-based solvent is more preferable, and a developer including butyl acetate is still more preferable.

From the viewpoint of release with an organic developer, the dissolution rate of the topcoat in the organic developer is preferably 1 to 300 nm/sec, and more preferably 10 to 100 nm/sec.

Here, the dissolution rate of a topcoat in the organic developer refers to a film thickness decreasing rate when the topcoat is exposed to a developer after film formation, and is a rate at a time of dipping a butyl acetate solution at 23° C. in the present invention.

By setting the dissolution rate of a topcoat in the organic developer to 1 nm/sec or more, and preferably 10 nm/sec or more, an effect of reducing development defects after developing a resist film is attained. Further, by setting the dissolution rate to 300 nm/sec or less, and preferably 100 nm/sec, as an effect of reducing the exposure unevenness during liquid immersion exposure, an effect that the line edge roughness of a pattern after the development of the resist film becomes better is attained.

The topcoat may also be removed using other known developers, for example, an aqueous alkali solution. Specific examples of the usable aqueous alkali solution include an aqueous tetramethylammonium hydroxide solution.

<Step c>

The exposure in the step c can be carried out by a generally known method, and for example, a resist film having a topcoat formed thereon is irradiated with active light or radiation through a predetermined mask. Here, the resist film is preferably irradiated with active light or radiation through an immersion liquid, but are not limited thereto. The exposure dose can be appropriately set, but is usually 1 to 100 $mJ/cm^2$.

The wavelength of the light source used in the exposure device in the present invention is not particularly limited, but light at a wavelength of 250 nm or less is preferably used, and examples of include KrF excimer laser light (248 nm), ArF excimer laser light (193 nm), $F_2$ excimer laser light (157 nm), EUV light (13.5 nm), and electron beams. Among these, ArF excimer laser light (193 nm) is preferably used.

In a case of carrying out liquid immersion exposure, before the exposure and/or after the exposure, the surface of the film may be cleaned with a water-based chemical before carrying out the heating which will be described later.

The immersion liquid is preferably a liquid which is transparent for exposure wavelength and has a minimum temperature coefficient of a refractive index so as to minimize the distortion of an optical image projected on the film. In particular, in a case where the exposure light source is an ArF excimer laser (wavelength: 193 nm), water is preferably used in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the resist film on a substrate, and gives a negligible effect on the optical coat at the undersurface of a lens element. Water to be used is preferably distilled water. Further, pure water which has been subjected to filtration through an ion exchange filter or the like may also be used. Thus, it is possible to suppress the distortion of an optical image projected on the resist film by the incorporation of impurities.

Furthermore, in a view of further improving the refractive index, a medium having a refractive index of 1.5 or more can also be used. This medium may be an aqueous solution or an organic solvent.

The pattern forming method of the present invention may also have the step c (exposure step) plural times. In the case, exposure to be carried out plural times may also use the same light source or different light sources, but for the first exposure, ArF excimer laser light (wavelength; 193 nm) is preferably used.

After the exposure, heating (bake, also referred to as PEB) is preferably carried out to perform development (preferably including rinsing). Thus, a good pattern can be obtained. The temperature for PEB is not particularly limited as long as a good resist pattern is obtained, and is usually 40° C. to 160° C. PEB may be carried out once or plural times.

<Step d>

The developer used in the step d may be an alkali developer or a developer including an organic solvent, but the developer including an organic solvent is preferable. The developing step using the alkali developer and the developing step using the developer including an organic solvent may be combined.

As the alkali developer, a quaternary ammonium salt, typically such as tetramethylammonium hydroxide, is usually used, but in addition, an aqueous alkali solution of inorganic alkali, primary to tertiary amines, alcoholamines, cyclic amines, or the like can also be used. Further, an appropriate amount of alcohols or a surfactant may also be added to the alkali developer. The alkali concentration of the alkali developer is usually 0.1% to 20% by mass. The pH of the alkali developer is usually 10.0 to 15.0.

Examples of the developer containing an organic solvent (hereinafter also referred to as an organic developer) which is used in the step d include developers containing a polar solvent such as a ketone-based solvent, an ester-based solvent, an alcohol-based solvent, an amide-based solvent, and an ether-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, and methyl 2-hydroxyisobutyrate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, propylene glycol, diethylene glycol, and triethylene glycol; and glycol ether-based solvents such as ethylene glycol monomethyl ether, propylene glycol monomethyl ether, diethylene glycol monomethyl ether, triethylene glycol monoethyl ether, and methoxymethylbutanol.

Examples of the ether-based solvent include, in addition to the glycol ether-based solvents above, dioxane, and tetrahydrofuran.

Examples of the amide-based solvent which can be used include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing it with a solvent other than those described above or with water. However, in order to sufficiently bring out the effects of the present invention, the moisture content in the entire developer is preferably less than 10% by mass, and it is more preferable that the developer contains substantially no water.

That is, the amount of the organic solvent to be used with respect to the organic developer is preferably from 90% by mass to 100% by mass, and more preferably from 95% by mass to 100% by mass, with respect to the total amount of the developer.

Among these, as the organic developer, a developer containing at least one kind of organic solvent selected from the group consisting of a ketone-based solvent, an ester-based solvent, an alcohol-based solvent, an amide-based solvent, and an ether-based solvent is preferable, a developer including a ketone-based solvent or an ester-based solvent is more preferable, and a developer including butyl acetate, butyl propionate, or 2-heptanone is still more preferable.

The vapor pressure of the organic developer is preferably 5 kPa or less, more preferably 3 kPa or less, and still more preferably 2 kPa or less, at 20° C. By setting the vapor pressure of the organic developer to 5 kPa or less, the evaporation of the developer on a substrate or in a development cup is suppressed, and the temperature evenness within a wafer plane is improved, whereby the dimensional evenness within a wafer plane is enhanced.

Specific examples of the solvent having a vapor pressure of 5 kPa or less (2 kPa or less) include the solvents described in paragraph [0165] of JP2014-71304A.

An appropriate amount of a surfactant may be added to the organic developer, if desired.

The surfactant is not particularly limited, and for example, an ionic or nonionic, fluorine- and/or silicon-based surfactant can be used. Examples of such a fluorine- and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP- S63-34540A), JP1995-230165A (JP-H07-230165A), JP1996-62834A (JP-H08-62834A), JP1997-54432A (JP-H09-54432A), JP1997-5988A (JP-H09-5988A), and U.S. Pat. Nos. 5,405,720A, 5,360,692A, 5,529,881A, 5,296,330A, 5,436,098A, 5,576,143A, 5,294,511A, and 5,824,451A, with the nonionic surfactant being preferable. The nonionic surfactant is not particularly limited, but the fluorine-based surfactant or the silicon-based surfactant is more preferably used.

The amount of the surfactant to be used is usually 0.001% to 5% by mass, preferably 0.005% to 2% by mass, and more preferably 0.01% to 0.5% by mass, with respect to the total amount of the developer.

The organic developer may also include a basic compound. Specific and preferred examples of the basic compound which can be included in the organic developer used in the present invention include those which will be described as the basic compounds which can be included in the active-light-sensitive or radiation-sensitive resin composition.

Examples of the developing method include a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate spun at a constant rate while scanning a developer discharging nozzle at a constant rate (a dynamic dispense method).

In addition, after the step of carrying out development using a developer including an organic solvent, a step of stopping the development while replacing the solvent with another solvent may also be included.

A cleaning step using a rinsing liquid may be included after the step of carrying out development using a developer including an organic solvent.

The rinsing liquid is not particularly limited as long as it does not dissolve the resist pattern, and a solution including a general organic solvent can be used. As the rinsing liquid, for example, a rinsing liquid containing at least one organic solvent selected from a hydrocarbon-based solvent, a ketone-based solvent, an ester-based solvent, an alcohol-based solvent, an amide-based solvent, and an ether-based solvent, described above as the organic solvent included in the organic developer is preferably used. More preferably, a step of carrying out cleaning using a rinsing liquid containing at least one kind of organic solvent selected from a hydrocarbon-based solvent, a ketone-based solvent, an ester-based solvent, an alcohol-based solvent, and an amide-based solvent is carried out. Still more preferably, a step of carrying out cleaning using a rinsing liquid containing a hydrocarbon-based solvent, an alcohol-based solvent, or an ester-based solvent is carried out. Particularly preferably, a step of carrying out cleaning using a rinsing liquid containing a monohydric alcohol is carried out.

Here, examples of the monohydric alcohol used in the rinsing step include linear, branched, or cyclic monohydric alcohols, and specifically, 1-butanol, 2-butanol, 3-methyl-1-butanol, 3-methyl-2-butanol, tert-butyl alcohol, I-pentanol, 2-pentanol, 3-methyl-2-pentanol, 4-methyl-2-pentanol, 1-hexanol, 2-hexanol, 3-hexanol, 4-methyl-2-hexanol, 5-methyl-2-hexanol, 1-heptanol, 2-heptanol, 3-heptanol, 4-methyl-2-heptanol, 5-methyl-2-heptanol, 1-octanol, 2-octanol, 3-octanol, 4-octanol, 4-methyl-2-octanol, 5-methyl-2-octanol, 6-methyl-2-octanol, 2-nonanol, 4-methyl-2-nonanol, 5-methyl-2-nonanol, 6-methyl-2-nonanol, 7-methyl-2-nonanol, 2-decanol, or the like can be used, with 1-hexanol, 2-hexanol, 1-pentanol, 3-methyl-1-butanol, or 4-methyl-2-heptanol being preferable.

Furthermore, examples of the hydrocarbon-based solvent used in the rinsing step include aromatic hydrocarbon-based solvents such as toluene and xylene; and aliphatic hydrocarbon-based solvents such as pentane, hexane, octane, and decane (n-decane).

The respective components in plural numbers may be mixed, or the components may be mixed with an organic solvents other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid is preferably 0.05 to 5 kPa, more preferably 0.1 to 5 kPa, and still more preferably 0.12 to 3 kPa, at 20° C. By setting the vapor pressure of the rinsing liquid to a range from 0.05 kPa to 5 kPa, the temperature evenness within a wafer plane is improved, and further, the dimensional evenness within a wafer plane is enhanced by inhibition of swelling due to the penetration of the rinsing liquid.

The rinsing liquid can also be used after adding an appropriate amount of a surfactant thereto.

In the rinsing step, the wafer which has been subjected to development using a developer including an organic solvent is subjected to a cleaning treatment using the rinsing liquid including an organic solvent. A method for the cleaning treatment is not particularly limited, and for example, a method in which a rinsing liquid is continuously discharged on a substrate rotated at a constant rate (a spin coating method), a method in which a substrate is immersed in a bath filled with a rinsing liquid for a certain period of time (a dip method), a method in which a rinsing liquid is sprayed onto a substrate surface (a spray method), or the like, can be applied. Among these, a method in which a cleaning treatment is carried out using the spin coating method, and a substrate is rotated at a rotation speed of 2,000 rpm to 4,000 rpm after cleaning, and then the rinsing liquid is removed from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

Moreover, in the pattern forming method of the present invention, development using an alkali developer may also be carried out after the development using an organic developer. A portion having weak exposure intensity is removed by development using an organic solvent, and a portion having strong exposure intensity is also removed by carrying out development using an alkali developer. Since pattern formation is carried out without dissolving only a region having intermediate exposure intensity by carrying out development plural times in this manner, a finer pattern than usual can be formed (the same mechanism as that in paragraph [0077] of JP2008-292975A).

As the alkali developer, for example, alkali aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethyl ethanolamine and triethanolamine, quaternary ammonium salts such as tetramethylammonium hydroxide and tetraethylammonium hydroxide; and cyclic amines such as pyrrole and piperidine, or the like can be used. Among these, an aqueous tetraethylammonium hydroxide solution is preferably used.

Moreover, an appropriate amount of alcohols or a surfactant can also be added to the alkali developer and used.

The alkali concentration of the alkali developer is usually 0.01% to 20% by mass.

The pH of the alkali developer is usually 10.0 to 15.0.

The time for carrying out development using an alkali developer is usually 10 to 300 seconds.

The alkali concentration (and the pH) of the alkali developer and the developing time can be appropriately adjusted depending on the patterns formed.

Cleaning may be carried out using a rinsing liquid after the development using an alkali developer, and as the rinsing liquid, pure water is used, or an appropriate amount of a surfactant may be added thereto before the use.

Furthermore, after the developing treatment or the rinsing treatment, a treatment for removing the developer or rinsing liquid adhering on the pattern by a supercritical fluid may be carried out.

In addition, a heating treatment can be carried out in order to remove moisture content remaining in the pattern after the rinsing treatment or the treatment using a supercritical fluid.

It is preferable that the active-light-sensitive or radiation-sensitive resin composition of the present invention and various materials (for example, a developer, a rinsing liquid, a composition for forming an antireflection film, and a composition for forming a topcoat) used in the pattern forming method of the present invention include no impurities such as a metal. The content of the metal components included in the these materials is preferably 10 ppm or less, more preferably 5 ppm or less, still more preferably 1 ppm or less, and particularly preferably substantially not metal components (no higher that the detection limit of a measurement device).

Examples of a method for removing impurities such as metals from the various materials include filtration using a filter. As for the filter pore diameter, the pore size is preferably 50 nm or less, more preferably 10 nm or less, and still more preferably 5 nm or less. As for the materials of a filter, a polytetrafluoroethylene-made filter, a polyethylene-made filter, and a nylon-made filter are preferable. In the step of filtration using a filter, plural kinds of filters may be connected in series or in parallel, and used. In the case of using plural kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials, subjecting raw materials constituting various materials to filtration using a filter. The preferred conditions for filtration using a filter, which is carried out for raw materials constituting various materials, are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

Moreover, a mold for imprints may be manufactured using the pattern forming method of the present invention, and regarding the details thereof, reference can be made to, for example, JP4109085B and JP2008-162101A.

The pattern forming method of the present invention can also be used in formation of a guide pattern (see, for example, ACS Nano Vol. 4 No. 8 Pages 4815-4823) in Directed Self-Assembly (DSA).

Furthermore, the resist pattern formed by the method can be used as a core material (core) in the spacer process disclosed in, for example, JP1991-270227A (JP-H03-270227A) and JP2013-164509A.

[Active-Light-Sensitive or Radiation-Sensitive Resin Composition]

Next, the active-light-sensitive or radiation-sensitive resin composition (hereinafter also conveniently referred to as "the resist composition of the present invention") used in the pattern forming method of the present invention will be described.

(A) Resin

The resist composition of the present invention typically contains a resin which has a decrease in the solubility in a developer including an organic solvent due to an increase in the polarity by the action of an acid.

The resin which has a decrease in the solubility in a developer including an organic solvent due to an increase in the polarity by the action of an acid (hereinafter also referred to as a "resin (A)") is preferably a resin (hereinafter also referred to as an "acid-decomposable resin" or an "acid-decomposable resin (A)") having a group (hereinafter also referred to as an "acid-decomposable group") that decomposes by the action of an acid to generate an alkali-soluble group at either the main chain or the side chain of the resin, or at both the main chain and the side chain.

Furthermore, the resin (A) is more preferably a resin having an alicyclic hydrocarbon structure which is monocyclic or polycyclic (hereinafter also referred to as an "alicyclic hydrocarbon-based acid-decomposable resin"). It is thought that the resin having an alicyclic hydrocarbon structure which is monocyclic or polycyclic has high hydrophobicity and has improved developability in a case of developing an area having a weak light irradiation intensity of the resist film by an organic developer.

The resist composition of the present invention, which contains the resin (A), can be suitably used in a case of irradiation with ArF excimer laser light.

Examples of the alkali-soluble group generated from the acid-decomposable group include groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, or a tris(alkylsulfonyl)methylene group.

Preferred examples of the alkali-soluble group include a carboxylic acid group, a fluorinated alcohol group (preferably hexafluoroisopropanol), and a sulfonic acid group.

A preferred group capable of decomposing by an acid (acid-decomposable group) is a group obtained by substituting a hydrogen atom of these alkali-soluble groups with a group capable of leaving with an acid.

Examples of the group that leaves include —C(R$_{36}$)(R$_{37}$)(R$_{38}$), —C(R$_{36}$)(R$_{37}$)(OR$_{39}$), and —C(R$_{01}$)(R$_{02}$)(OR$_{39}$).

In the formulae, R$_{36}$ to R$_{39}$ each independently represent an alkyl group, a cycloalkyl group, an aryl group, an aralkyl group, or an alkenyl group. R$_{36}$ and R$_{37}$ may be bonded to each other to form a ring.

R$_{01}$ and R$_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, a tertiary alkyl ester group, and the like are preferable, and a tertiary alkyl ester group is more preferable.

The resin (A) is preferably a resin containing at least one selected from repeating units having partial structures represented by the following General Formulae (pI) to (pV), or a repeating unit represented by the following General Formula (II-AB).

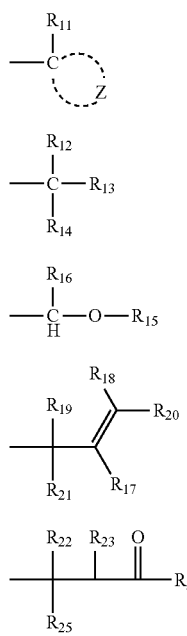

(pI)

(pII)

(pIII)

(pIV)

(pV)

In General Formulae (pI) to (pV),

R$_{11}$ represents a methyl group, an ethyl group, an n-propyl group, an isopropyl group, an n-butyl group, an isobutyl group, or a sec-butyl group, and Z represents an atomic group which is necessary for forming a cycloalkyl group together with carbon atoms.

R$_{12}$ to R$_{16}$ each independently represent a linear or branched alkyl group or cycloalkyl group, having 1 to 4 carbon atoms, provided that at least one of R$_{12}$, . . . , or R$_{14}$, or any one of R$_{15}$ and R$_{16}$ is a cycloalkyl group.

R$_{17}$ to R$_{21}$ each independently represent a hydrogen atom, or a linear or branched alkyl group or cycloalkyl group, having 1 to 4 carbon atoms, provided that at least one of R$_{17}$, . . . , or R$_{21}$ is a cycloalkyl group. Further, any one of R$_{19}$ and R$_{21}$ is a linear or branched alkyl group or cycloalkyl group, having 1 to 4 carbon atoms.

R$_{22}$ to R$_{25}$ each independently represent a hydrogen atom, or a linear or branched alkyl group or cycloalkyl group, having 1 to 4 carbon atoms, provided that at least one of R$_{22}$, . . . or R$_{25}$ is a cycloalkyl group. Further, R$_{23}$ and R$_{24}$ may be bonded to each other to form a ring.

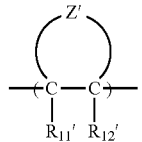

(II-AB)

In General Formula (II-AB),

R$_{11}$' and R$_{12}$' each independently represent a hydrogen atom, cyano group, a halogen atom, or an alkyl group.

Z' represents an atomic group for forming an alicyclic structure, which contains two carbon atoms (C—C) bonded to each other.

Furthermore, it is more preferable that General Formula (II-AB) is the following General Formula (II-AB) or (II-AB2).

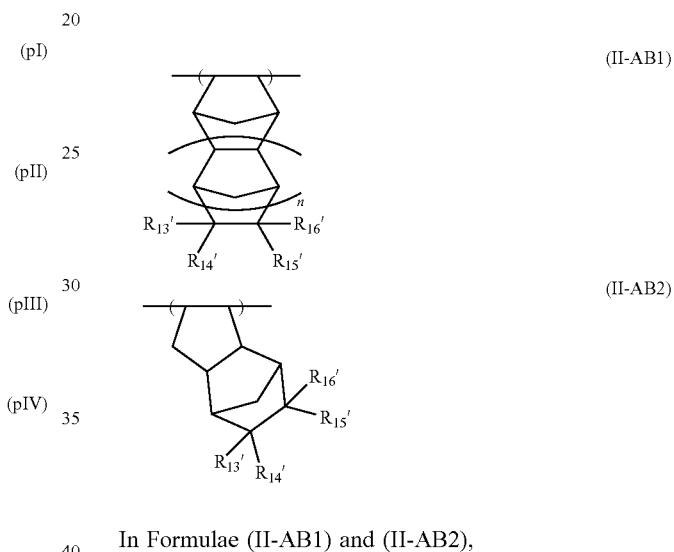

(II-AB1)

(II-AB2)

In Formulae (II-AB1) and (II-AB2),

R$_{13}$' to R$_{16}$' each independently represent a hydrogen atom, a halogen atom, a cyano group, —COOH, —COOR$_5$, a group that decomposes by the action of an acid, —C(=O)—X-A'-R$_{17}$', an alkyl group, or a cycloalkyl group, provided that at least two of R$_{13}$', . . . , or R$_{16}$' may be bonded to each other to form a ring.

Here, R$_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

R$_{17}$' represents —COOH, —COOR$_5$, —CN, a hydroxyl group, an alkoxy group, —CO—NH—R$_6$, —CO—NH—SO$_2$—R$_6$, or a group having a lactone structure.

R$_6$ represents an alkyl group or a cycloalkyl group.

n represents 0 or 1.

In General Formulae (pI) to (pV), the alkyl group in each of R$_{12}$ to R$_{25}$ is preferably a linear or branched alkyl group having 1 to 4 carbon atoms.

The cycloalkyl group in each of R$_{11}$ to R$_{25}$ or the cycloalkyl group formed by Z together with carbon atoms may be monocyclic or polycyclic. Specific examples thereof include a group having 5 or more carbon atoms and having a monocyclo, bicyclo, tricyclo, or tetracyclo structure. These cycloalkyl groups preferably have 6 to 30 carbon atoms, and more preferably 7 to 25 carbon atoms. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples thereof include an adamantyl group, a norbornyl group, a cyclohexyl group, a cyclopentyl group, a tetracyclododecanyl group, and a tricyclodecanyl group.

Examples of a substituent which may further be included in these alkyl groups and cycloalkyl groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). Examples of the substituent which may further be included in the alkyl group, the alkoxy group, the alkoxycarbonyl group, or the like include a hydroxyl group, a halogen atom, and an alkoxy group.

The structures represented by General Formulae (pI) to (pV) in the resin can be used in the protection of the alkali-soluble group. Examples of the alkali-soluble group include various groups that have been known in the technical field.

Specific examples of the acid-decomposable group include a structure in which a hydrogen atom in a carboxylic acid group, a sulfonic acid group, a phenol group, or a thiol group is substituted with a structure represented by any one of General Formulae (pI) to (pV), with a structure in which a hydrogen atom in a carboxylic acid group or a sulfonic acid group is substituted with a structure represented by any one of General Formulae (pI) to (pV) being preferable.

As the repeating unit having an alkali-soluble group protected by the structure represented by any one of General Formulae (pI) to (pV), a repeating unit represented by the following General Formula (pA) is preferable.

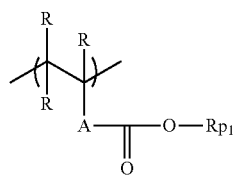

(pA)

Here, R represents a hydrogen atom, a halogen atom, or a substituted or unsubstituted, linear or branched alkyl group having 1 to 4 carbon atoms, and a plurality of R's may be the same as or different from each other.

A is preferably a single group or a combination of two or more groups, selected from the group consisting of a single bond, an alkylene group, an ether group, a thioether group, a carbonyl group, an ester group, an amido group, a sulfonamido group, a urethane group, or a urea group, with a single bond being preferable.

$Rp_1$ is a group of any one of Formulae (pI) to (pV).

The repeating unit represented by General Formula (pA) is particularly preferably a repeating unit derived from 2-alkyl-2-adamantyl (meth)acrylate or dialkyl(1-adamantyl) methyl (meth)acrylate.

Specific examples of the repeating unit represented by General Formula (pA) are shown below, but the present invention is not limited thereto.

(in the following formulae, Rx represents H, CH3, or CH2OH; and Rxa and Rxb each represent an alkyl group having from 1 to 4 carbon atoms)

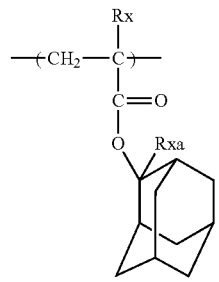

1

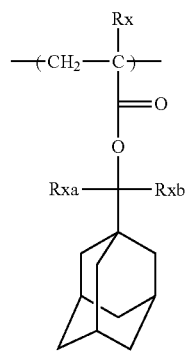

2

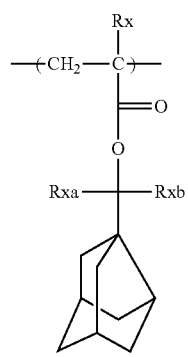

3

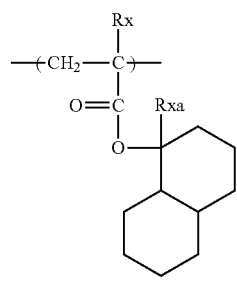

4

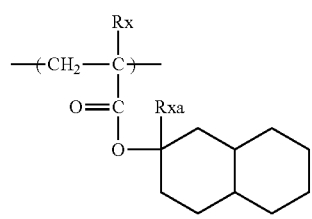

5

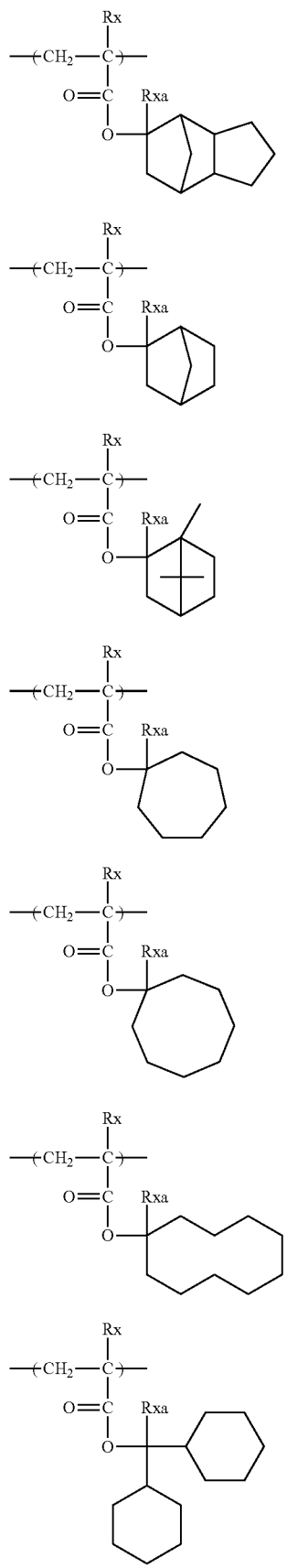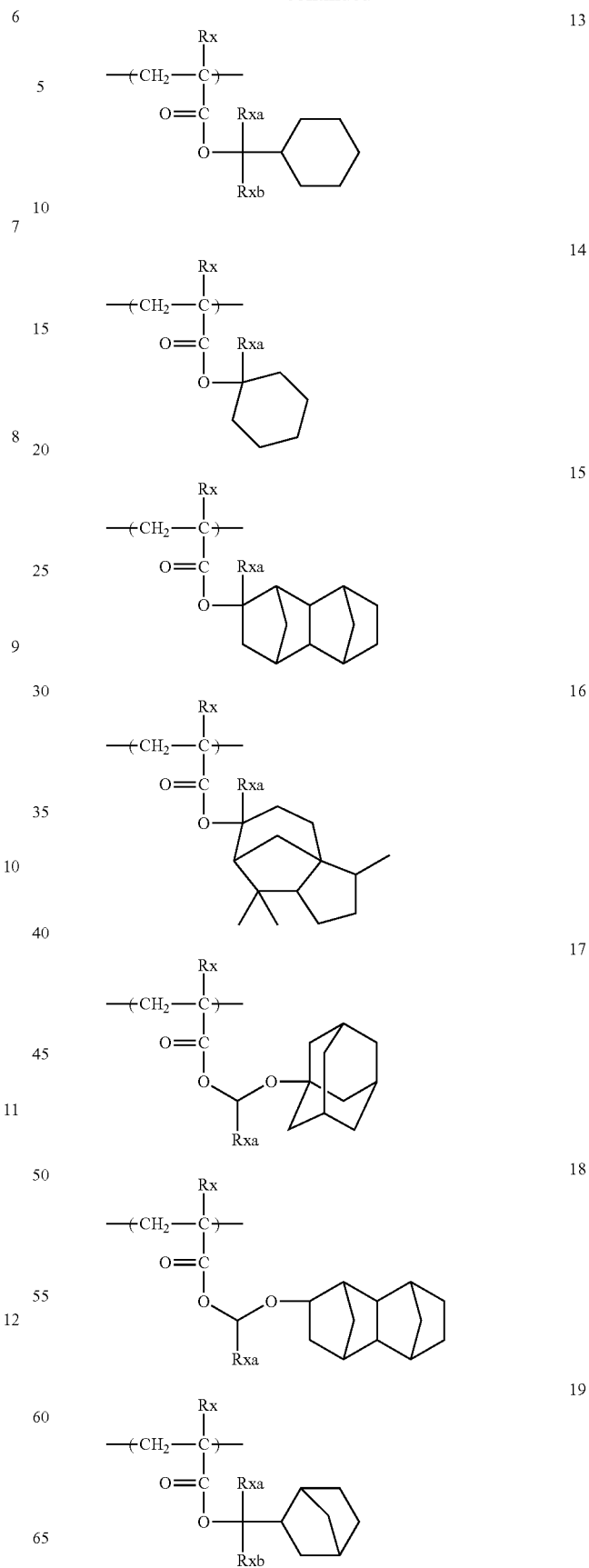

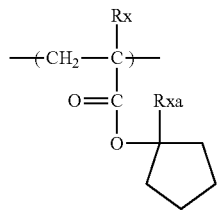
20

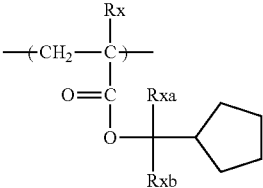
26

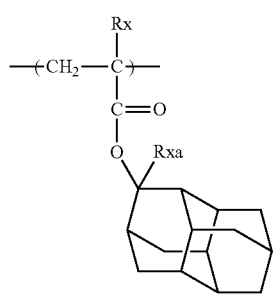
21

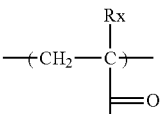
27

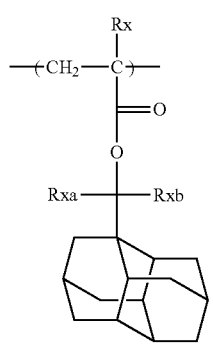
22

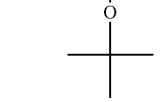
28

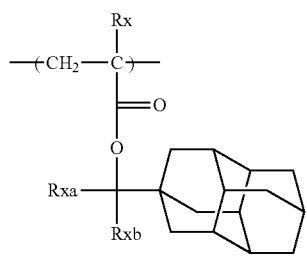
23

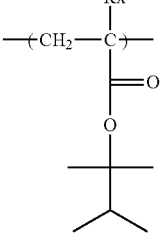

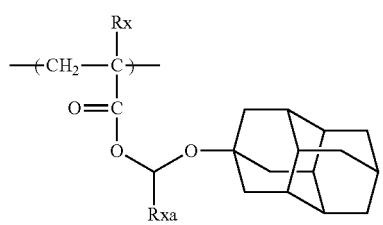
24

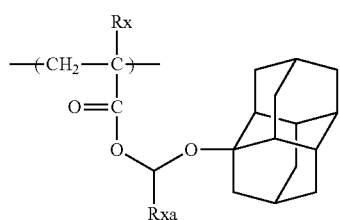
25

In General Formula (II-AB), examples of the halogen atoms in $R_{11}'$ and $R_{12}'$ include a chlorine atom, a bromine atom, a fluorine atom, and an iodine atom.

Examples of the alkyl group in each of $R_{11}'$ and $R_{12}'$ include a linear or branched alkyl group having 1 to 10 carbon atoms.

The atomic group for forming the alicyclic structure of Z' is an atomic group that forms a repeating unit of an alicyclic hydrocarbon, which may have a substituent, in the resin. Above all, an atomic group for forming a crosslinked alicyclic structure that forms a crosslinked alicyclic hydrocarbon repeating unit is preferable.

Examples of the skeleton of the alicyclic hydrocarbon thus formed include the same ones as the alicyclic hydrocarbon groups represented by each of $R_{12}$ to $R_{25}$ in General Formulae (pI) to (pV).

The skeleton of the alicyclic hydrocarbon may have a substituent. Examples of the substituent include $R_{13}'$ to $R_{16}'$ in General Formula (II-AB) or (II-AB2).

In the resin (A), the group that decomposes by the action of an acid is included in at least one repeating unit of a repeating unit having a partial structure represented by any one of General Formulae (pI) to (pV), a repeating unit represented by General Formula (II-AB), or a repeating unit of a copolymerizable component which will be described later. It is preferable that the group that decomposes by the action of an acid is included in a repeating unit having a partial structure represented by any one of General Formulae (pI) to (pV).

Each of various substituents of $R_{13}'$ to $R_{16}'$ in General Formula (II-AB1) or (II-AB2) may be a substituent of the atomic group for forming an alicyclic structure or the atomic group Z for forming a crosslinked alicyclic structure in General Formula (II-AB).

Examples of the repeating unit represented by General Formula (II-AB1) or (II-AB2) include the following specific examples, but the present invention is not limited to these specific examples.

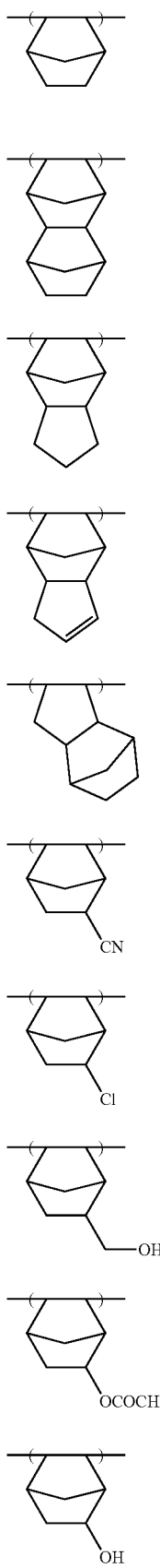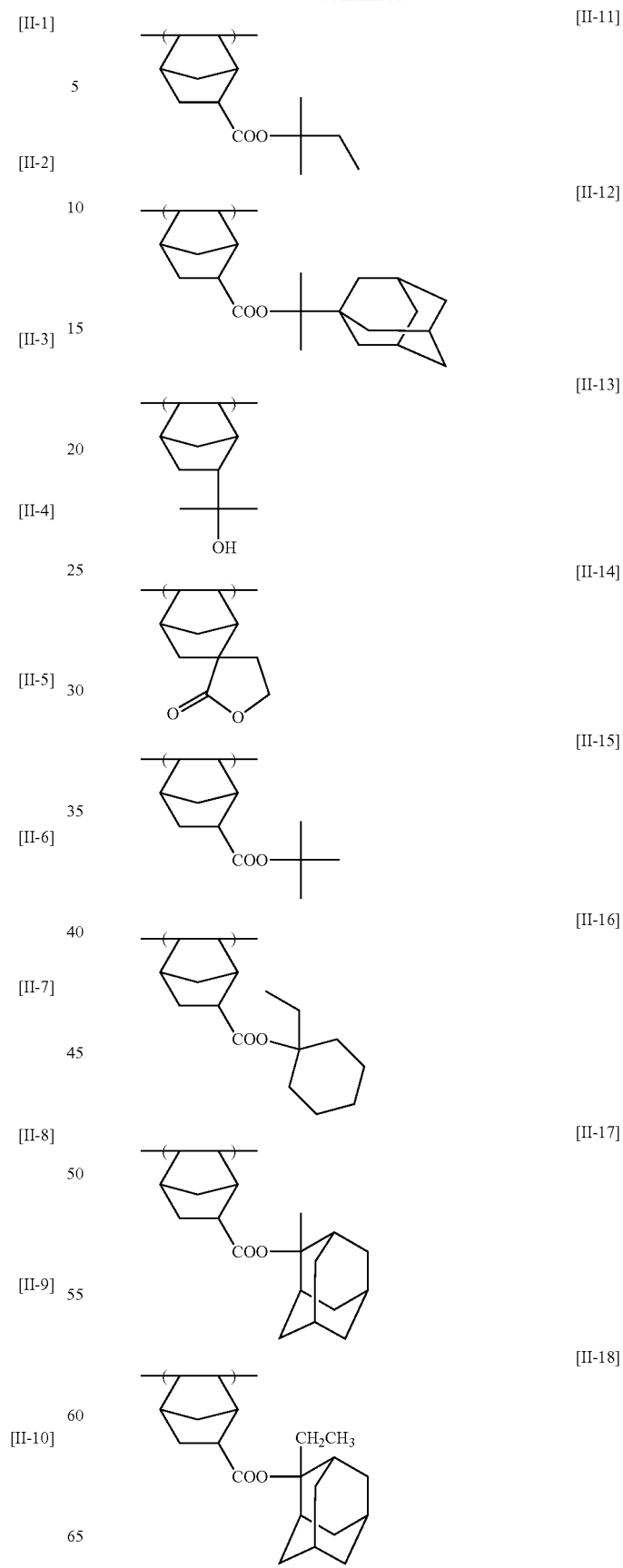

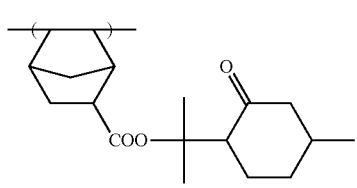 [II-19]
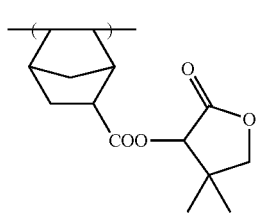 [II-20]
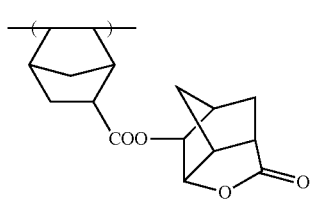 [II-21]
 [II-22]
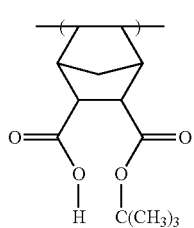 [II-23]
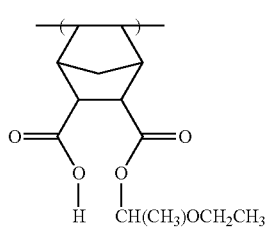 [II-24]
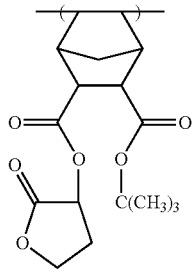 [II-25]
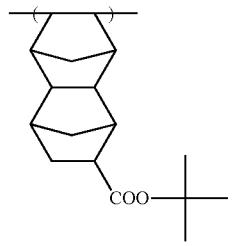 [II-26]
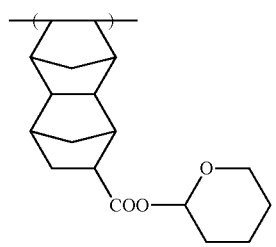 [II-27]
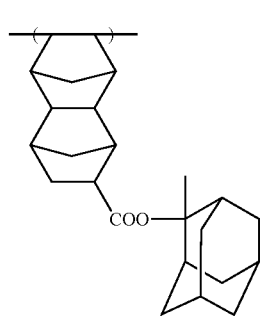 [II-28]
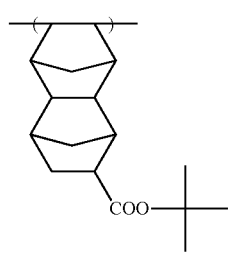 [II-29]
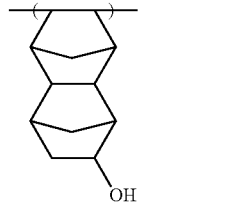 [II-30]
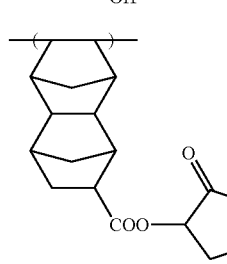 [II-31]

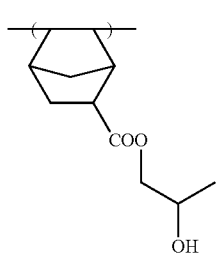

[II-32]

It is preferable that the resin (A) contains, for example, a repeating unit represented by General Formula (3).

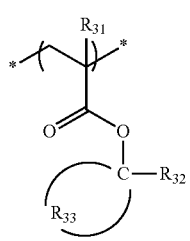

(3)

In General Formula (3), $R_{31}$ represents a hydrogen atom or an alkyl group.

$R_{32}$ represents an alkyl group or a cycloalkyl group, and specific examples thereof include a methyl group, an ethyl group, an n-propyl group, an isopropyl group, an n-butyl group, an isobutyl group, a sec-butyl group, a tert-butyl group, and a cyclohexyl group.

$R_{33}$ represents an atomic group required for forming a monocyclic alicyclic hydrocarbon structure together with carbon atoms to which $R_{32}$ is bonded. In the alicyclic hydrocarbon structure, a part of carbon atoms constituting a group may be substituted with a hetero atom, or a group having a hetero atom.

The alkyl group of $R_{31}$ may have a substituent and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, an n-propyl group, an isopropyl group, a tert-butyl group, or a cyclohexyl group, and more preferably a methyl group, an ethyl group, an isopropyl group, or a tert-butyl group.

The monocyclic alicyclic hydrocarbon structure formed by $R_{33}$ together with carbon atoms is preferably a 3- to 8-membered ring, and more preferably a 5- or 6-membered ring.

In the monocyclic alicyclic hydrocarbon structure formed by $R_{33}$ together with carbon atoms, examples of the hetero atom which can constitute a ring include an oxygen atom and a sulfur atom, and examples of the group having a hetero atom include a carbonyl group. However, it is preferable that the group having a hetero atom is not an ester group (ester bond).

The monocyclic alicyclic hydrocarbon structure formed by $R_{33}$ together with carbon atoms is preferably formed with only carbon atoms and hydrogen atoms.

The repeating unit represented by General Formula (3) is preferably a repeating unit represented by the following General Formula (3').

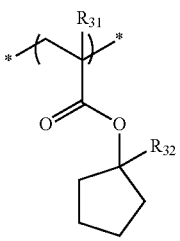

(3')

In General Formula (3'), $R_{31}$ and $R_{32}$ have the same definitions as those in General Formula (3), respectively.

Specific examples of the repeating unit having the structure represented by General Formula (3) are shown below, but are not limited thereto.

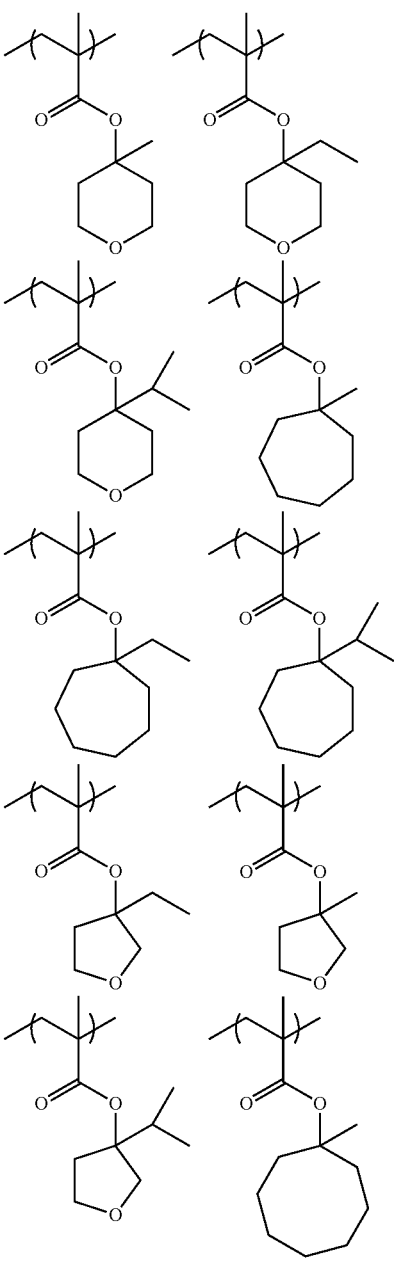

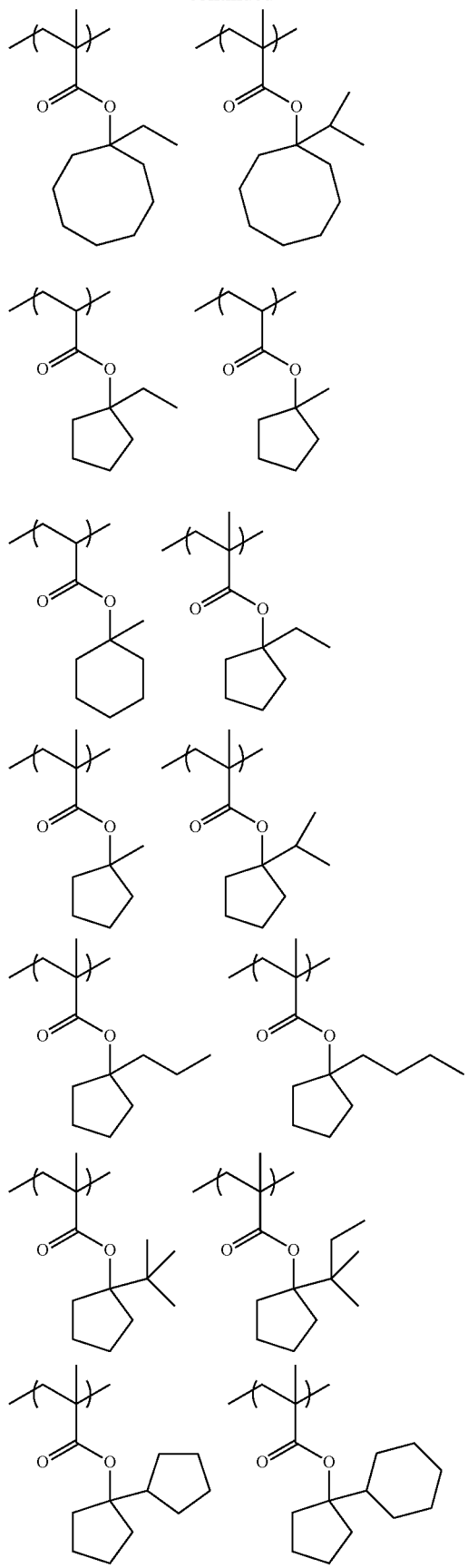
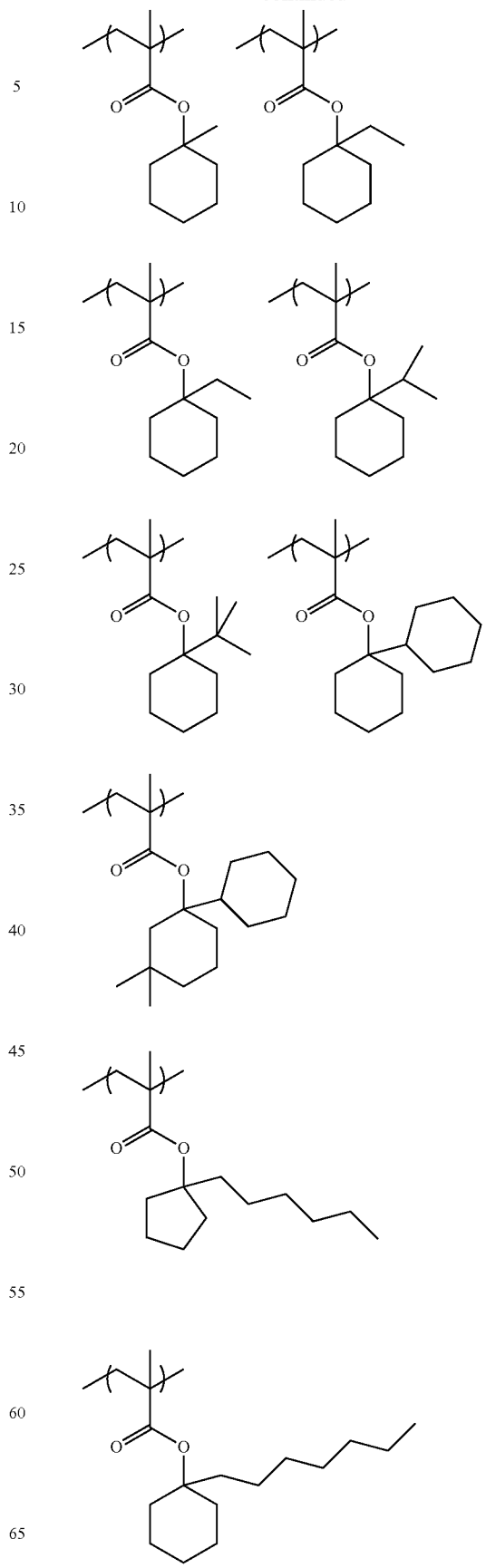

-continued

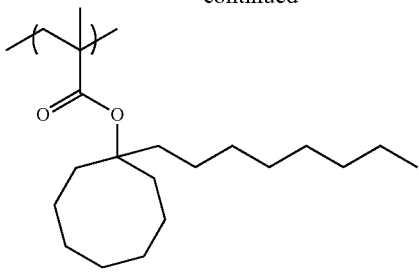

The content of the repeating unit having a structure represented by General Formula (3) is preferably 20% to 80% by mole, more preferably 25% to 75% by mole, and still more preferably 30% to 70% by mole, with respect to all the repeating units of the resin (A).

The resin (A) is more preferably, for example, a resin which has at least one of the repeating unit represented by General Formula (I) or the repeating unit represented by General Formula (II).

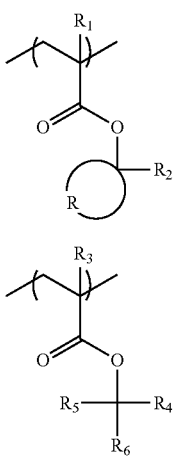

In Formulae (I) and (II), $R_1$ and $R_3$ each independently represent a hydrogen atom, a methyl group which may have a substituent, or a group represented by —$CH_2$—$R_{11}$. $R_{11}$ represents a monovalent organic group.

$R_2$, $R_4$, $R_5$, and $R_6$ each independently represent an alkyl group or a cycloalkyl group.

R represents an atomic group required for forming an alicyclic structure together with a carbon atom to which $R_2$ is bonded.

$R_1$ and $R_3$ each preferably represent a hydrogen atom, a methyl group, a trifluoromethyl group, or a hydroxymethyl group. Specific and preferred examples of the monovalent organic group in $R_{11}$ include a halogen atom (a fluorine atom or the like), a hydroxyl group, an alkyl group having 5 or less carbon atoms, and an acyl group having 5 or less carbon atoms, and the monovalent organic group is preferably an alkyl group having 3 or less carbon atoms, and more preferably a methyl group.

The alkyl group in $R_2$ may be linear or branched, and may have a substituent.

The cycloalkyl group in $R_2$ monocyclic or polycyclic, and may have a substituent.

$R_2$ is preferably an alkyl group, more preferably an alkyl group having 1 to 10 carbon atoms, and still more preferably an alkyl group having 1 to 5 carbon atoms, and examples thereof include a methyl group, an ethyl group, an n-propyl group, an i-propyl group, and a t-butyl group. As the alkyl group in $R_2$, a methyl group, an ethyl group, an i-propyl group, and a t-butyl group are preferable.

R represents an atomic group required to form an alicyclic structure together with a carbon atom. The alicyclic structure formed by R together with the carbon atom is preferably a monocyclic alicyclic structure. R preferably has 3 to 7 carbon atoms, and more preferably 5 or 6 carbon atoms.

$R_3$ is preferably a hydrogen atom or a methyl group, and more preferably a methyl group.

The alkyl group in $R_4$, $R_5$, or $R_6$ may be linear or branched, and may have a substituent. Examples of the alkyl group include alkyl groups having 1 to 4 carbon atoms, such as a methyl group, an ethyl group, an n-propyl group, an isopropyl group, an n-butyl group, an isobutyl group, and a t-butyl group.

The cycloalkyl group in $R_4$, $R_5$, or $R_6$ may be monocyclic or polycyclic, and may have a substituent. Preferred examples of the cycloalkyl group include monocyclic cycloalkyl groups such as a cyclopentyl group and a cyclohexyl group, and polycyclic cycloalkyl group such as a norbornyl group, a tetracyclodecanyl group, a tetracyclododecanyl group, and an adamantyl group.

Examples of the substituent which may be included in each of the groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and the substituent preferably has 8 or less carbon atoms.

In General Formula (II), $R_4$, $R_5$, and $R_6$ are preferably an alkyl group, and the sum of the numbers of carbon atoms of $R_4$, $R_5$, and $R_6$ is preferably 5 or more, preferably 6 or more, and still more preferably 7 or more.

The resin (A) is more preferably a resin which includes the repeating unit represented by General Formula (I) and the repeating unit represented by General Formula (II).

Moreover, in another aspect, a resin which includes at least two kinds of the repeating units represented by General Formula (I) is more preferable. In the case where the resin contains at least two kinds of the repeating unit represented by General Formula (I), it is preferable that the resin contains both of a repeating unit in which an alicyclic structure formed by R together with a carbon atom is a monocyclic alicyclic structure and a repeating unit in which an alicyclic structure formed by R together with a carbon atom is a polycyclic alicyclic structure. The monocyclic alicyclic structure preferably has 5 to 8 carbon atoms, more preferably 5 or 6 carbon atoms, and particularly preferably 5 carbon atoms. As the polycyclic alicyclic structure, a norbornyl group, a tetracyclodecanyl group, a tetracyclododecanyl group, and an adamantyl group are preferable.

The repeating unit having an acid-decomposable group which the resin (A) contains may be used alone or in combination of two or more kinds thereof.

It is preferable that the resin (A) contains a repeating unit having a lactone structure or a sultone (cyclic sulfonic acid ester) structure.

As the lactone group or the sultone group, any group may be used as long as it has a lactone structure or a sultone structure, but the structure is preferably a 5- to 7-membered ring lactone structure or sultone structure, and more preferably a 5- to 7-membered ring lactone structure or sultone structure to which another ring structure is fused in the form of forming a bicyclo structure or a spiro structure. The resin (A) still more preferably has a repeating unit having a lactone structure or a sultone structure represented by any one of the following General Formulae (LC1-1) to (LC1-17), (SL1-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure, LWR and development defects are relieved.

LC1-1
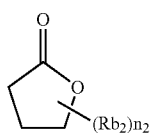

LC1-2
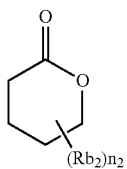

LC1-3
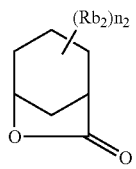

LC1-4
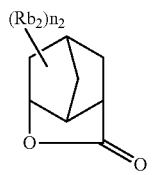

LC1-5
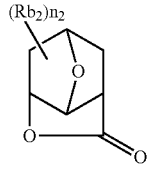

LC1-6
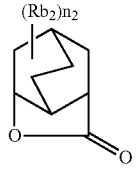

LC1-7
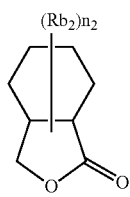

LC1-8
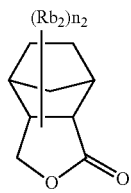

LC1-9
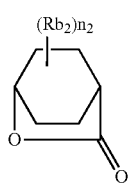

LC1-10
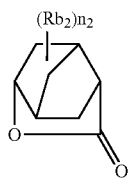

LC1-11
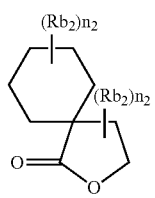

LC1-12
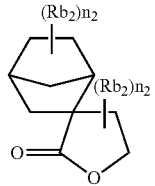

LC1-13
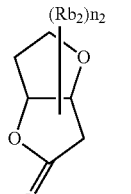

LC1-14
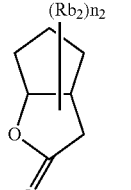

LC1-15
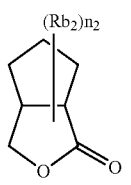

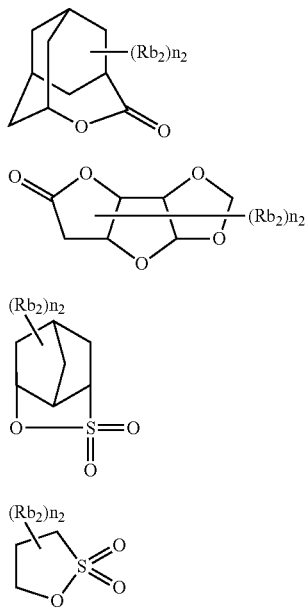

LC1-16

LC1-17

SL1-1

SL1-2

The lactone structure moiety or the sultone structure moiety may or may not have a substituent (Rb$_2$). Preferred examples of the substituent (Rb$_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. n$_2$ represents an integer of 0 to 4. When n$_2$ is 2 or more, the substituents (Rb$_2$) which are present in plural numbers may be the same as or different from each other, and further, the substituents (Rb$_2$) which are present in plural numbers may be bonded to each other to form a ring.

It is preferable that the resin (A) contains a repeating unit having a lactone structure or a sultone structure, represented by the following General Formula (III).

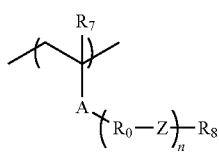

(III)

In Formula (III),

A represents an ester bond (a group represented by —COO—) or an amide bond (a group represented by —CONH—).

In the case where R$_0$'s are present in plural numbers, they each independently represent an alkylene group, a cycloalkylene group, or a combination thereof.

In the case where Z's are present in plural numbers, they each independently represent a single bond, an ether bond, an ester bond, an amide bond, a urethane bond (a group represented by

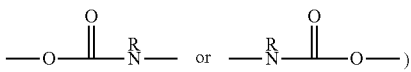

or a urea bond
(a group represented by

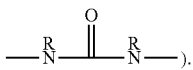

).

Here, R's each independently represent a hydrogen atom, an alkyl group, a cycloalkyl group, or an aryl group.

R$_8$ represents a monovalent organic group having a lactone structure or a sultone structure.

n is the repetition number of the structure represented by —R$_0$—Z—, and represents an integer of 0 to 2.

R$_7$ represents a hydrogen atom, a halogen atom, or an alkyl group.

The alkylene group and the cycloalkylene group of R$_0$ may have a substituent.

Z is preferably an ether bond or an ester bond, and particularly preferably an ester bond.

The alkyl group of R$_7$ is preferably an alkyl group having 1 to 4 carbon atoms, more preferably a methyl group or an ethyl group, and particularly preferably a methyl group. The alkylene group and the cycloalkylene group of R$_0$, and the alkyl group in R$_7$ may be each substituted, and examples of the substituent include a halogen atom such as a fluorine atom, a chlorine atom, and a bromine atom, a mercapto group, a hydroxy group, an alkoxy group such as a methoxy group, an ethoxy group, an isopropoxy group, a t-butoxy group, and a benzyloxy group, and an acetoxy group such as an acetyloxy group and a propionyloxy group. R$_7$ is preferably a hydrogen atom, a methyl group, a trifluoromethyl group, or a hydroxymethyl group.

The preferred chained alkylene group in R$_0$ is a chained alkylene group, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effects of the present invention, a chained alkylene group is more preferable, and a methylene group is particularly preferable.

The monovalent organic group having a lactone structure or sultone structure represented by R$_8$ is not limited as long as it has the lactone structure or sultone structure, specific examples thereof include the above-mentioned lactone structures or sultone structures represented by General Formula (LC1-1) to (LC1-17), (SL1-1), and (SL1-2), and among these, the structure represented by (LC1-4) is particularly preferable. Further, n2 in (LC1-1) to (LC1-17), (SL1-1), and (SL1-2) is more preferably 2 or less.

Furthermore, R$_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 0 or 1.

As the repeating unit having a lactone structure or a sultone structure, a repeating unit represented by the following General Formula (III-1) or (III-1') is more preferable.

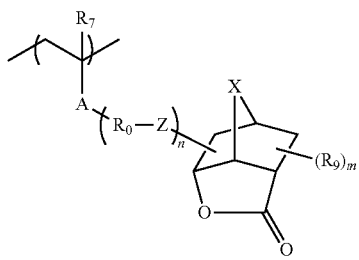

(III-1)

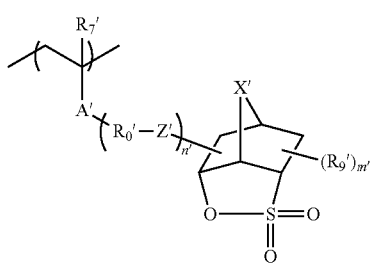

(III-1')

In General Formulae (III-1) and (III-1'), $R_7$, A, $R_0$, Z, and n have the same definitions as in General Formula (III).

$R_7'$, A', $R_0'$, Z', and n' have the same definitions $R_7$, A, $R_0$, Z, and n, respectively, in General Formula (III).

In the case where $R_9$ are in plural numbers, they each independently represent an alkyl group, a cycloalkyl group, an alkoxycarbonyl group, a cyano group, a hydroxyl group, or an alkoxy group, and in the case where they are in plural numbers, two $R_9$'s may be bonded to each other to form a ring.

In the case where $R_9'$'s are in plural numbers, they each independently represent an alkyl group, a cycloalkyl group, an alkoxycarbonyl group, a cyano group, a hydroxyl group, or an alkoxy group, and in the case where they are in plural numbers, two $R_9$'s may be bonded to each other to form a ring.

X and X' each independently represent an alkylene group, an oxygen atom, or a sulfur atom.

m and m' are each the number of substituents, and each independently represent an integer of 0 to 5. m and m' are each independently preferably 0 or 1.

As the alkyl group of $R_9$ and $R_9'$, an alkyl group having 1 to 4 carbon atoms is preferable, a methyl group and an ethyl group are more preferable, and a methyl group is most preferable. Examples of the cycloalkyl group include a cyclopropyl group, a cyclobutyl group, a cyclopentyl group, and a cyclohexyl group. Examples of the alkoxycarbonyl group include a methoxycarbonyl group, an ethoxycarbonyl group, an n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include a hydroxy group, an alkoxy group such as a methoxy group and an ethoxy group, a cyano group, and a halogen atom such as a fluorine atom. $R_9$ and $R_9'$ are each more preferably a methyl group, a cyano group, or an alkoxycarbonyl group, and still more preferably a cyano group.

Examples of the alkylene group of X and X' include a methylene group and an ethylene group. X and X' are preferably an oxygen atom or a methylene group, and more preferably a methylene group.

In the case where m and m' are 1 or more, at least one of $R_9$ or $R_9'$ are preferably substituted at the α- or β-position of the carbonyl group of the lactone, and particularly preferably at the α-position.

Specific examples of the group having a lactone structure or the repeating unit having a sultone structure, represented by General Formula (III-1) or (III-1') include the structures described in paragraphs [0150] to [0151] of JP2013-178370A.

In the case where the repeating units are present in plural kinds, the content of the repeating units represented by General Formula (III) is preferably 15% to 60% by mole, more preferably 20% to 60% by mole, and still more preferably 30% to 50% by mole, with respect to all the repeating units in the resin (A).

The resin (A) may further contain the aforementioned repeating unit having a lactone structure or a sultone structure, in addition to the unit represented by General Formula (III).

The repeating unit having a lactone group or a sultone group usually has an optical isomer, and any optical isomer may be used. Further, one kind of optical isomer may be used alone or a plurality of optical isomers may be mixed and used. In the case of mainly using one kind of optical isomer, the optical purity (ee) thereof is preferably 90% or more, and more preferably 95% or more.

The content of the repeating units having a lactone structure or a sultone structure, other than the repeating units represented by General Formula (III), is preferably 15% to 60% by mole, more preferably 20% to 50% by mole, and still more preferably 30% to 50% by mole, with respect to all the repeating units in the resin in the case where the repeating units are contained in plural kinds.

In order to enhance the effects of the present invention, it is also possible to use two or more kinds of the repeating units having a lactone structure or a sultone structure selected from General Formula (III) in combination. In the case of using them in combination, it is preferable to use two or more selected from the lactone or sultone repeating units of General Formula (III) in which n is 0 in combination.

The resin (A) may further have a repeating unit containing an organic group having a polar group, in particular, a repeating unit having an alicyclic hydrocarbon structure substituted with a polar group. Thus, the substrate adhesiveness and the developer affinity are improved. As the alicyclic hydrocarbon structure of the alicyclic hydrocarbon structure substituted with a polar group, an adamantyl group, a diamantyl group, or a norbornane group are preferable. As the polar group, a hydroxyl group or a cyano group is preferable.

Preferred examples of the alicyclic hydrocarbon structure substituted with a polar group include partial structures represented by the following General Formulae (VIIa) to (VIId).

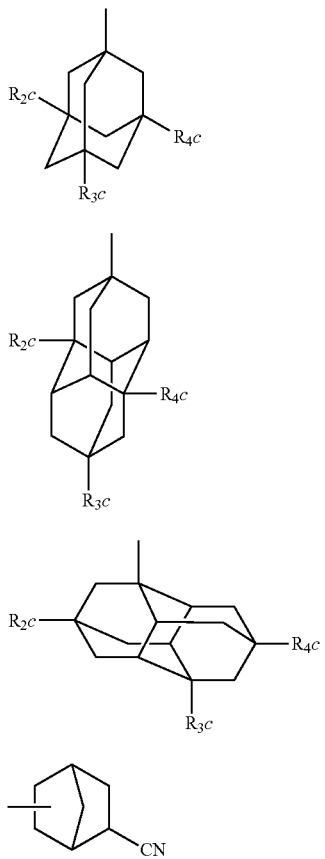

(VIIa)

(VIIb)

(VIIc)

(VIId)

In General Formulae (VIIa) to (VIIc), $R_2c$ to $R_4c$ each independently represent a hydrogen atom, a hydroxyl group, or a cyano group, provided that at least one of $R_2c$, . . . , or $R_4c$ represents a hydroxyl group or a cyano group. It is preferable that one or two of $R_2c$ to $R_4c$ are hydroxyl group(s) and the remainders are hydrogen atoms.

In General Formula (VIIa), it is more preferable that two of $R_2c$ to $R_4c$ are hydroxyl groups and the remainders are hydrogen atoms.

Examples of the repeating unit having a group represented by any one of General Formulae (VIIa) to (VIId) include those in which at least one of $R_{13}'$, . . . , or $R_{16}'$ in General Formula (II-AB1) or (II-AB2) has a group represented by any one of General Formulae (VIIa) to (VIId) (for example, a group —$COOR_5$ in which $R_5$ is a group represented by any one of General Formulae (VIIa) to (VIId)), and repeating units represented by the following General Formulae (AIIa) to (AIId).

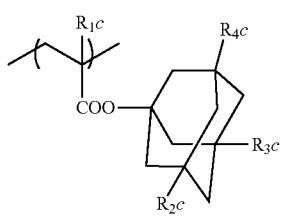

(AIIa)

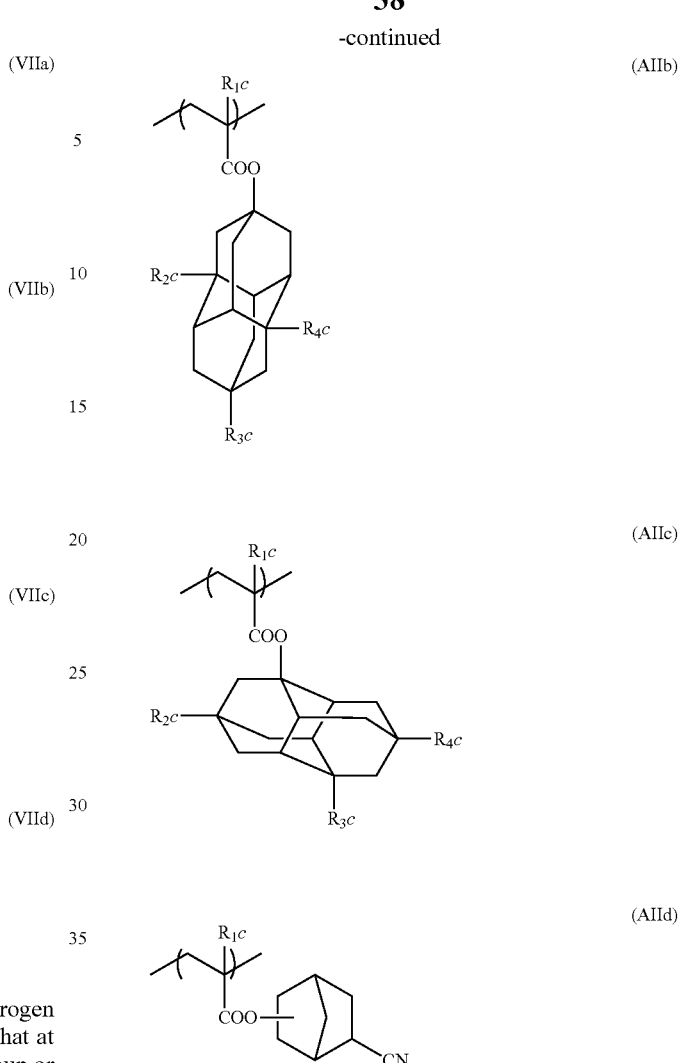

In General Formulae (AIIa) to (AIId), $R_1c$ represents a hydrogen atom, a methyl group, a trifluoromethyl group, or a hydroxymethyl group.

$R_2c$ to $R_4c$ have the same definitions as $R_2c$ to $R_4c$ in General Formulae (VIIa) to (VIIc).

Specific examples of the repeating unit having a structure represented by any one of General Formulae (AIIa) to (AIId) will be shown below, but the present invention is not limited thereto.

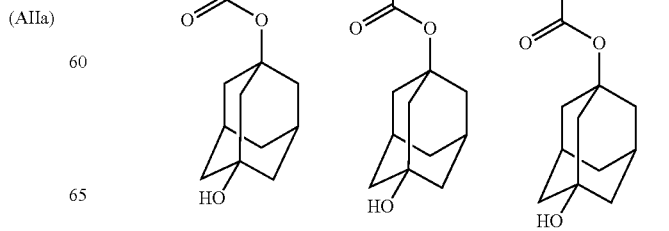

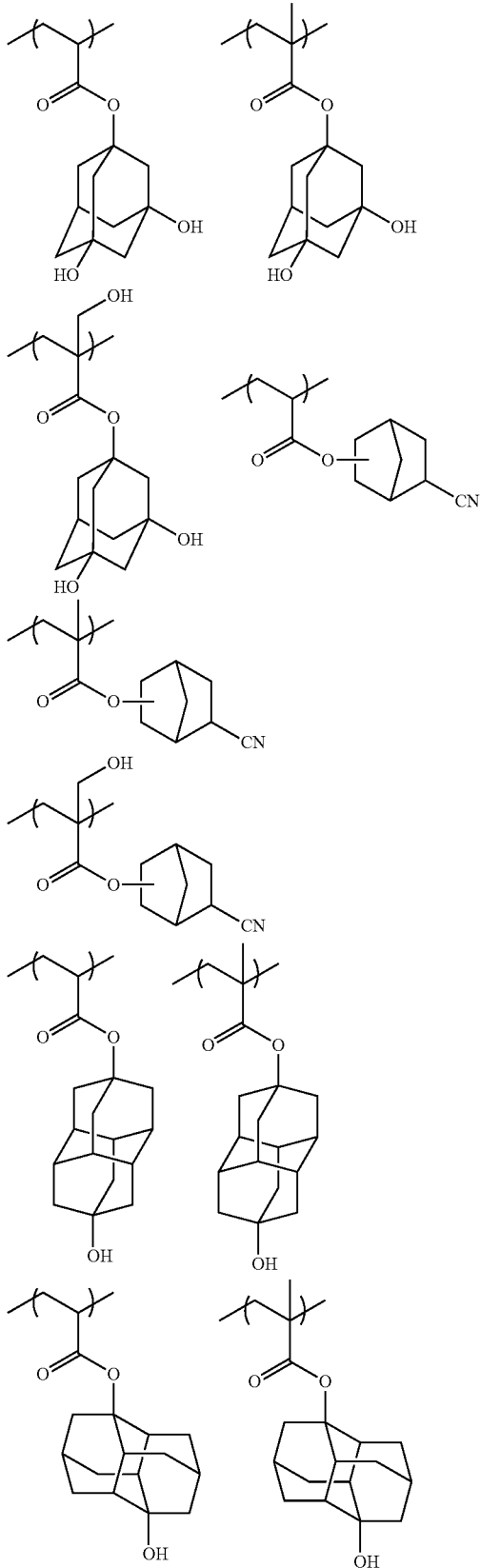

The resin (A) may have a repeating unit represented by the following General Formula (VIII).

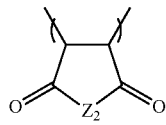
(VIII)

In General Formula (VIII),
$Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group, or a camphor residue. The alkyl group of each of $R_{41}$ and $R_{42}$ may further be substituted with a halogen atom (preferably a fluorine atom) or the like.

Examples of the repeating unit represented by General Formula (VIII) include the following specific examples, but the present invention is not limited thereto.

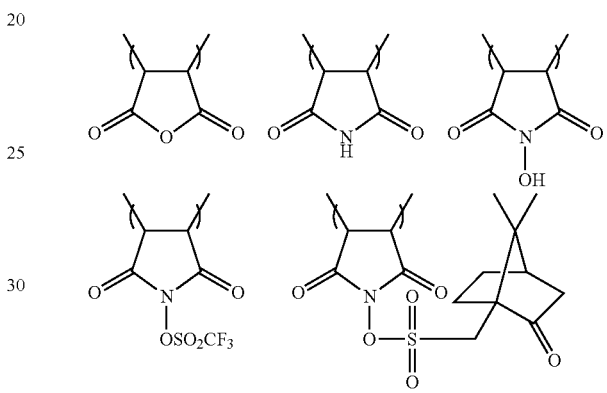

The resin (A) preferably has a repeating unit having an alkali-soluble group, and more preferably has a repeating unit having a carboxyl group. By incorporation of such a repeating unit, the resolution increases in the applications in a contact hole. Preferred examples of the repeating unit having a carboxyl group include any one of a repeating unit in which a carboxyl group is directly attached to the main chain of a resin such as a repeating unit of acrylic acid or methacrylic acid, a repeating unit in which a carboxyl group is attached to the main chain of a resin via a linking group and a repeating unit carrying, at the terminal of a polymer chain, an alkali-soluble group having been introduced in the course of polymerization by using a polymerization initiator or a chain transfer agent having the alkali-soluble group. The linking group may have a monocyclic or polycyclic hydrocarbon structure. A repeating unit including acrylic acid or methacrylic acid is particularly preferable.

The resin (A) may also have a repeating unit having 1 to 3 groups represented by General Formula (F1). Thus, the line edge roughness performance is further improved.

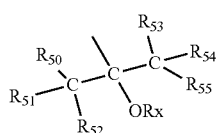
(F1)

In General Formula (F1),
$R_{50}$ to $R_{55}$ each independently represent a hydrogen atom, a fluorine atom or an alkyl group, provided that at least one of $R_{50}$, ..., or $R_{55}$ represents a fluorine atom or an alkyl group in which at least one hydrogen atom is substituted with a fluorine atom.

Rx represents a hydrogen atom or an organic group (preferably an acid-decomposable protecting group, an alkyl group, a cycloalkyl group, an acyl group, or an alkoxycarbonyl group).

The alkyl group of each of $R_{50}$ to $R_{55}$ may be substituted with a halogen atom such as a fluorine atom, a cyano group, or the like. Preferred examples thereof include an alkyl group having 1 to 3 carbon atoms, such as a methyl group and a trifluoromethyl group.

It is preferable that all of $R_{50}$ to $R_{55}$ are fluorine atoms.

Preferred examples of the organic group represented by Rx include an acid-decomposable protecting group, an alkyl group which may have a substituent, a cycloalkyl group, an acyl group, an alkylcarbonyl group, an alkoxycarbonyl group, an alkoxycarbonylmethyl group, an alkoxymethyl group, and a 1-alkoxyethyl group.

The repeating unit having a group represented by General Formula (F1) is preferably a repeating unit represented by the following General Formula (F2).

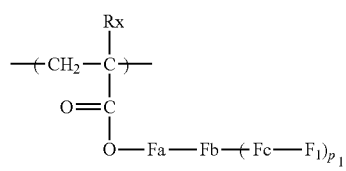

(F2)

In General Formula (F2),

Rx represents a hydrogen atom, a halogen atom or an alkyl group having 1 to 4 carbon atoms. Preferred examples of a substituent which may be contained in the alkyl group of Rx include a hydroxyl group and a halogen atom.

Fa represents a single bond, or a linear or branched alkylene group, and is preferably a single bond.

Fb represents a monocyclic or polycyclic hydrocarbon group.

Fc represents a single bond, or a linear or branched alkylene group (and is preferably a single bond or a methylene group).

$F_1$ represents a group represented by General Formula (F1).

$p_1$ represents 1 to 3.

As the cyclic hydrocarbon group in Fb, a cyclopentylene group, a cyclohexylene group, or a norbornylene group is preferable.

Specific examples of the repeating unit having a group represented by General Formula (F1) are shown below, but the present invention is not limited thereto.

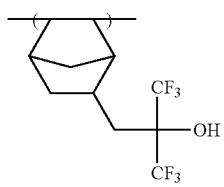

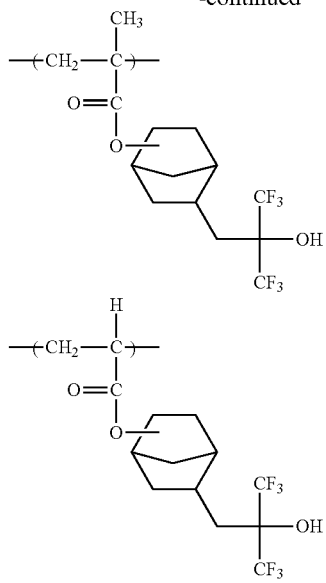

The resin (A) may also have a repeating unit further having an alicyclic hydrocarbon structure and not exhibiting acid-decomposability. Thus, it is possible to reduce elution of the low molecular components from the resist film to the immersion liquid upon liquid immersion exposure. Examples of such a repeating unit include 1-adamantyl (meth)acrylate, tricyclodecanyl (meth)acrylate, and cyclohexyl (meth)acrylate.

The resin (A) may contain, in addition to the above-described repeating units, repeating units derived from various monomers for the purpose of controlling various characteristics. Examples of such a monomer include a compound having one addition-polymerizable unsaturated bond selected from acrylic acid esters, methacrylic acid esters, acrylamides, methacrylamides, allyl compounds, vinyl ethers, and vinyl esters.

In addition, addition-polymerizable unsaturated compounds which are copolymerizable with monomers corresponding to various repeating units above may be copolymerized.

In the resin (A), the molar ratio of each of the repeating units is appropriately set.

In the resin (A), the content of the repeating units having acid-decomposable groups is preferably 10% to 60% by mole, more preferably 20% to 50% by mole, and still more preferably 25% to 40% by mole, with respect to all the repeating units.

In the resin (A), the content of the repeating units having partial structures represented by General Formulae (pI) to (pV) is preferably 20% to 70% by mole, more preferably 20% to 50% by mole, and still more preferably 25% to 40% by mole, with respect to all the repeating units.

In the resin (A), the content of the repeating units represented by General Formula (II-AB) is preferably 10% to 60% by mole, more preferably 15% to 55% by mole, and still more preferably 20% to 50% by mole, with respect to all the repeating units.

In the resin (A), the content of the repeating units having lactone rings is preferably 10% to 70% by mole, more preferably 20% to 60% by mole, and still more preferably 25% to 40% by mole, with respect to all the repeating units.

In the resin (A), the content of the repeating units having organic groups containing polar groups is preferably 1% to 40% by mole, more preferably 5% to 30% by mole, and still more preferably 5% to 20% by mole, with respect to all the repeating units.

Furthermore, the content of the repeating units derived from the monomers in the resin (A) can be appropriately set, but generally, it is preferably 99% by mole or less, more preferably 90% by mole or less, and still more preferably 80% by mole or less, with respect to sum of the total moles of the repeating units having partial structures represented by General Formulae (pI) to (pV) and the repeating units represented by General Formula (II-AB).

In a case where the resist composition of the present invention is to be used for ArF exposure, from the viewpoint of the transparency to the ArF light, it is preferable that the resin (A) is free of an aromatic group.

As the resin (A), resins in which all of the repeating units are constituted with (meth)acrylate-based repeating units are preferable. In this case, any one of a resin in which all of the repeating units are methacrylate-based repeating units, a resin in which all of the repeating units are acrylate-based repeating units, and a resin in which all of the repeating units are mixtures of methacrylate-based repeating units/acrylate-based repeating units can be used, and the proportion of the acrylate-based repeating units is preferably 50% by mole or less with respect to all the repeating units.

The resin (A) is preferably a copolymer at least having three kinds of repeating units, that is, a (meth)acrylate-based repeating unit having a lactone ring, a (meth)acrylate-based repeating unit having an organic group substituted with at least one of a hydroxyl group or a cyano group, and a (meth)acrylate-based repeating unit having an acid-decomposable group.

The resin (A) is preferably a ternary copolymerization polymer including 20% to 50% by mole of repeating units having partial structures represented by General Formulae (pI) to (pV), 20% to 50% by mole of repeating units having lactone structures, and 5% to 30% by mole of repeating units having alicyclic hydrocarbon structures substituted with polar groups, or a quaternary copolymerization polymer including the above repeating units and 0% to 20% by mole of other repeating units.

Preferred examples of the resin (A) include the resins described in paragraphs [0152] to [0158] of JP2008-309878A, but the present invention is not limited thereto.

The resin (A) can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether, ketones such as methyl ethyl ketone and methyl isobutyl ketone; ester solvents such as ethyl acetate; amide solvents such as dimethyl formamide and dimethyl acetamide; and solvents which dissolve the resist composition of the present invention, such as propylene glycol monomethyl ether acetate, propylene glycol monomethyl ether, and cyclohexanone, which will be described later. It is more preferable to carry out polymerization using the same solvent as the solvent used in the resist composition of the present invention. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For the purification, an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a re-precipitation method of dropwise adding a resin solution into a poor solvent to solidify the resin in the poor solvent, thereby removing the residual monomers and the like; and a purification method in a solid state, such as cleaning of a resin slurry with a poor solvent after separation of the slurry by filtration can be applied.

The weight-average molecular weight of the resin (A) is a value in terms of polystyrene, measured by means of a GPC method, and is preferably 1,000 to 200,000, more preferably 1,000 to 20,000, and still more preferably 1,000 to 15,000. By setting the weight-average molecular weight to 1,000 to 200,000, the heat resistance and the dry etching resistance can be prevented from being deteriorated, and the film forming properties can be prevented from being deteriorated due to deteriorated developability or increased viscosity.

The dispersity (molecular weight distribution) to be used is in a range of usually 1 to 5, preferably 1 to 3, more preferably 1.2 to 3.0, and particularly preferably 1.2 to 2.0 is used. As the dispersity is smaller, the resolution and the resist shape are excellent, the side wall of the resist pattern is smooth, and the roughness is excellent.

Furthermore, in the present specification, the weight-average molecular weight of each of the components including the resin (A) are a value in terms of polystyrene, determined by gel permeation chromatography (GPC) (carrier: tetrahydrofuran (THF)).

The blend amount of the resin (A) in the entire resist composition of the present invention is preferably 50% to 99.9% by mass, and more preferably 60% to 99.0% by mass, with respect to the total solid content.

Furthermore, in the present invention, the resin (A) may be used singly or in combination of plural kinds thereof.

It is preferable that the resin (A), preferably the resist composition of the present invention contains neither a fluorine atom nor a silicon atom from the viewpoint of the compatibility with a topcoat composition.

(B) Compound that Generates Acid Upon Irradiation with Active Light or Radiation The resist composition of the present invention typically contains a compound that generates an acid upon irradiation with active light or radiation (also referred to as a "photoacid generator," an "acid generator," or a "component (B)").

The molecular weight of the photoacid generator is preferably 800 or less, more preferably 700 or less, still more preferably 650 or less, and particularly preferably 600 or less.

As such a photoacid generator, a compound may be appropriately selected from known compounds that generate an acid upon irradiation with active light or radiation which are used for a photoinitiator for cationic photopolymerization, a photoinitiator for radical photopolymerization, a photodecoloring agent for coloring agents, a photodiscoloring agent, a microresist, or the like, and a mixture thereof, and used.

Examples of the compound include a diazonium salt, a phosphonium salt, a sulfonium salt, an iodonium salt, imidosulfonate, oxime sulfonate, diazodisulfone, disulfone, and o-nitrobenzyl sulfonate.

In addition, as a compound in which a group or compound that generates an acid upon irradiation with active light or radiation is introduced into the main or side chain of the polymer, for example, the compounds described in U.S. Pat. No. 3,849,137A, GE3914407A, JP1988-26653A (JP-S63-26653A), JP1980-164824A (JP55-164824A), JP1987-69263A (JP62-69263A), JP1988-146038A (JP63-146038A), JP1988-163452A (JP63-163452A), JP1987-153853A (JP62-153853A), JP1988-146029A (JP63-146029A), and the like can be used.

In addition, the compounds that generates an acid by light described in U.S. Pat. No. 3,779,778A, EP126712B, and the like can also be used.

The acid generator containing the composition of the present invention is preferably a compound that generates an acid having a cyclic structure upon irradiation with active light or radiation. As the cyclic structure, a monocyclic or polycyclic alicyclic group is preferable, and a polycyclic alicyclic group is more preferable. It is preferable that carbonyl carbon is not included as a carbon atom constituting the ring skeleton of the alicyclic group.

Suitable examples of the acid generator contained in the composition of the present invention include a compound (a specific acid generator) that generates an acid upon irradiation with active light or radiation represented by the following General Formula (3).

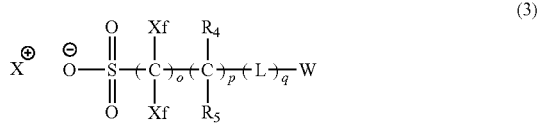

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

L represents a divalent linking group, and in a case where L's are present in plural numbers, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms of the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_4$ and $R_5$ each represent a hydrogen atom, a fluorine atom, an alkyl group, or an alkyl group substituted with at least one fluorine atom, and in a case where $R_4$ and $R_5$ are present in plural numbers, they may be the same as or different from each other.

The alkyl group as $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom are the same as the specific examples and suitable aspects of Xf in General Formula (3).

L represents a divalent linking group, and in a case where L's are present in plural numbers, they may be the same as or different from each other.

Examples of the divalent linking group include —COO— (—C(=O)—O—), —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferable, and —COO—, —OCO—, —CONH—, —$SO_2$—, —COO-alkylene group-, or —OCO-alkylene group- is more preferable.

W represents an organic group including a cyclic structure. Above all, it is preferably a cyclic organic group.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, a diamantyl group, and an adamantyl group is preferable from the viewpoints of inhibiting diffusivity into the film during post exposure baking (PEB) process and improving Mask Error Enhancement Factor (MEEF).

The aryl group may be monocyclic or polycyclic. Examples of the aryl group include a phenyl group, a naphthyl group, a phenanthryl group, and an anthryl group.

Among these, a naphthyl group showing a relatively low light absorbance at 193 nm is preferable.

The heterocyclic group may be monocyclic or polycyclic, but is preferably polycyclic so as to suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. Further, examples of the lactone ring and the sultone ring include the lactone structures and sultone structures exemplified in the above-mentioned resin.

The cyclic organic group may have a substituent. Examples of the substituent include, an alkyl group (which may be linear or branched, and preferably has 1 to 12 carbon atoms), a cycloalkyl group (which may be monocyclic, polycyclic, or spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be carbonyl carbon.

o represents an integer of 1 to 3. p represents an integer of 0 to 10. q represents an integer of 0 to 10.

In one aspect, it is preferable that in General Formula (3), o is an integer of 1 to 3, p is an integer of 1 to 10, and q is 0. Xf is preferably a fluorine atom, $R_4$ and $R_5$ are preferably both hydrogen atoms, and W is preferably a polycyclic hydrocarbon group. o is more preferably 1 or 2, and still more preferably 1. p is more preferably an integer of 1 to 3, still more preferably 1 or 2, and particularly preferably 1. W is more preferably a polycyclic cycloalkyl group, and still more preferably an adamantyl group or a diamantyl group.

(Cation)

In General Formula (3), $X^+$ represents a cation.

$X^+$ is not particularly limited as long as it is a cation, but suitable aspects thereof include cations (moieties other than $Z^-$) in General Formula (ZI), (ZII), or (ZIII) which will be described later.

(Suitable Aspects)

Suitable aspects of the specific acid generator include a compound represented by the following General Formula (ZI), (ZII), or (ZIII).

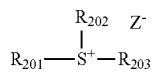

(ZI)

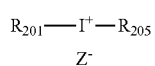

(ZII)

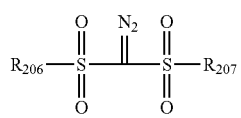

(ZIII)

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents an anion in General Formula (3), and specifically represents the following anion.

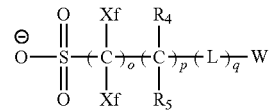

Examples of the organic group represented by $R_{201}$, $R_{202}$, and $R_{203}$ include groups corresponding to the compounds (ZI-1), (ZI-2), (ZI-3), and (ZI-4), which will be described later.

Incidentally, it may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of another compound represented by General Formula (ZI) through a single bond or a linking group.

More preferred examples of the component (ZI) include the compounds (ZI-1), (ZI-2), (ZI-3), and (ZI-4) described below.

First, the compound (ZI-1) will be described.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aiyldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, if desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as the substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a hetero atom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by the following General Formula (ZI-3), which is a compound having a phenacylsulfonium salt structure.

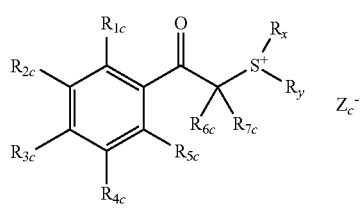

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$, each may be bonded to each other to form a ring structure, and the ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring composed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$c, and $R_x$ and $R_y$ include a butylene group and a pentylene group.

As groups formed by the bonding of $R_{5c}$ and $R_{6c}$ and $R_{5c}$ and $R_x$, a single bond or alkylene group is preferable, and examples thereof include a methylene group and an ethylene group.

$Zc^-$ represents an anion in General Formula (3), and specifically, is the same as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) in the present invention include the cations described under paragraph [0036] of the specification of US2012/0076996A.

Next, the compound (ZI-4) will be described.

The compound (ZI-4) is represented by the following General Formula (ZI-4).

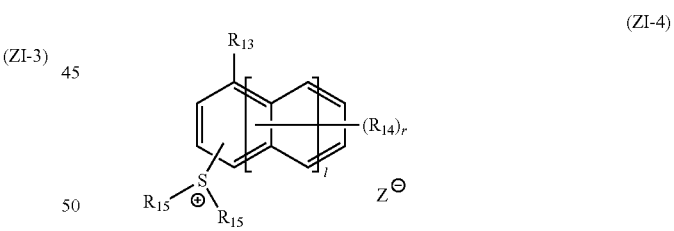

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. When two $R_{15}$'s are bonded to form a ring, the ring skeleton may include a hetero atom such as an oxygen atom and a nitrogen atom. In one aspect, it is preferable that two $R_{15}$'s are alkylene groups, and are bonded to each other to form a ring structure.

l represents an integer of 0 to 2.

r represents an integer of 0 to 8.

$Z^-$ represents an anion in General Formula (3), and specifically, is as described above.

In General Formula (ZI-4), as the alkyl group of $R_{13}$, $R_{14}$, and $R_{15}$, an alkyl which is linear or branched and has 1 to 10 carbon atoms is preferable, and preferred examples thereof include a methyl group, an ethyl group, an n-butyl group, and a t-butyl group.

Examples of the cation of the compound represented by General Formula (ZI-4) in the present invention include the cations described in paragraphs [0121], [0123], and [0124] of JP2010-256842A, paragraphs [0127], [0129], and [0130] of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in $R_{204}$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of $R_{204}$ to $R_{207}$ may have a substituent. Examples of the substituent which the aryl group, the alkyl group, or the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), and specifically, is as described above.

The acid generators may be used singly or in combination of two or more kinds thereof.

The content of the acid generator (a total sum of contents in a case where the acid generators are present in plural kinds) in the composition is preferably 0.1% to 30% by mass, more preferably 0.5% to 25% by mass, still more preferably 3% to 20% by mass, and particularly preferably 3% to 15% by mass, with respect to the total solid content of the composition.

Furthermore, the content of the acid generator (a total sum of contents in a case where the acid generators are present in plural kinds) included in the composition in a case where the acid generator contains a compound represented by General Formula (ZI-3) or (ZI-4) is preferably 5% to 35% by mass, more preferably 8% to 30% by mass, still more preferably 9% to 30% by mass, and particularly preferably 9% to 25% by mass, with respect to the total solid content of the composition.

(C) Solvent

Examples of the solvent which can be used when the respective components are dissolved to prepare a resist composition include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, propylene carbonate, butyl butanoate, isoamyl acetate, and methyl 2-hydroxyisobutyrate.

In the present invention, the solvents may be used singly or in combination of two or more kinds thereof.

In the present invention, a mixed solvent obtained by mixing a solvent containing a hydroxyl group in its structure with a solvent not containing a hydroxyl group in its structure may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable.

Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (based on mass) of the solvent containing a hydroxyl group to the solvent not containing a hydroxyl group is 1/99 to 99/1, preferably 10/90 to 90/10, and more preferably 20/80 to 60/40. A mixed solvent including the solvent not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Hydrophobic Resin

The resist composition of the present invention may contain a hydrophobic resin (D) (hereinafter simply also referred to as a "hydrophobic resin" or a "hydrophobic resin (D)"). As the hydrophobic resin, for example, a resin (X) which will be described later, which can be contained in a topcoat composition, can be suitably used. Suitable aspects of the hydrophobic resin are also the same as for the resin (X) which will be described later. For example, the hydrophobic resin preferably contains at least one selected from the group consisting of a fluorine atom, a silicon atom, and a $CH_3$ partial structure contained in the side chain moiety of the resin. Incidentally, the hydrophobic resin preferably contains the fluorine atom-containing repeating units in the amount of preferably 0% to 20% by mole, more preferably 0% to 10% by mole, still more preferably 0% to 5% by mole, particularly preferably 0% to 3% by mole, and ideally 0% by mole, that is, not containing a fluorine atom, with respect to all the repeating units. The hydrophobic resin preferably includes a repeating unit having at least one $CH_3$ partial structure in the side chain moiety, more preferably includes a repeating unit having at least two $CH_3$ partial structures in the side chain moiety, and still more preferably includes a repeating unit having at least three $CH_3$ partial structures in the side chain moiety. The hydrophobic resin is preferably solid at normal temperature (25° C.). Further, the glass transition temperature (Tg) is preferably 50° C. to 250° C., more preferably 70° C. to 250° C., still more preferably 80° C. to 250° C., preferably 90° C. to 250° C., and the most preferably 100° C. to 250° C. The hydrophobic resin preferably has a repeating unit having a monocyclic or polycyclic cycloalkyl group. The monocyclic or polycyclic cycloalkyl group may be included in any one of the main chain and the side chain of the repeating unit. The hydrophobic resin more preferably has a repeating unit having both of a monocyclic or polycyclic cycloalkyl group and a $CH_3$ partial structure, and still more preferably a repeating unit having both of a monocyclic or polycyclic cycloalkyl group and a $CH_3$ partial structure in the side chain.

The weight-average molecular weight of the hydrophobic resin (D) in terms of standard polystyrene is preferably 1,000 to 100,000, more preferably 1,000 to 50,000, and still more preferably 2,000 to 15,000.

Furthermore, the hydrophobic resin (D) may be used singly or in combination of plural kinds thereof.

The content of the hydrophobic resin (D) in the composition is generally 0.01% to 30% by mass, preferably 0.01% to 10% by mass, more preferably 0.05% to 8% by mass, and still more preferably 0.1% to 7% by mass, with respect to the total solid content of the resist composition of the present invention.

(E) Basic Compound

The resist composition of the present invention preferably contains a basic compound (E) in order to reduce a change in performance over time from exposure to heating.

Preferred examples of the basic compound include compounds having structures represented by the following Formulae (A) to (E).

(A)

(B)

(C)

(D)

(E)

In General Formulae (A) to (E), $R^{200}$, $R^{201}$, and $R^{202}$ may be the same as or different from each other, represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Furthermore, as the basic compound, ones described as a basic compound, which may be contained in a composition (topcoat composition) for forming an upper layer film which will be described later can be suitably used.

These basic compounds may be used singly or in combination of two or more kinds thereof.

The amount of the basic compound to be used is usually 0.001% to 10% by mass, and preferably 0.01% to 5% by mass, with respect to the solid content of the resist composition of the present invention.

The ratio between the photoacid generator to the basic compound to be used in the resist composition is preferably the photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The photoacid generator/basic compound (molar ratio) is more preferably 5.0 to 200, and still more preferably 7.0 to 150.

(F) Surfactant

The resist composition of the present invention preferably further contains a surfactant (F), and more preferably contains either one or two or more of fluorine- and/or silicon-based surfactants (a fluorine-based surfactant, a silicon-based surfactant, or a surfactant containing both a fluorine atom and a silicon atom).

By incorporating the surfactant (F) into the resist composition of the present invention, it becomes possible to form a resist pattern which is improved in adhesiveness and decreased in development defects with good sensitivity and resolution at a time of using an exposure light source of 250 nm or less, and particularly 220 nm or less.

Examples of the fluorine- and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), JP2002-277862A, U.S. Pat. Nos. 5,405,720A, 5,360,692A, 5,529,881A, 5,296,330A, 5,436,098A, 5,576,143A, 5,294,511A, and 5,824,451A, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoroaliphatic group derived from a fluoroaliphatic compound which is produced by a telomerization method (also referred to as a telomer method) or an oligomerization method (also referred to as an oligomer method), can be used as the surfactant. The fluoroaliphatic compound can be synthesized in accordance with the method described in JP2002-90991A.

As the polymer having a fluoroaliphatic group, copolymer of monomers having fluoroaliphatic groups and (poly(oxyalkylene)) acrylate and/or (poly(oxyalkylene)) methacrylate are preferable, and they may be distributed at random or may be block copolymerized. Further, examples of the poly (oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxybutylene), and poly(block combination of oxyethylene and oxypropylene). In addition, the copolymers of monomers having fluoroaliphatic groups and (poly(oxyalkylene)) acrylate (or methacrylate) may not be only binary copolymers but also ternary or higher copolymers obtained by copolymerization of monomers having different two or more kinds of fluoroaliphatic groups or different two or more kinds of (poly(oxyalkylene)) acrylates (or methacrylates) or the like at the same time.

Examples of the commercially available surfactant include MEGAFACE F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, in the present invention, surfactants other than fluorine- and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used singly or in combination of some kinds thereof.

The content of the surfactant (F) to be used is preferably 0.01% to 10% by mass, and more preferably 0.1% to 5% by mass, with respect to the total amount (excluding the solvent) of the resist composition.

(G) Onium Carboxylate Salt

The resist composition of the present invention may contain an onium carboxylate salt (G). Examples of the onium carboxylate salt include a sulfonium carboxylate salt, an iodonium carboxylate salt, and an ammonium carboxylate salt. In particular, as the onium carboxylate salt (G), an iodonium salt and a sulfonium salt are preferable. Further, it is preferable that the carboxylate residue of the onium carboxylate salt (G) does not contain an aromatic group and a carbon-carbon double bond. As the particularly preferred anionic moiety, a linear, branched, monocyclic, or polycyclic alkylcarboxylate anion having 1 to 30 carbon atoms is preferable. Further, more preferably, a carboxylate anion in which a part or all of the alkyl groups are substituted with fluorine is preferable. An oxygen atom may be contained in the alkyl chain, by which the transparency to the lights of 220 nm or less is ensured, thus, sensitivity and resolving power are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the resist composition.

(H) Other Additives

The resist composition of the present invention can further contain a dye, a plasticizer, a light sensitizer, a light absorbent, an alkali-soluble resin, a dissolution inhibitor, a compound that promotes solubility in a developer (for example, a phenol compound with a molecular weight of 1,000 or less, an alicyclic or aliphatic compound having a carboxyl group), and the like, if desired.

Such a phenol compound having a molecular weight of 1,000 or less may be easily synthesized by those skilled in the art with reference to the method described in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

[Composition (Topcoat Composition) for Forming Upper Layer Film]

Next, a composition (topcoat composition) for forming an upper layer film, for forming an upper layer film (topcoat) for use in the pattern forming method of the present invention will be described.

In a case of carrying out liquid immersion exposure in the pattern forming method of the present invention, by forming a topcoat, it is possible to expect effects of preventing an immersion liquid from being in direct contact with a resist film, suppressing the resist performance from being deteriorated by permeation of the immersion liquid into a resist film and elution of the resist film components into the immersion liquid, and further, preventing an exposure device lens from being contaminated by elution of the elution components into the immersion liquid.

The topcoat composition used in the pattern forming method of the present invention is preferably a composition including the resin (X) which will be described later, and a solvent, in order to uniformly form the composition on the resist film.

<Solvent>

In order to form a good pattern while not dissolving the resist film, it is preferable that the topcoat composition in the present invention contains a solvent in which the resist film is not dissolved, and it is more preferable that a solvent with components different from an organic developer is used.

Further, from the viewpoint of the prevention of elution into an immersion liquid, low solubility in an immersion liquid is preferred, and low solubility in water is more preferable. In the present specification, "having low solubility in an immersion liquid" means insolubility in an immersion liquid. Similarly, "having low solubility in water" means insolubility in water. Further, from the viewpoints of volatility and coatability, the boiling point of the solvent is preferably 90° C. to 200° C.

Having low solubility in an immersion liquid indicates that in an example of the solubility in water, when a topcoat composition is coated on a silicon wafer and dried to form a film, and then the film is immersed in pure water at 23° C. for 10 minutes, the decrease rate in the film thickness after drying is within 3% of the initial film thickness (typically 50 nm).

In the present invention, from the viewpoint of uniformly coating the topcoat, a solvent having a concentration of the solid content of 0.01% to 20% by mass, more preferably 0.1% to 15% by mass, and the most preferably 1% to 10% by mass is used.

The solvent that can be used is not particularly limited as long as it can dissolve the resin (X) which will be described later and does not dissolve the resist film, but suitable examples thereof include an alcohol-based solvent, a fluorine-based solvent and a hydrocarbon-based solvent, with a non-fluorinated alcohol-based solvent being more preferably used. Thus, the non-dissolving property for the resist film is further enhanced and when the topcoat composition is coated on the resist film, a topcoat can be more uniformly formed without dissolving the resist film.

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among these, a fluorinated alcohol and a fluorinated hydrocarbon-based solvent can be suitably used.

Examples of the hydrocarbon-based solvent include aromatic hydrocarbon-based solvents such as toluene, xylene, and anisole, and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

These solvents are used singly or as a mixture of a plurality thereof.

In a case of mixing a solvent other than those recited above, the mixing ratio thereof is usually 0% to 30% by mass, preferably 0% to 20% by mass, and more preferably 0% to 10% by mass, with respect to the total amount of solvents in the topcoat composition. By mixing a solvent other than those recited above, the solubility for the resist film, the solubility of the resin in the topcoat composition, the elution characteristics from the resist film, or the like can be appropriately adjusted.

<Resin (X)>

The resin (X) in the topcoat composition is preferably a resin which is transparent for the exposure light source to be used since the light reaches the resist film through the topcoat upon exposure. In a case where the resin (X) is used for ArF liquid immersion exposure, it is preferable that the resin does not have an aromatic group in view of transparency to ArF light.

The resin (X) preferably has at least one of a "fluorine atom," a "silicon atom," or a "$CH_3$ partial structure which is contained in a side chain moiety of a resin," and more preferably has two or more kinds. The resin (X) is preferably a water-insoluble resin (hydrophobic resin).

In a case where the resin (X) contains a fluorine atom and/or a silicon atom, the fluorine atom and/or the silicon atom may be contained or substituted in the main chain or the side chain of the resin (X).

In a case where the resin (X) contains a fluorine atom, it is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom, and they may further have another substituent.

The aryl group having a fluorine atom is an aryl group in which at least one hydrogen atom is substituted with a fluorine atom, such as a phenyl group and a naphthyl group, and they may further have another substituent.

Specific examples of the alkyl group having a fluorine atom, the cycloalkyl group having a fluorine atom, and the aryl group having a fluorine atom are shown below, but the present invention is not limited thereto.

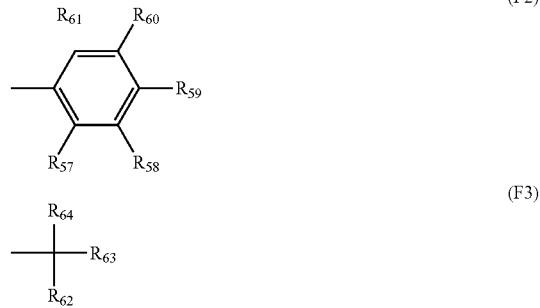

In General Formulae (F2) to (F3), $R_{57}$ to $R_{64}$ each independently represent a hydrogen atom, a fluorine atom, or an alkyl group, provided that at least one of $R_{57}, \ldots,$ or $R_{61}$ or of $R_{62}, \ldots,$ or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. Each of $R_{62}$ and $R_{63}$ is preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl) hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group, or a perfluoroisopentyl group is preferable, and a hexafluoroisopropyl group or a heptafluoroisopropyl group is more preferable.

In a case where the resin (X) has a silicon atom, it is preferably a resin having an alkylsilyl structure (preferably a trialkylsilyl group) or a cyclic siloxane structure as a partial structure having a silicon atom.

Specific examples of the alkylsilyl structure and cyclic siloxane structure include groups represented by the following General Formulae (CS-1) to (CS-3).

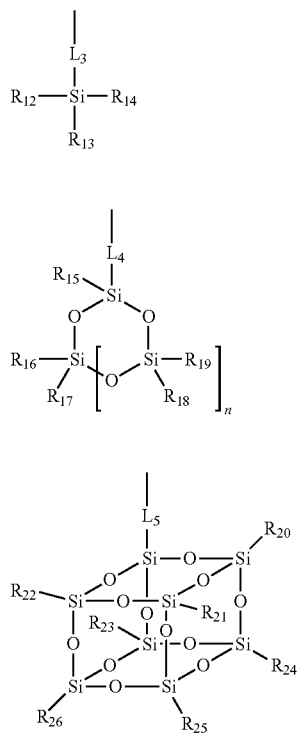

In General Formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms).

$L_3$ to $L_5$ each represent a single bond or a divalent linking group. Examples of the divalent linking group include one member or a combination of two or more thereof selected form the group consisting of an alkylene group, a phenyl group, an ether group, a thioether group, a carbonyl group, an ester group, an amido group, a urethane group, and a urea group.

n represents an integer of 1 to 5.

Examples of the resin (X) include a resin having at least one repeating units selected from the group consisting of the repeating units represented by the following General Formulae (C-I) to (C-V).

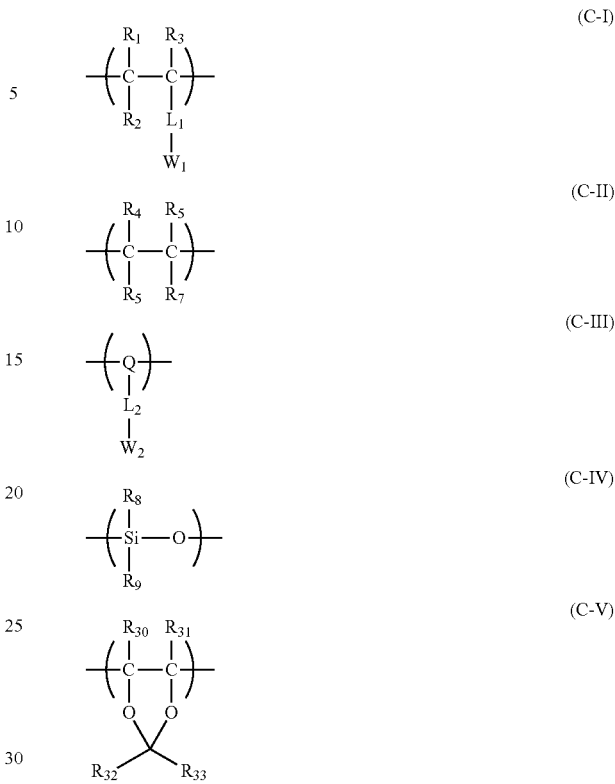

In General Formulae (C-I) to (C-V), $R_1$ to $R_3$ each represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each independently represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4, \ldots,$ or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each independently represent a single bond or a divalent linking group, which are the same as $L_3$ to $L_5$.

Q represents a monocyclic or polycyclic aliphatic group. That is, it represents an atomic group containing two carbon atoms (C—C) bonded to each other for forming an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

It is to be noted that the repeating unit represented by General Formula (C-V) has at least one fluorine atom in at least one of $R_{30}$, $R_{31}$, $R_{32}$, or $R_{33}$.

The resin (X) preferably has a repeating unit represented by General Formula (C-I), and more preferably a repeating unit represented by any of the following General Formulae (C-Ia) to (C-Id).

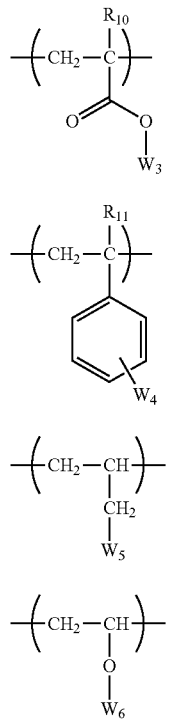

(C-Ia)

(C-Ib)

(C-Ic)

(C-Id)

In General Formulae (C-Ia) to (C-Id), $R_{10}$ and $R_{11}$ each represents a hydrogen atom, a fluorine atom, a linear or branched alkyl group having 1 to 4 carbon atoms, or a linear or branched fluorinated alkyl group having 1 to 4 carbon atoms.

$W_3$ to $W_6$ are each an organic group having one or more groups of at least one of a fluorine atom or a silicon atom.

When $W_3$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by each of $W_3$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

When $W_3$ to $W_6$ are each an organic group having a silicon atom, an alkylsilyl structure or a cyclic siloxane structure is preferable. Specific examples thereof include groups represented by General Formulae (CS-1) to (CS-3).

Specific examples of the repeating unit represented by General Formula (C-I) are shown below, but are not limited thereto. X represents a hydrogen atom, —CH$_3$, —F, or —CF$_3$.

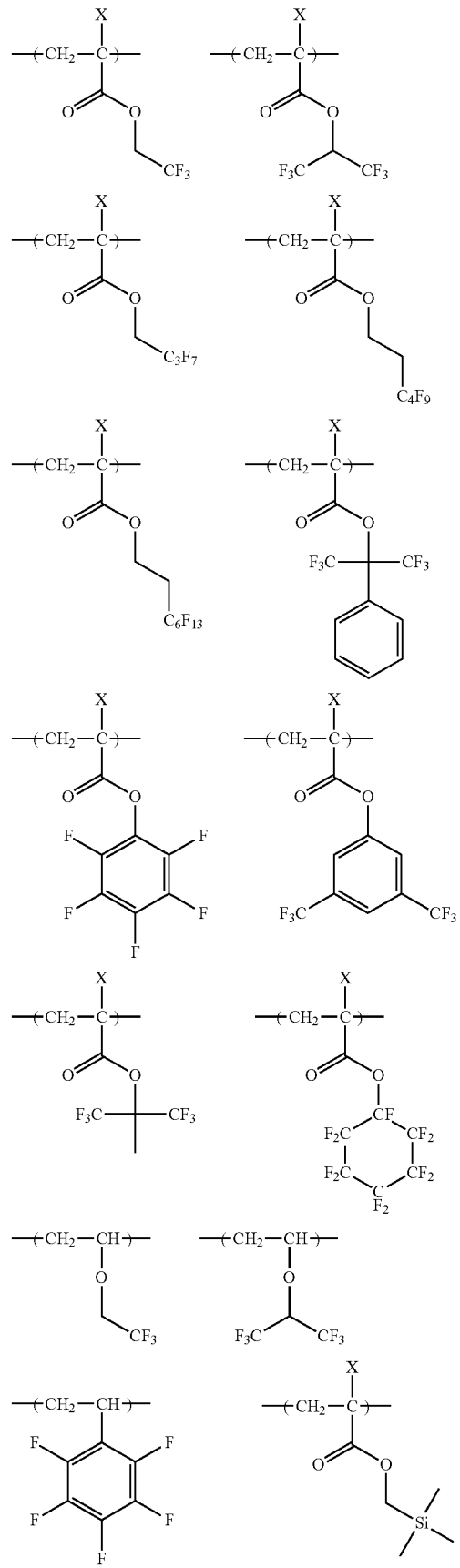

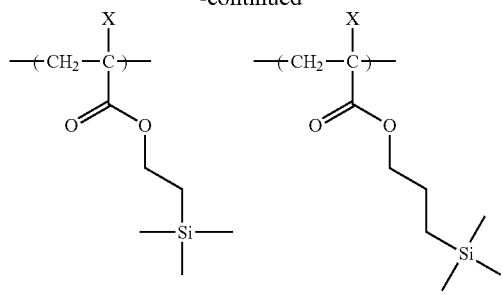
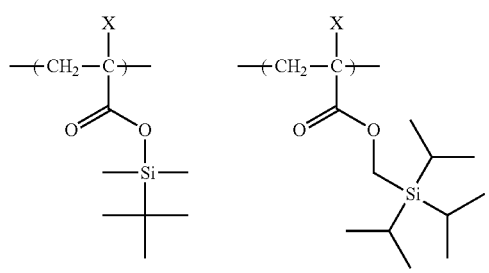
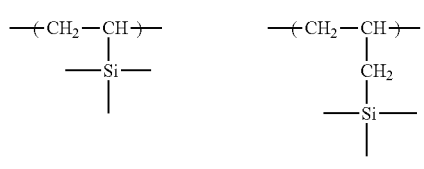
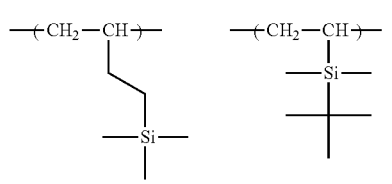
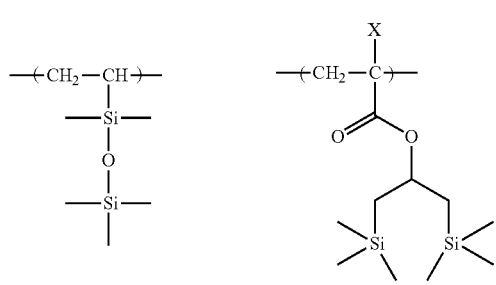
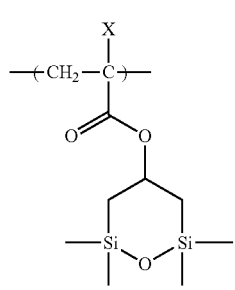

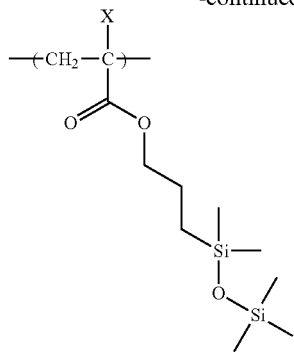
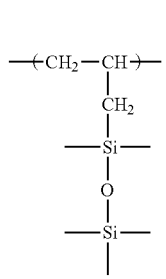
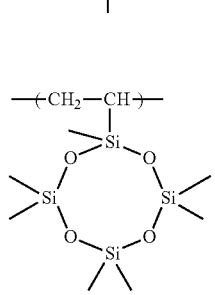
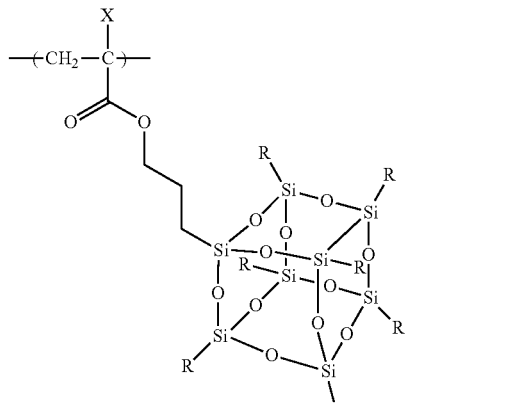

R = CH$_3$, C$_2$H$_5$, C$_3$H$_7$, C$_4$H$_9$

Furthermore, it is also preferable that the resin (X) includes a CH$_3$ partial structure in the side chain moiety, as described above. The resin (X) preferably includes a repeating unit having at least one CH$_3$ partial structure in the side chain moiety, more preferably includes a repeating unit having at least two CH$_3$ partial structures in the side chain moiety, and still more preferably includes a repeating unit having at least three CH$_3$ partial structures in the side chain moiety.

Here, the CH$_3$ partial structure (hereinafter also simply referred to as a "side chain CH$_3$ partial structure") contained in the side chain moiety in the resin (X) includes a $CH_3$ partial structure contained in an ethyl group, a propyl group, or the like.

On the other hand, a methyl group bonded directly to the main chain of the resin (X) (for example, an α-methyl group in the repeating unit having a methacrylic acid structure) makes only a small contribution of uneven distribution to the surface of the resin (X) due to the effect of the main chain, and it is therefore not included in the $CH_3$ partial structure in the present invention.

More specifically, in a case where the resin (X) contains a repeating unit derived from a monomer having a polymerizable moiety with a carbon-carbon double bond, such as a repeating unit represented by the following General Formula (M), and in addition, $R_{11}$ to $R_{14}$ are $CH_3$ "themselves," such the $CH_3$ is not included in the $CH_3$ partial structure contained in the side chain moiety in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the resin (X) has "one" $CH_3$ partial structure in the present invention.

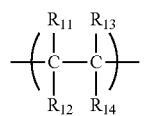

(M)

In General Formula (M), $R_{11}$ to $R_{14}$ each independently represent a side chain moiety.

Examples of $R_{11}$ to $R_{14}$ in the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The resin (X) is preferably a resin including a repeating unit having the $CH_3$ partial structure in the side chain moiety there, and more preferably has, as such a repeating unit, at least one repeating unit (x) of a repeating unit represented by the following General Formula (II) or a repeating unit represented by the following General Formula (III). In particular, in a case where KrF, EUV, or electron beams (EB) are used as an exposure light source, the resin (X) can suitably include the repeating unit represented by General Formula (III).

Hereinafter, the repeating unit represented by General Formula (II) will be described in detail.

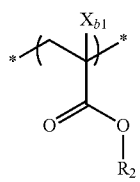

(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group not having a "group that leaves by an acid" described in the resin (A).

The alkyl group of $X_{1b}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

$R_2$ is a hydrocarbon group having one or more $CH_3$ partial structures, and an atom directly bonded to an oxygen atom in General Formula (II) among the atoms constituting $R_2$ is preferably a primary carbon atom or a secondary carbon atom. By taking such an aspect, the hydrophobic resin has more improved stability against an acid and hydrophobicity. Here, the primary carbon atom is a carbon atom in which the number of carbon atoms directly bonded thereto is 1, and the secondary carbon atom is a carbon atom in which the number of carbon atoms directly bonded thereto is 2.

Examples of the hydrocarbon group include an alkyl group, a cycloalkyl group, an alkenyl group, a cycloalkenyl group, an aryl group, and an aralkyl group. The cycloalkyl group, the alkenyl group, the cycloalkenyl group, the aryl group, and the aralkyl group may further have an alkyl group as a substituent.

$R_2$ is preferably an alkyl group or an alkyl-substituted cycloalkyl group, which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 2 to 8.

The alkyl group having one or more $CH_3$ partial structures in $R_2$ is preferably a branched alkyl group having 3 to 20 carbon atoms. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group, and the alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

The cycloalkyl group having one or more $CH_3$ partial structures in $R_2$ may be monocyclic or polycyclic. Specific examples thereof include groups having a monocyclo, bicyclo, tricyclo, or tetracyclo structure having 5 or more carbon atoms. The number of carbon atoms is preferably 6 to 30, and particularly preferably 7 to 25. Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group, and the cycloalkyl group is more preferably an adamantyl group, a norbornyl group, a cyclohexyl group, a cyclopentyl group, a tetracyclododecanyl group, or a tricyclodecanyl group, and even more preferably a norbornyl group, a cyclopentyl group, or a cyclohexyl group.

The alkenyl group having one or more $CH_3$ partial structures in $R_2$ is preferably a linear or branched alkenyl group having 1 to 20 carbon atoms, and more preferably a branched alkenyl group.

The aryl group having one or more $CH_3$ partial structures in $R_2$ is preferably an aryl group having 6 to 20 carbon atoms, and examples thereof include a phenyl group and a naphthyl group, and the aryl group is preferably a phenyl group.

The aralkyl group having one or more $CH_3$ partial structures in $R_2$ is preferably an aralkyl group having 7 to 12 carbon atoms, and examples thereof include a benzyl group, a phenethyl group, and a naphthylmethyl group.

Specific examples of the hydrocarbon group having two or more $CH_3$ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-t-butylcyclohexyl group, and an isobornyl group. The hydrocarbon structure is more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-ditert-butylcyclohexyl group, a 4-isopropylcyclohexyl group, a 4-t-butylcyclohexyl group, or an isobornyl group.

Specific preferred examples of the repeating unit represented by General Formula (II) are shown below, but the present invention is not limited thereto.

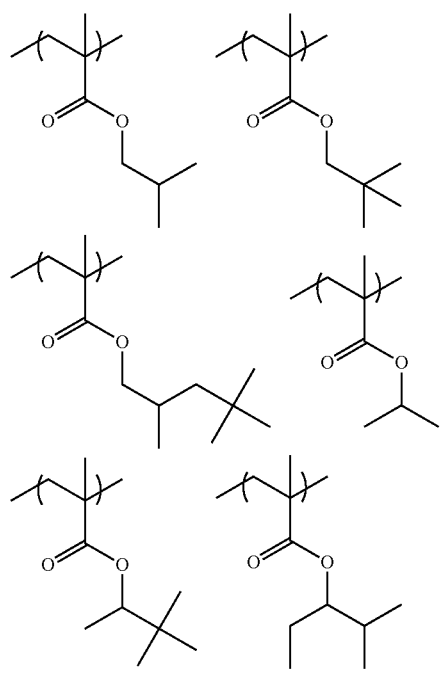

-continued

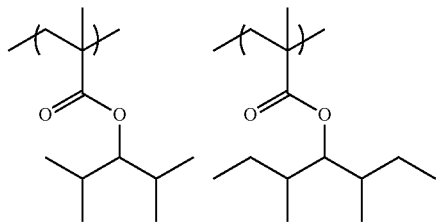

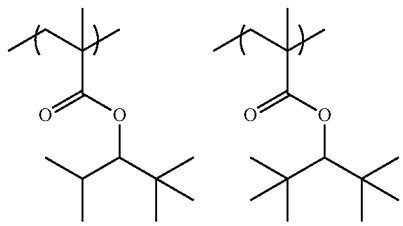

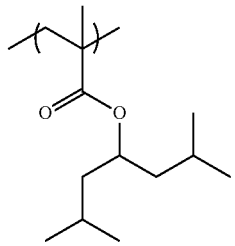

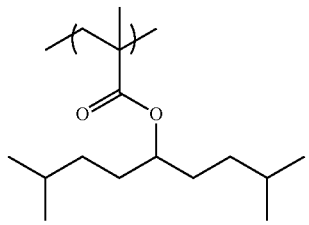

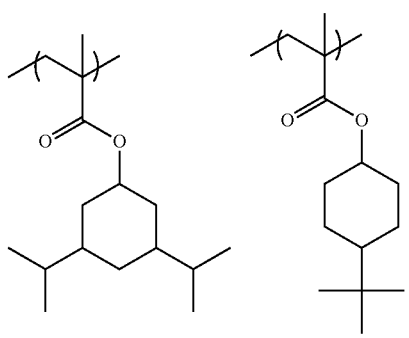

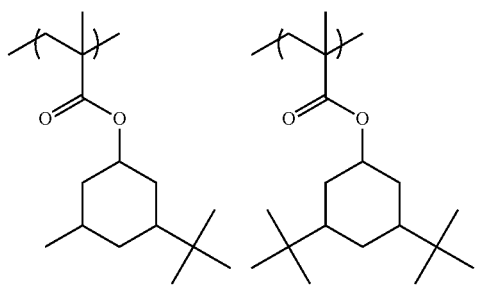

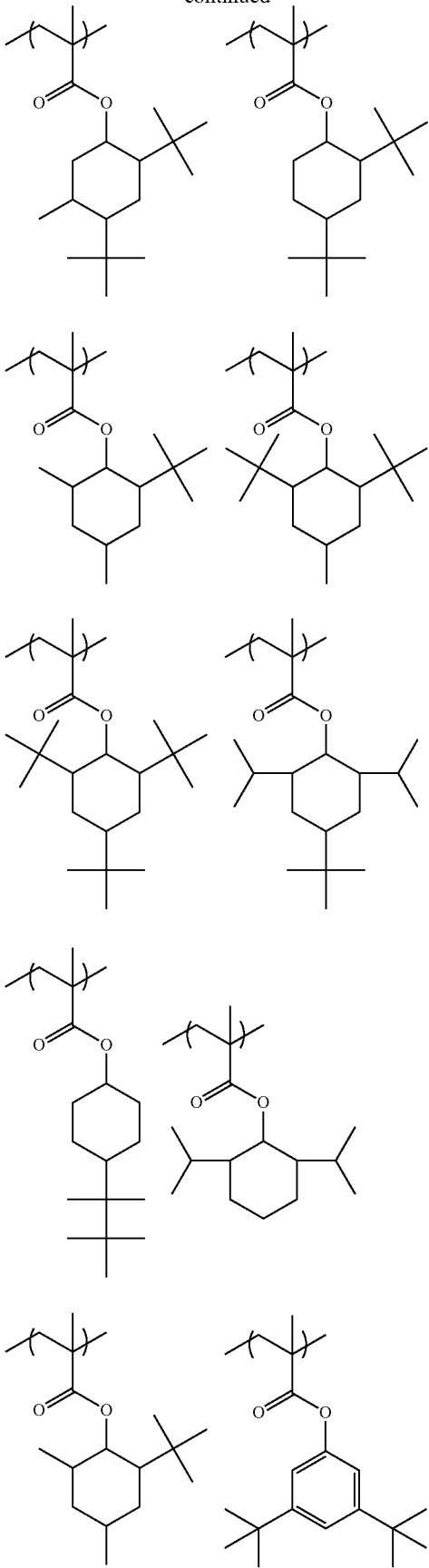

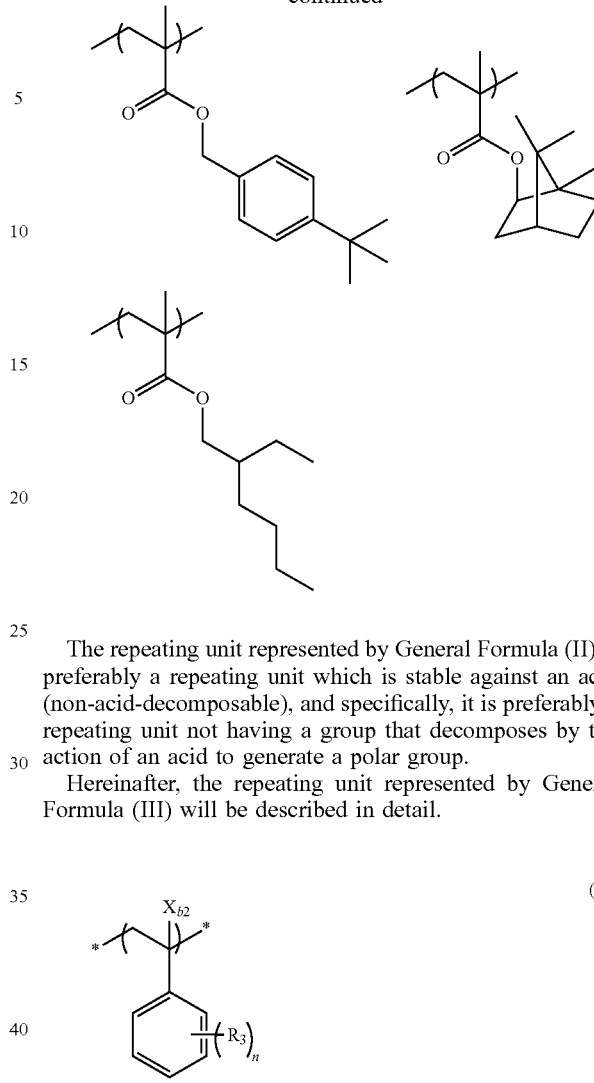

The repeating unit represented by General Formula (II) is preferably a repeating unit which is stable against an acid (non-acid-decomposable), and specifically, it is preferably a repeating unit not having a group that decomposes by the action of an acid to generate a polar group.

Hereinafter, the repeating unit represented by General Formula (III) will be described in detail.

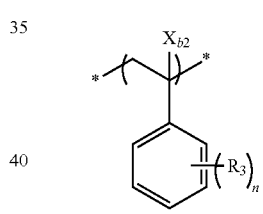

(III)

In General Formula (III), $X_{b2}$ represents a hydrogen atom, an alkyl group, a cyano group, or a halogen atom, $R_3$ represents an organic group having one or more $CH_3$ partial structures, which is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group stable against an acid, more specifically, $R_3$ is preferably an organic group which does not have the "group that leaves by an acid" described above in the resin (A).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

The alkyl group having one or more $CH_3$ partial structures in $R_3$ is preferably a branched alkyl group having 3 to 20 carbon atoms. Preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

Specific examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably one having 5 to 20 carbon atoms, and is more preferably an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 1,5-dimethyl-3-heptyl group, a 2,3,5,7-tetramethyl-4-heptyl group, or a 2,6-dimethylheptyl group.

n represents an integer of 1 to 5, preferably an integer of 1 to 3, and more preferably 1 or 2.

Specific preferred examples of the repeating unit represented by General Formula (III) are shown below, but the present invention is not limited thereto.

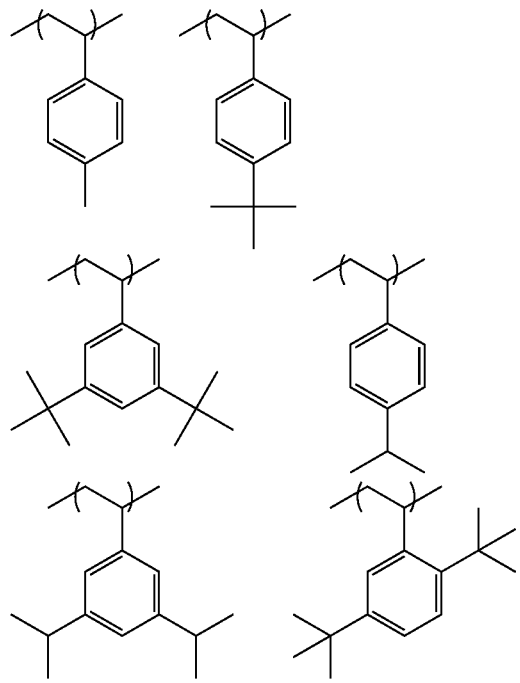

The repeating unit represented by General Formula (III) is preferably a repeating unit which is stable against an acid (non-acid-decomposable), and specifically, it is preferably a repeating unit which does not have a group that decomposes by the action of an acid to generate a polar group.

In a case where the resin (X) contains a $CH_3$ partial structure in the side chain moiety, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the resin (X).

In order to adjust the solubility in an organic developer, the resin (X) may have a repeating unit represented by the following General Formula (Ia).

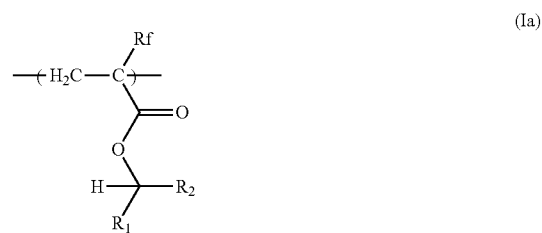

In General Formula (Ia),

Rf represents a fluorine atom or an alkyl group in which at least one hydrogen atom is substituted with a fluorine atom.

$R_1$ represents an alkyl group.

$R_2$ represents a hydrogen atom or an alkyl group.

In General Formula (Ia), the alkyl group in which at least one hydrogen atom is substituted with a fluorine atom among Rf's is preferably one having 1 to 3 carbon atoms, and more preferably a trifluoromethyl group.

The alkyl group of $R_1$ is preferably a linear or branched alkyl group having 3 to 10 carbon atoms, and more preferably a branched alkyl group having 3 to 10 carbon atoms.

$R_2$ is preferably a linear or branched alkyl group having 1 to 10 carbon atoms, and more preferably a linear or branched alkyl group having 3 to 10 carbon atoms.

Specific examples of the repeating unit represented by General Formula (Ia) are shown below, but the present invention is not limited thereto.

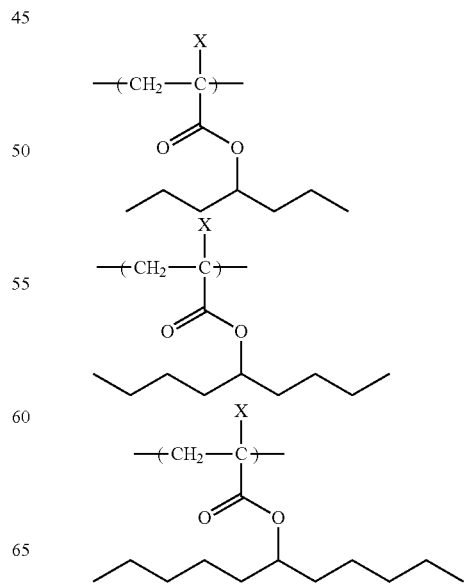

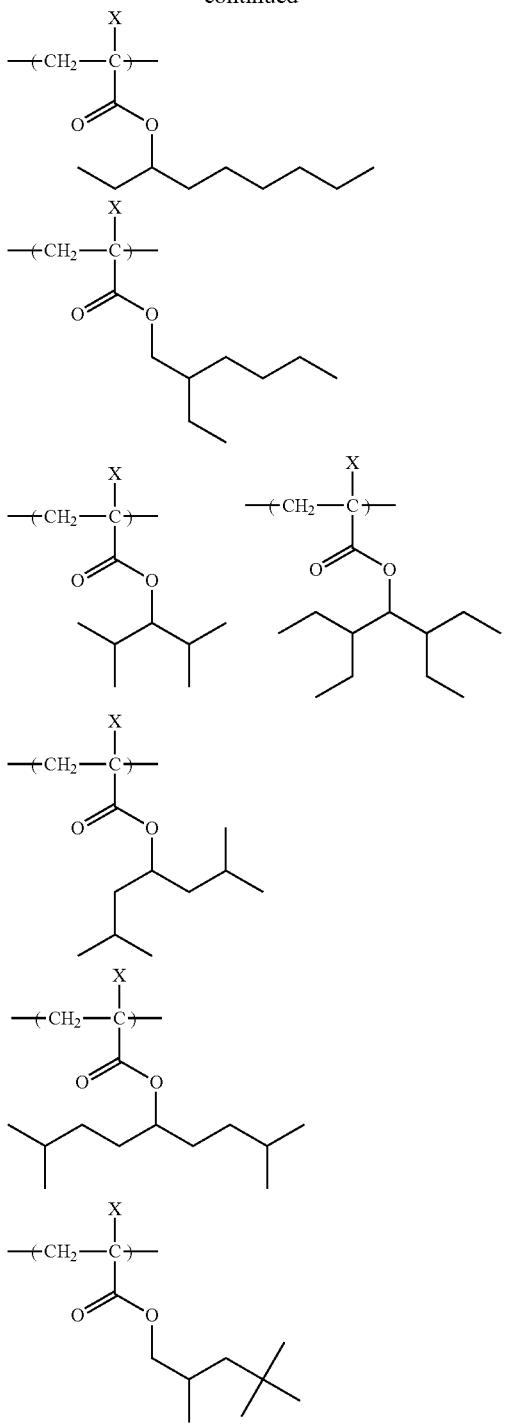

The resin (X) may further have a repeating unit represented by the following General Formula (III).

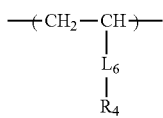

(III)

In General Formula (III), $R_4$ represents an alkyl group, a cycloalkyl group, an alkenyl group, a cycloalkenyl group, a trialkylsilyl group, or a group having a cyclic siloxane structure.

$L_6$ represents a single bond or a divalent linking group.

In General Formula (III), the alkyl group of $R_4$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The trialkylsilyl group is preferably a trialkylsilyl group having 3 to 20 carbon atoms.

The group having a cyclic siloxane structure is preferably a group containing a cyclic siloxane structure having 3 to 20 carbon atoms.

The divalent linking group of $L_6$ is preferably an alkylene group (preferably having 1 to 5 carbon atoms) or an oxy group.

The resin (X) may have a lactone group, an ester group, an acid anhydride, or the same group as the acid-decomposable group in the resin (A).

The resin (X) may further have a repeating unit represented by the following General Formula (VIII).

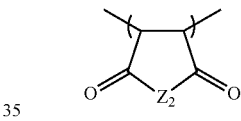

(VIII)

The resin (X) preferably contains a repeating unit (d) derived from a monomer having an alkali-soluble group. Thus, it is possible to control the solubility in an immersion liquid and the solubility in a coating solvent. Examples of the alkali-soluble group include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a group having a tris(alkylsulfonyl)methylene group.

As the monomer having an alkali-soluble group, a monomer having an acid dissociation constant pKa of 4 or more is preferable, a monomer having a pKa of 4 to 13 is more preferable, and a monomer having a pKa of 8 to 13 is the most preferable. By incorporation of a monomer having a pKa of 4 or more, swelling upon development of a negative tone and a positive tone is suppressed, and thus, not only good developability for an organic developer but also good developability in a case of using a weakly basic alkali developer are obtained.

The acid dissociation constant pKa is described in Chemical Handbook (II) (Revised 4$^{th}$ Edition, 1993, compiled by the Chemical Society of Japan, Maruzen Co., Ltd.), and the value of pKa in of the monomer containing an alkali-soluble group can be measured by, for example, using an infinite-dilution solvent at 25° C.

The monomer having a pKa of 4 or more is not particularly limited, and examples thereof include a monomer containing an acid group (an alkali-soluble group) such as a phenolic hydroxyl group, a sulfonamido group, —COCH$_2$CO—, a fluoroalcohol group, and a carboxylic acid group. A monomer containing a fluoroalcohol group is particularly preferable. The fluoroalcohol group is a fluoroalkyl group substituted with at least one hydroxyl group, preferably having 1 to 10 carbon atoms, and more preferably 1 to 5 carbon atoms. Specific examples of the fluoroalcohol group include —CF$_2$OH, —CH$_2$CF$_2$OH, —CH$_2$CF$_2$CF$_2$OH, —C(CF$_3$)$_2$OH, —CF$_2$CF(CF$_3$)OH, and —CH$_2$C(CF$_3$)$_2$OH. As a fluoroalcohol group, a hexafluoroisopropanol group is particularly preferable.

The total amount of the repeating unit derived from a monomer having an alkali-soluble group in the resin (X) is preferably 0% to 90% by mole, more preferably 0% to 80% by mole, and still more preferably 0% to 70% by mole, with respect to all the repeating units constituting the resin (X).

The monomer having an alkali-soluble group may contain only one or two or more acid groups. The repeating unit derived from the monomer preferably has 2 or more acid groups, more preferably 2 to 5 acid groups, and particularly preferably 2 or 3 acid groups, per one repeating unit.

Specific examples of the repeating unit derived from a monomer having an alkali-soluble group include, but not limited to, those described in paragraphs [0278] to [0287] of JP2008-309878A.

In one of preferred aspects, the resin (X) may any one resin selected from (X-1) to (X-8) described in paragraph [0288] of JP2008-309878A as a preferred aspect.

The resin (X) is preferably solid at normal temperature (25° C.). Further, the glass transition temperature (Tg) is preferably 50° C. to 250° C., more preferably 70° C. to 250° C., still more preferably 80° C. to 250° C., preferably 90° C. to 250° C., and the most preferably 100° C. to 250° C.

The resin (X) preferably has a repeating unit having a monocyclic or polycyclic cycloalkyl group. The monocyclic or polycyclic cycloalkyl group may be included in any one of the main chain and the side chain of the repeating unit. The resin (X) more preferably has a repeating unit having both of a monocyclic or polycyclic cycloalkyl group and a CH$_3$ partial structure, and still more preferably a repeating unit having both of a monocyclic or polycyclic cycloalkyl group and a CH$_3$ partial structure in the side chain.

The resin being solid at 25° C. means that the melting point is 25° C. or higher.

The glass transition temperature (Tg) can be measured by a differential scanning calorimetry. For example, it can be determined by after heating a sample and then cooling, analyzing the change in the specific volume when the sample is heated again at 5° C./min.

It is preferable that the resin (X) is insoluble in an immersion liquid (preferably water) and is soluble in an organic developer. From the viewpoint of the possibility of release by development using an alkali developer, it is preferable that the resin (X) is also soluble in an alkali developer.

In a case where the resin (X) has silicon atoms, the content of the silicon atoms is preferably 2% to 50% by mass, and more preferably 2% to 30% by mass, with respect to the molecular weight of the resin (X). Further, the amount of the repeating units containing silicon atoms is preferably 10% to 100% by mass, and more preferably 20% to 100% by mass, in the resin (X).

In a case where the resin (X) contains fluorine atoms, the content of fluorine atoms is preferably 5% to 80% by mass, and more preferably 10% to 80% by mass, with respect to the molecular weight of the resin (X). Further, the content of the repeating units containing fluorine atoms is preferably 10% to 100% by mass, and more preferably 30% to 100% by mass, in the resin (X).

On the other hand, particularly in a case where the resin (X) includes a CH$_3$ partial structure in the side chain moiety, an aspect in which the resin (X) does not substantially contain a fluorine atom is also preferable, and in this case, specifically, the content of the repeating unit having a fluorine atom in the resin (X) is preferably 0% to 20% by mole, more preferably 0% to 10% by mole, still more preferably 0% to 5% by mole, particularly preferably 0% to 3% by mole, and ideally 0% by mole, that is, not containing a fluorine atom, with respect to all the repeating units.

Furthermore, the resin (X) preferably consists of substantially only a repeating unit composed of only atoms selected from a carbon atom, an oxygen atom, a hydrogen atom, a nitrogen atom, and a sulfur atom. More specifically, the repeating unit composed of only atoms selected from a carbon atom, an oxygen atom, a hydrogen atom, a nitrogen atom, and a sulfur atom preferably accounts for 95% by mole or more, more preferably 97% by mole or more, still more preferably 99% by mole or more, and ideally 100% by mole, with respect to all the repeating units in the resin (X).

The weight-average molecular weight of the resin (X) is preferably 1,000 to 100,000, more preferably 1,000 to 50,000, still more preferably 2,000 to 15,000, and particularly preferably 3,000 to 15,000, in terms of standard polystyrene.

In the resin (X), it is of course preferable that the content of impurities such as a metal is small, but the content of residual monomers is also preferably 0% to 10% by mass, more preferably 0% to 5% by mass, and still more preferably 0% to 1% by mass, from the viewpoint of reduction in elution from a topcoat to an immersion liquid. Further, the molecular weight distribution (weight-average molecular weight (Mw)/number-average molecular weight (Mn), also referred to as dispersity) is preferably 1 to 5, more preferably in a range of 1 to 3, and still more preferably in a range of 1 to 1.5.

As the resin (X), various commercially products may be used, or the resin may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition of the present invention, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). If necessary, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is cleaned with a poor solvent can be applied to the purification. For example, by bringing into contact with a solvent (poor solvent), which does poorly dissolve or does not dissolve the resin, corresponding to 10 times or less the volume amount of the reaction solution, or preferably 5 times to 10 times the volume amount of the reaction solution, the resin is solidified and precipitated.

The solvent to be used in the precipitation or reprecipitation from the polymer solution (precipitation or reprecipitation solvent) may be an arbitrary one so long as it is a poor solvent to the polymer. It may be appropriately selected from, for example, a hydrocarbon (for example, an aliphatic hydrocarbon such as pentane, hexane, heptane, and octane; an alicyclic hydrocarbon such as cyclohexane and methylcyclohexane; an aromatic hydrocarbon such as benzene, toluene, and xylene), a halogenated hydrocarbon (for example, a halogenated aliphatic hydrocarbon such as methylene chloride, chloroform, and carbon tetrachloride; a halogenated aromatic hydrocarbon such as chlorobenzene and dichlorobenzene), a nitro compound (for example, nitromethane and nitroethane), a nitrile (for example, acetonitrile and benzonitrile), an ether (for example, a chain ether such as diethyl ether, diisopropyl ether, and dimethoxyethane; and a cyclic ether such as tetrahydrofuran and dioxane), a ketone (for example, acetone, methyl ethyl ketone, and diisobutyl ketone), an ester (for example, ethyl acetate, butyl acetate), a carbonate (for example, dimethyl carbonate, diethyl carbonate, ethylene carbonate, and propylene carbonate), an alcohol (for example, methanol, ethanol, propanol, isopropyl alcohol, and butanol), a carboxylic acid (for example, acetic acid), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate, and ethers such as tetrahydrofuran) is approximately, for example, the former/the latter (volume ratio; 25° C.) ranging from 10/90 to 99/1, preferably the former/the latter (volume ratio; 25° C.) ranging from 30/70 to 98/2, more preferably the former/the latter (volume ratio; 25° C.) ranging from 50/50 to 97/3.

The amount of the precipitation or reprecipitation solvent to be used may be appropriately selected by taking into consideration efficiency, yield, or the like. In general, it is used in an amount of from 100 to 10,000 parts by mass, preferably from 200 to 2,000 parts by mass and more preferably from 300 to 1,000 parts by mass, with respect to 100 parts by mass of the polymer solution.

In the step of feeding the polymer solution into a precipitation or reprecipitation solvent (poor solvent), the nozzle pore diameter is preferably 4 mmϕ or less (for example, 0.2 to 4 mmϕ) and the feeding rate (dropwise addition rate) of the polymer solution into the poor solvent is, for example, in terms of a linear velocity, 0.1 to 10 m/sec, and preferably approximately 0.3 to 5 m/sec.

The precipitation or reprecipitation procedure is preferably carried out under stirring. Examples of the stirring blade which can be used for the stirring include a disc turbine, a fan turbine (including a paddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. If the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature at the precipitation or reprecipitation may be appropriately selected by taking into consideration efficiency or performance, the temperature is usually approximately 0° C. to 50° C., preferably in the vicinity of room temperature (for example, approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under atmospheric pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may include, after the completion of a radical polymerization reaction, precipitating a resin by bringing the polymer into contact with a solvent in which the polymer is sparingly soluble or insoluble (step a), separating the resin from the solution (step b), dissolving the resin in a solvent again to prepare a resin solution A (step c), then precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As the solvent used for the preparation of the resin solution A, the same solvent as the solvent for dissolving the monomer at the polymerization reaction may be used, and the solvent may be the same as or different from each other from the solvent used for the polymerization reaction.

The resin (X) may be used singly or in combination of a plurality thereof.

The blend amount of the resin (X) in the topcoat composition is preferably 50% to 99.9% by mass, and more preferably 60% to 99.0% by mass, with respect to the total solid content.

The topcoat composition preferably further contains a compound of at least one selected from the group consisting of (A1) a basic compound or a base generator, and (A2) a compound containing a bond or group selected from the group consisting of an ether bond, a thioether bond, a hydroxyl group, a thiol group, a carbonyl bond, and an ester bond.

(A1) Basic Compound or Base Generator

The topcoat composition preferably further contains at least one of a basic compound or a base generator (hereinafter collectively referred to as an "additive" or a "compound (A1)" in some cases). By making these additives act as a quencher that traps an acid generated from a photoacid generator, the effects of the present invention are more excellent.

(Basic Compound)

As the basic compound which can be contained in the topcoat composition, an organic basic compound is preferable, and a nitrogen-containing basic compound is more preferable. For example, those described as a basic compound which may be contained in the resist composition of the present invention can be used, and specific examples thereof include the compounds having the structures represented by Formulae (A) to (E) as described above.

In addition, for example, the compounds which are classified into (1) to (7) below can be used.

(1) Compound Represented by General Formula (BS-1)

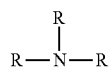

(BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is normally 1 to 20, and preferably 1 to 12.

The number of carbon atoms in the cycloalkyl group as R is not particularly limited, but is normally 3 to 20, and preferably 5 to 15.

The number of carbon atoms in the aryl group as R is not particularly limited, but is normally 6 to 20, and preferably 6 to 10. Specific examples thereof include a phenyl group and a naphthyl group.

The number of carbon atoms in the aralkyl group as R is not particularly limited, but is normally 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxy group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-isopropylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, as the preferable basic compound represented by General Formula (BS-1), an alkyl group in which at least one R is substituted with a hydroxy group is exemplified. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain, —$CH_2CH_2O$— is preferable. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following ones.

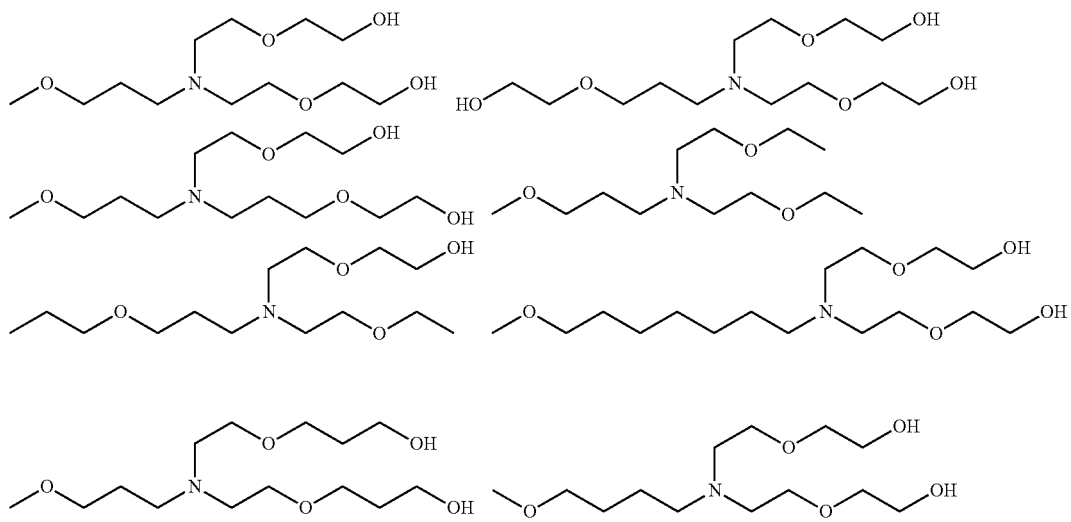

-continued

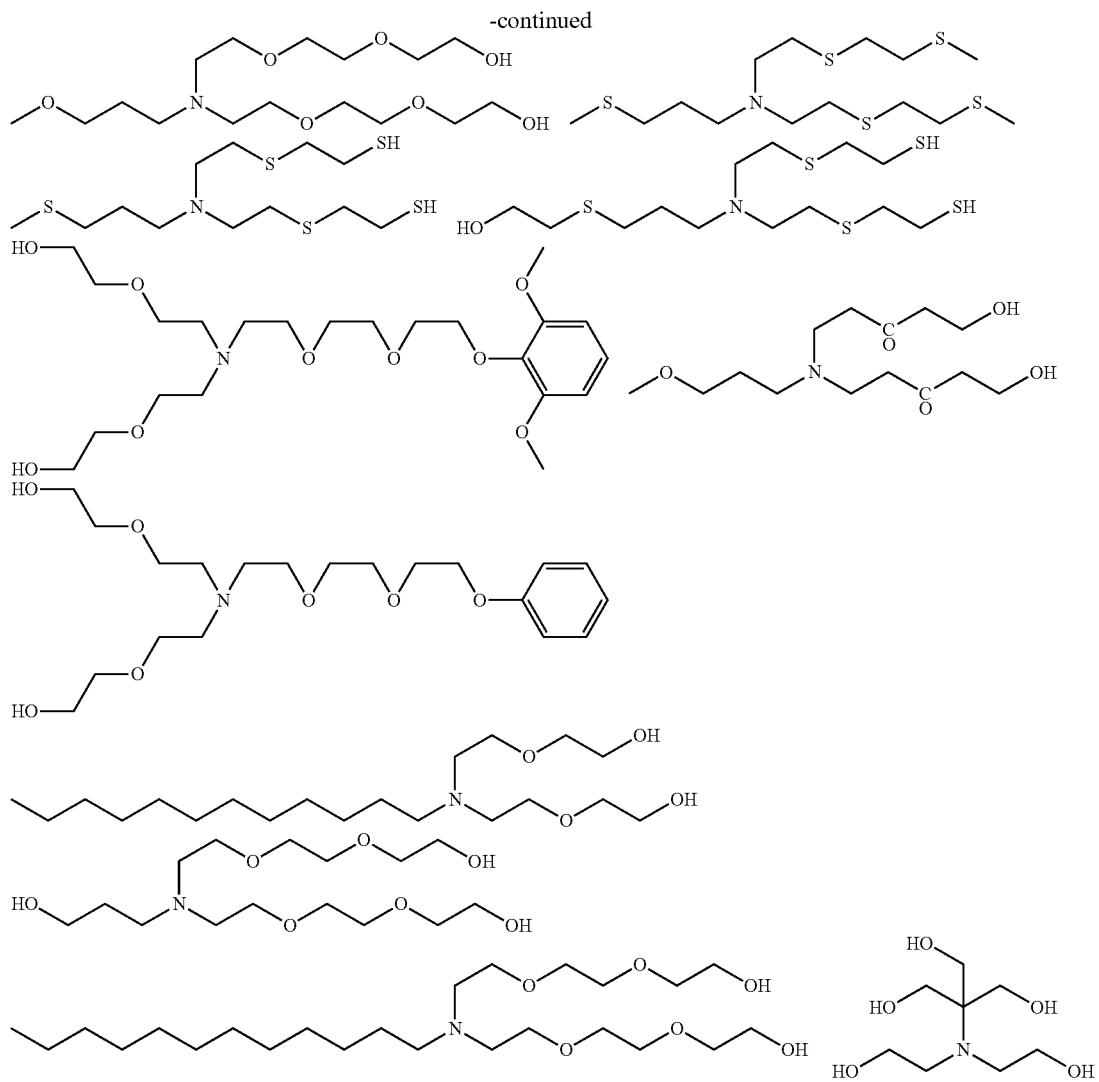

(2) Compound Having Nitrogen-Containing Heterocyclic Structure

The nitrogen-containing heterocycle may have aromatic properties, or may not have aromatic properties. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Furthermore, a compound having two or more ring structures is suitably used. Specific examples thereof include 1,5-diazabicyclo[4.3.0]non-5-ene and 1,8-diazabicyclo[5.4.0]undec-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

This compound more preferably has at least one oxyalkylene chain between the phenoxy group and the nitrogen atom. The number of oxyalkylene chains in one molecule is preferably 3 to 9, and more preferably 4 to 6. Among oxyalkylene chains, —$CH_2CH_2O$— is particularly preferable.

Specific examples thereof include 2-[2-{2-(2,2-dimethoxyphenoxyethoxy)ethyl}-bis-(2-methoxyethyl)]amine and the compounds (C1-1) to (C3-3) exemplified in paragraph [0066] in the specification of US2007/0224539A1.

An amine compound having a phenoxy group is obtained by, for example, heating a mixture of a primary or secondary amine having a phenoxy group and an haloalkyl ether to be reacted, by adding an aqueous solution of a strong base such as sodium hydroxide, potassium hydroxide, or tetraalkylammonium thereto, and by extracting the resultant product with an organic solvent such as ethyl acetate and chloroform. In addition, an amine compound having a phenoxy group can also be obtained by heating a mixture of a primary or secondary amine and an haloalkyl ether having a phenoxy group at the terminal to be reacted, by adding an aqueous solution of a strong base such as sodium hydroxide, potassium hydroxide, or tetraalkylammonium thereto, and by extracting the resultant product with an organic solvent such as ethyl acetate and chloroform.

(4) Ammonium Salt

An ammonium salt can also be appropriately used as the basic compound. Examples of the anion of the ammonium salt include halide, sulfonate, borate, and phosphate. Among these, halide and sulfonate are particularly preferable.

As the halide, chloride, bromide, or iodide is particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, a cyano group, a nitro group, an acyl group, and an acyloxy group.

The ammonium salt may be a hydroxide or a carboxylate. In this case, the ammonium salt is particularly preferably tetraalkylammonium hydroxide (tetraalkylammonium hydroxide such as tetramethylammonium hydroxide, tetraethylammonium hydroxide, or tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2, 6,6-tetramethyl piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

(5) Compound (PA) that has Proton-Accepting Functional Group and Generates Compound in which Proton-Acceptability is Reduced or Lost, or which is Changed from being Proton-Accepting to be Acidic, by being Decomposed Upon Irradiation with Active Light or Radiation The composition according to the present invention may further include a basic compound [hereinafter also referred to as a compound (PA)] that has a functional group with proton acceptor properties and generates a compound in which proton acceptor properties are reduced or lost, or which is changed from being proton-accepting to be acidic, by decomposing upon irradiation with active light or radiation.

The functional group with proton acceptor properties refers to a functional group having a group or electron which is capable of electrostatically interacting with a proton, and for example, means a functional group with a macrocyclic structure, such as a cyclic polyether; or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

Preferred examples of the partial structure of the functional group with proton acceptor properties include crown ether, azacrown ether, primary to tertiary amines, pyridine, imidazole, and pyrazine structures.

The compound (PA) decomposes upon irradiation with active light or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium when a proton adduct is generated from the compound (PA) having the functional group with proton acceptor properties and the proton.

The proton acceptor properties can be confirmed by carrying out pH measurement. In the present invention, the acid dissociation constant pKa of the compound generated by the decomposition of the compound (PA) upon irradiation with active light or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Co., Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by the following General Formula (PA-1), for example, as the proton adduct generated by decomposition upon irradiation with active light or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

$$Q\text{-}A\text{-}(X)_n\text{---}B\text{---}R \qquad (PA\text{-}1)$$

In General Formula (PA-1),

Q represents —$SO_3H$, —$CO_2H$, or —$X_1NHX_2Rf$, in which Rf represents an alkyl group, a cycloalkyl group, or an aryl group, and $X_1$ and $X_2$ each independently represent —$SO_2$— or —CO—.

A represents a single bond or a divalent linking group.

X represents —$SO_2$— or —CO—.

n is 0 or 1.

B represents a single bond, an oxygen atom, or —$N(R_x)R_y$—, in which $R_x$ represents a hydrogen atom or a monovalent organic group, and $R_y$ represents a single bond or a divalent organic group, provided that R may be bonded to $R_y$ to form a ring or may be bonded to R to form a ring.

R represents a monovalent organic group having a functional group with proton acceptor properties.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, preferably having 2 to 6 carbon atoms, and more preferably having 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms, and more preferably, the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in Rx is preferably an organic group having 1 to 30 carbon atoms, and examples thereof include an alkyl group, a cycloalkyl group, an aryl group, an aralkyl group, and an alkenyl group. These groups may further have a substituent.

The alkyl group in Rx may have a substituent, is preferably a linear and branched alkyl group having 1 to 20 carbon atoms, and may have an oxygen atom, a sulfur atom, or a nitrogen atom in the alkyl chain.

Preferred examples of the divalent organic group in Ry include an alkylene group.

Other examples include a ring structure which may be formed by the mutual bonding of Rx and Ry include 5- to 10-membered rings, and particularly preferably 6-membered rings, each of which contains a nitrogen atom.

Furthermore, examples of the alkyl group having a substituent include a group formed by substituting a cycloalkyl group on a linear or branched alkyl group (for example, an adamantylmethyl group, an adamantylethyl group, a cyclohexylethyl group, and a camphor residue).

The cycloalkyl group in Rx may have a substituent, is preferably a cycloalkyl group having 3 to 20 carbon atoms, and may have an oxygen atom in the ring.

The aryl group in Rx may have a substituent, is preferably an aryl group having 6 to 14 carbon atoms.

The aralkyl group in Rx may have a substituent, is preferably an aralkyl group having 7 to 20 carbon atoms.

The alkenyl group in Rx may have a substituent and examples of the alkenyl group include a group having a double bond at an arbitrary position of the alkyl group mentioned as Rx.

The functional group with proton acceptor properties in R is the same as described above, and examples thereof include groups having nitrogen-containing heterocyclic aromatic structures or the like, such as azacrown ether, primary to tertiary amines, pyridine, and imidazole.

As the organic group having such a structure, ones having 4 to 30 carbon atoms are preferable, and examples thereof include an alkyl group, a cycloalkyl group, an aryl group, an aralkyl group, and an alkenyl group.

The alkyl group, the cycloalkyl group, the aryl group, the aralkyl group, and the alkenyl group in the alkyl group, the cycloalkyl group, the aryl group, the aralkyl group, and the alkenyl group, each including a functional group with proton acceptor properties or an ammonium group in R are the same as the alkyl group, the cycloalkyl group, the aryl group, the aralkyl group, and the alkenyl group, respectively, mentioned as Rx.

Examples of the substituent which may be contained in each of the groups include a halogen atom, a hydroxyl group, a nitro group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). With regard to the cyclic structure and the aminoacyl group in the aryl group, the cycloalkyl group, or the like, examples of the substituent further include an alkyl group (preferably having 1 to 20 carbon atoms).

When B is —N(Rx)Ry-, it is preferable that R and Rx are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, and a sulfur atom, or a nitrogen atom may be contained in the ring.

Examples of the monocyclic structure include a 4-membered ring, a 5-membered ring, a 6-membered ring, a 7-membered ring, and a 8-membered ring, each containing a nitrogen atom, or the like. Examples of the polycyclic structure include structures formed by a combination of two or three, or more monocyclic structures. The monocyclic structure or the polycyclic structure may have a substituent, and as the substituent, for example, a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to IS carbon atoms), an alkoxycarbonyl group (preferably having 2 to 15 carbon atoms), an aminoacyl group (preferably having 2 to 20 carbon atoms), or the like is preferable. With regard to the cyclic structure in the aryl group, the cycloalkyl group, or the like, examples of the substituent include an alkyl group (preferably having 1 to 15 carbon atoms). With regard to the aminoacyl group, examples of the substituent further include an alkyl group (preferably having 1 to 15 carbon atoms).

$R_f$ in —$X_1NHX_2Rf$ represented by Q is preferably an alkyl group having 1 to 6 carbon atoms, which may have a fluorine atom, and more preferably a perfluoroalkyl group having 1 to 6 carbon atoms. Further, it is preferable that at least one of $X_1$ or $X_2$ is —$SO_2$—, with a case where both $X_1$ and $X_2$ are —$SO_2$— being more preferable.

The compound represented by General Formula (PA-1) in which the Q site is sulfonic acid can be synthesized by a common sulfonamidation reaction. For example, the compound can be synthesized by a method in which one sulfonyl halide moiety of a bissulfonyl halide compound is selectively reacted with an amine compound to form a sulfonamide bond, and then the another sulfonyl halide moiety thereof is hydrolyzed, or a method in which a cyclic sulfonic acid anhydride is reacted with an amine compound to cause ring opening.

The compound (PA) is preferably an ionic compound. The functional group with proton acceptor properties may be contained in an anion moiety or a cation moiety, and it is preferable that the functional group is contained in an anion moiety.

Preferred examples of the compound (PA) include compounds represented by the following General Formulae (4) to (6).

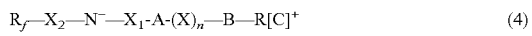

$$R_f—X_2—N^-—X_1\text{-}A\text{-}(X)_n—B—R[C]^+ \quad (4)$$

$$R—SO_3^-[C]^+ \quad (5)$$

$$R—CO_2^-[C]^+ \quad (6)$$

In General Formulae (4) to (6), A, X, n, B, R, $R_f$, $X_1$, and $X_2$ each have the same definitions as in General Formula (PA-1).

$C^+$ represents a counter cation.

As the counter cation, an onium cation is preferable. More specifically, in the photoacid generator, more preferred examples thereof include a sulfonium cation described as $S^+(R_{201})(R_{202})(R_{203})$ in General Formula (ZI) and an iodonium cation described as $I^+(R_{204})(R_{205})$ in General Formula (ZII).

Specific examples of the compound (PA) include, but not limited to, the compounds described in paragraphs [0743] to [0750] of JP2013-83966A.

Furthermore, in the present invention, compounds (PA) other than a compound which generates the compound represented by General Formula (PA-1) can also be appropriately selected. For example, a compound containing a proton acceptor moiety at its cation moiety may be used as an ionic compound. More specific examples thereof include a compound represented by the following General Formula (7).

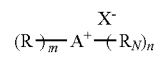

In the formulae, A represents a sulfur atom or an iodine atom.

m represents 1 or 2 and n represents 1 or 2, provided that m+n=3 when A is a sulfur atom and that m+n=2 when A is an iodine atom.

R represents an aryl group.

$R_N$ represents an aryl group substituted with the functional group with proton acceptor properties.

$X^-$ represents a counter anion.

Specific examples of $X^-$ include the same ones as $X^-$ in General Formula (ZI).

Specific preferred examples of the aryl group of R and $R_N$ include a phenyl group.

Specific examples of the functional group with proton acceptor properties, contained in RN, are the same as the functional groups with proton acceptor properties described above in Formula (PA-1).

In the composition of the present invention, the blend ratio of the compound (PA) in the entire composition is preferably 0.1% to 10% by mass, and more preferably 1% to 8% by mass in the total solid content.

(6) Guanidine Compound

The composition may further contain a guanidine compound having a structure represented by the following formula.

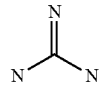

The guanidine compound exhibits strong basicity since the positive charge of the conjugate acid is dispersed and stabilized by the three nitrogen atoms.

For the basicity of the guanidine compound (A) of the present invention, the pKa of a conjugate acid is preferably 6.0 or more, more preferably 7.0 to 20.0 since neutralization reactivity with an acid is high and the roughness properties are excellent, and still more preferably 8.0 to 16.0.

Due to such strong basicity, the diffusibility of an acid is suppressed, and the strong basicity can contribute to formation of an excellent pattern shape.

Moreover, the "pKa" here represents pKa in an aqueous solution, and for example, it is described in Chemical Handbook (II) (Revised 4$^{th}$ Edition, 1993, compiled by the Chemical Society of Japan, Maruzen Co., Ltd.), and a smaller value means higher acidity. Specifically, the pKa in aqueous solution can be obtained by measuring the acid dissociation constant at 25° C. using an infinite-dilution aqueous solution, and a value based on the database of Hammett substituent constants and known literature values can also be determined by calculation using the following software package 1. All of pKa values described in the present specification are values determined by calculation using this software package.

Software package 1: Advanced Chemistry Development (ACD/Labs) Software V 8.14 for Solaris (1994-2007 ACD/Labs).

In the present invention, the log P is a logarithmic value of an n-octanol/water distribution coefficient (P), and with respect to a wide range of compounds, it is an effective parameter that can characterize the hydrophilicity/hydrophobicity. In general, the distribution coefficient is determined not by experiment but by calculation, and in the present invention, the distribution coefficient is a value calculated by a CS Chem Draw Ultra Ver. 8.0 software package (Crippen's fragmentation method).

In addition, the log P of the guanidine compound (A) is preferably 10 or less. When the log P is the above value or less, the guanidine compound (A) can be uniformly contained in a resist film.

The log P of the guanidine compound (A) in the present invention is preferably in a range of 2 to 10, more preferably in a range of 3 to 8, and particularly preferably in a range of 4 to 8.

Furthermore, it is preferable that the guanidine compound (A) in the present invention has no nitrogen atom other than the guanidine structure.

Specific examples of the guanidine compound include the compounds described in paragraphs [0765] to [0768] of JP2013-83966A, but are not limited thereto.

(7) Low Molecular Compound Having Nitrogen Atom and Group Capable of Leaving by Action of Acid The composition of the present invention can include a low molecular compound (hereinafter referred to as a "low molecular compound (D)" or a "compound (D)") which has a nitrogen atom and a group capable of leaving by the action of an acid. The low molecular compound (D) preferably has basicity after the group capable of leaving by the action of an acid leaves.

The group capable of leaving by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having a group capable of leaving by the action of an acid is preferably 100 to 1,000, more preferably 100 to 700, and particularly preferably 100 to 500.

As the compound (D), an amine derivative having a group capable of leaving by the action of an acid on a nitrogen atom is preferable.

The compound (D) may have a carbamate group having a protecting group on a nitrogen atom. The protecting group constituting the carbamate group can be represented by the following General Formula (d-1).

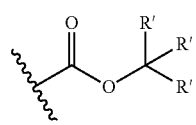

(d-1)

In General Formula (d-1),

R"s each independently represent a hydrogen atom, linear or branched alkyl group, a cycloalkyl group, an aryl group, an aralkyl group, or an alkoxyalkyl group. R"s may be bonded to each other to form a ring.

R' is preferably a linear or branched alkyl group, a cycloalkyl group, or an aryl group, and more preferably a linear or branched alkyl group or a cycloalkyl group.

Specific structures of such a group are shown below.

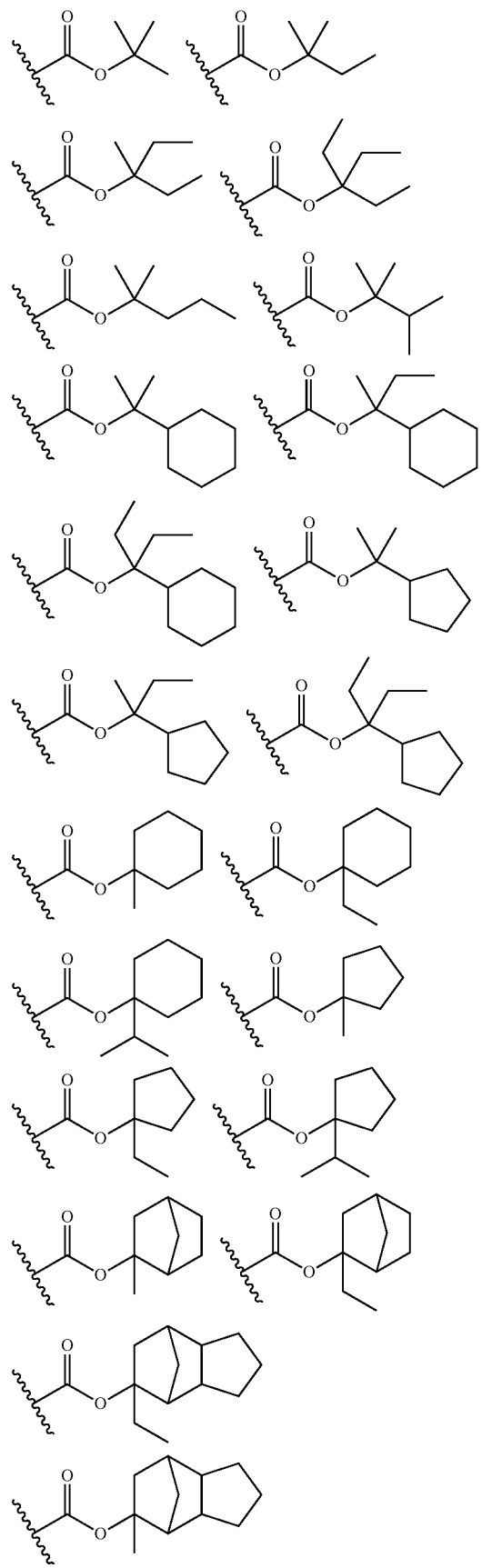

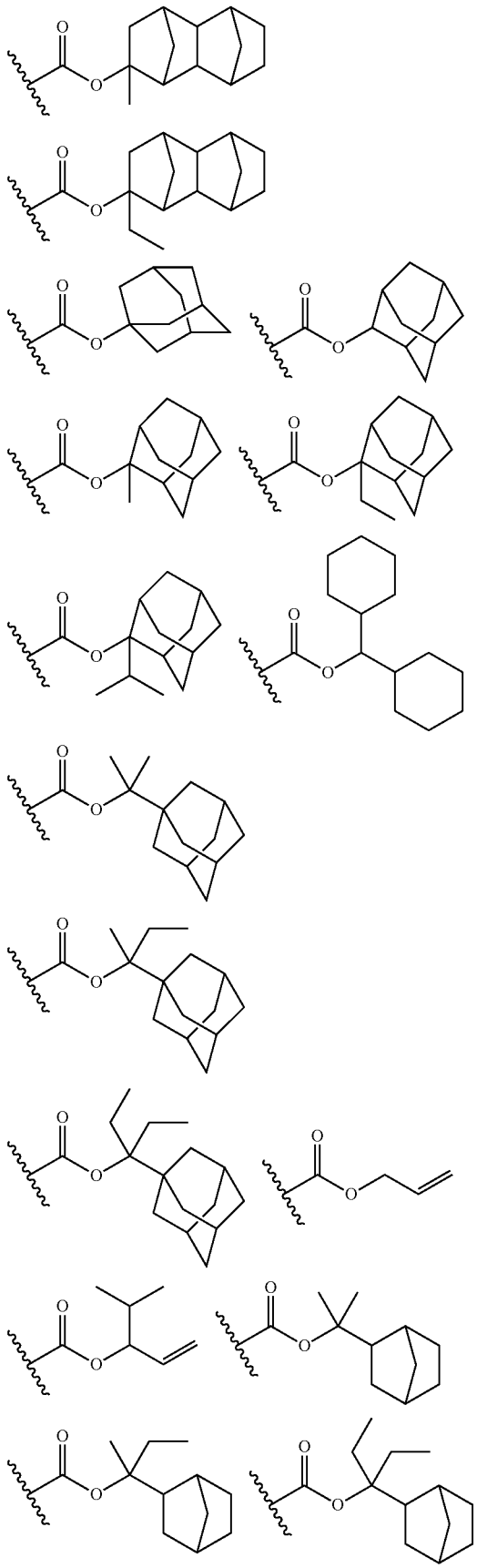
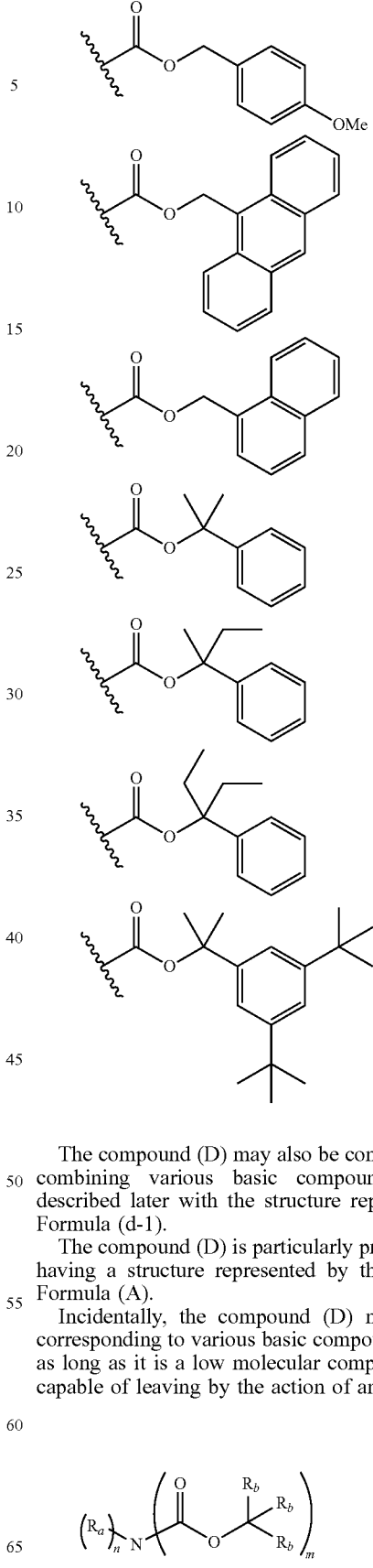

The compound (D) may also be constituted by arbitrarily combining various basic compounds which will be described later with the structure represented by General Formula (d-1).

The compound (D) is particularly preferably a compound having a structure represented by the following General Formula (A).

Incidentally, the compound (D) may be a compound corresponding to various basic compounds described above as long as it is a low molecular compound having a group capable of leaving by the action of an acid.

(A)
$$\left(R_a\right)_n N \left(\begin{array}{c} O \\ \parallel \\ C \\ O \end{array} \begin{array}{c} R_b \\ | \\ C - R_b \\ | \\ R_b \end{array}\right)_m$$

In General Formula (A), $R_a$ represents a hydrogen atom, an alkyl group, a cycloalkyl group, an aryl group, or an aralkyl group. Further, with n=2, two $R_a$'s may be the same as or different from each other, and two $R_a$'s may be bonded to each other to form a divalent heterocyclic hydrocarbon group (preferably having 20 or less carbon atoms) or a derivative thereof.

$R_b$'s each independently represent a hydrogen atom, an alkyl group, a cycloalkyl group, an aryl group, an aralkyl group, or an alkoxyalkyl group, provided that when one or more $R_b$ in —$C(R_b)(R_b)(R_b)$ are hydrogen atoms, at least one of the remaining $R_b$'s is a cyclopropyl group, a 1-alkoxyalkyl group, or an aryl group.

At least two $R_b$'s may be bonded to each other to form an alicyclic hydrocarbon group, an aromatic hydrocarbon group, a hetrocyclic hydrocarbon group, or a derivative thereof.

n represents an integer of 0 to 2, m represents an integer of 1 to 3, and n+m=3.

In General Formula (A), the alkyl group, the cycloalkyl group, the aryl group, and the aralkyl group represented by $R_a$ and $R_b$ may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

Examples of the alkyl group, the cycloalkyl group, the aryl group, and the aralkyl group (each of the alkyl group, the cycloalkyl group, the aryl group, and the aralkyl group may be substituted with the functional group, an alkoxy group, or a halogen atom) of $R_a$ and/or $R_b$ include:

a group derived from a linear or branched alkane, such as methane, ethane, propane, butane, pentane, hexane, heptane, octane, nonane, decane, undecane, and dodecane, or a group in which the group derived from an alkane is substituted with one or more kinds of or one or more groups of cycloalkyl groups such as a cyclobutyl group, a cyclopentyl group, and a cyclohexyl group;

a group derived from a cycloalkane, such as cyclobutane, cyclopentane, cyclohexane, cycloheptane, cyclooctane, norbornane, adamantane, and noradamantane, or a group in which the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from an aromatic compound, such as benzene, naphthalene, and anthracene, or a group in which the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group;

a group derived from a heterocyclic compound, such as pyrrolidine, piperidine, morpholine, tetrahydrofuran, tetrahydropyran, indole, indoline, quinoline, perhydroquinoline, indazole, and benzimidazole, or a group in which the group derived from a heterocyclic compound is substituted with one or more kinds of or one or more groups of linear or branched alkyl groups or aromatic compound-derived groups; a group in which the group derived from a linear or branched alkane or the group derived from a cycloalkane is substituted with one or more kinds of or one or more groups of aromatic compound-derived groups such as a phenyl group, a naphthyl group, and an anthracenyl group; and a group in which the substituent above is substituted with a functional group such as a hydroxyl group, a cyano group, an amino group, a pyrrolidino group, a piperidino group, a morpholino group, and an oxo group.

Examples of the divalent heterocyclic hydrocarbon group (preferably having 1 to 20 carbon atoms) formed by the mutual bonding of $R_a$'s, or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1 S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group in which the group derived from a heterocyclic compound is substituted with one or more kinds of or one or more groups of a linear or branched alkane-derived group, a cycloalkane-derived group, an aromatic compound-derived group, a heterocyclic compound-derived group, and a functional group such as a hydroxyl group, a cyano group, an amino group, a pyrrolidino group, a piperidino group, a morpholino group, and an oxo group.

Specific examples of the particularly preferred compound (D) in the present invention include the compounds described in paragraphs [0786] to [0788] of JP2013-83966A, but the present invention is not limited thereto.

The compound represented by General Formula (A) can be synthesized in accordance with JP2007-298569A, JP2009-199021A, or the like.

In the present invention, the low molecular compound (D) may be used singly or as a mixture of two or more kinds thereof.

Other examples of the basic compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543-553 (1995), or the like can be used.

As the basic compound, a compound called a so-called photodisintegrating base may also be used. Examples of the photodisintegrating base include an onium salt of carboxylic acid, and an onium salt of sulfonium acid having the α-position which is not fluorinated. Specific examples of the photodisintegrating base include those in paragraph 0145 of WO2014/133048A, JP2008-158339A, and JP399146B.

(Content of Basic Compound)

The content of the basic compound in the topcoat composition is preferably 0.01% to 20% by mass, more preferably 0.1% to 10% by mass, and still more preferably 1% to 5% by mass, with respect to the solid content of the topcoat composition.

(Base Generator)

Examples of the base generator (photobase generator) which can be added to the composition of the present invention include compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Furthermore, the compounds described in JP2010-243773A can also be appropriately used.

Specific suitable examples of the photobase generator include 2-nitrobenzyl carbamate, 2,5-dinitrobenzylcyclohexyl carbamate, N-cyclohexyl-4-methylphenylsulfonamide, and 1,1-dimethyl-2-phenylethyl-N-isopropyl carbamate, but are not limited thereto.

(Content of Base Generator)

The content of the base generator in the topcoat composition is preferably 0.01% to 20% by mass, more preferably 0.1% to 10% by mass, and still more preferably 1% to 5% by mass, with respect to the solid content of the topcoat composition.

<(A2) Compound Containing Bond or Group Selected from Group Consisting of Ether Bond, Thioether Bond, Hydroxyl Group, Thiol Group, Carbonyl Bond, and Ester Bond>

A compound (hereinafter also referred to as a "compound (A2)") including at least one group or bond selected from the group consisting of an ether bond, a thioether bond, a hydroxyl group, a thiol group, a carbonyl bond, and an ester bond will be described below.

As described above, the compound (A2) is a compound including at least one group or bond selected from the group consisting of an ether bond, a thioether bond, a hydroxyl group, a thiol group, a carbonyl bond, and an ester bond. Since an oxygen atom or sulfur atom included in these groups or bonds has an unshared electron pair, an acid can be trapped by the interaction with the acid diffused from the active-light-sensitive or radiation-sensitive film.

As mentioned above, the compound (A2) includes at least one group or bond selected from the group consisting of an ether bond, a thioether bond, a hydroxyl group, a thiol group, a carbonyl bond, and an ester bond. In one aspect of the present invention, the compound (A2) preferably has 2 or more groups or bonds selected from the group, more preferably has 3 or more groups or bonds selected from the group, and still more preferably 4 or more groups or bonds selected from the group. In this case, groups or bonds selected from the group consisting of ether bonds, thioether bonds, hydroxyl groups, thiol groups, carbonyl bonds, and ester bonds included in plural numbers in the compound (A2) may be the same as or different from each other.

In one aspect of the present invention, the compound (A2) preferably has a molecular weight of 3,000 or less, more preferably has a molecular weight of 2,500 or less, still more preferably has a molecular weight of 2,000 or less, and particularly preferably has a molecular weight of 1,500 or less.

Furthermore, in one aspect of the present invention, the number of carbon atoms included in the compound (A2) is preferably 8 or more, more preferably 9 or more, and still more preferably 10 or more.

Moreover, in one aspect of the present invention, the number of carbon atoms included in the compound (A2) is preferably 30 or less, more preferably 20 or less, and still more preferably 15 or less.

Furthermore, in one aspect of the present invention, the compound (A2) is preferably a compound having a boiling point of 200° C. or higher, more preferably a compound having a boiling point of 220° C. or higher, and still more preferably a compound having a boiling point of 240° C. or higher.

Moreover, in one aspect of the present invention, the compound (A2) is preferably a compound having an ether bond, more preferably a compound having 2 or more ether bonds, still more preferably a compound having 3 or more ether bonds, and particularly preferably a compound having 4 or more ether bonds.

In one aspect of the present invention, the compound (A2) is still more preferably a compound having repeating units containing an oxyalkylene structure represented by the following General Formula (1).

  (1)

In the formula, $R_{11}$ represents an alkylene group which may have a substituent, n represents an integer of 2 or more, and

* represents a bonding arm.

The number of carbon atoms of the alkylene group represented by $R_{11}$ in General Formula (1) is not particularly limited, but is preferably 1 to 15, more preferably 1 to 5, still more preferably 2 or 3, and particularly preferably 2. In a case where this alkylene group has a substituent, the substituent is not particularly limited, but is preferably, for example, an alkyl group (preferably having 1 to 10 carbon atoms).

n is preferably an integer of 2 to 20, among which an integer of 10 or less is more preferable due to an increase in DOF.

The average value of n's is preferably 20 or less, more preferably 2 to 10, still more preferably 2 to 8, and particularly preferably 4 to 6 due to an increase in DOF. Here, "the average value of n's" means the value of n determined when the weight-average molecular weight of the compound (A2) is measured by GPC, and the obtained weight-average molecular weight is allowed to match the general formula. In a case where n is not an integer, it is a value rounded off to the nearest integer of the specified numerical value.

$R_{11}$ which are present in plural numbers may be the same as or different from each other.

Furthermore, a compound having a partial structure represented by General Formula (1) is preferably a compound represented by the following General Formula (1-1) due to an increase in DOF.

  (1-1)

In the formula, the definition, specific examples, and suitable aspects of $R_{11}$ are the same as those of $R_{11}$ in General Formula (1) as described above, respectively.

$R_{12}$ and $R_{13}$ each independently represent a hydrogen atom or an alkyl group. The number of carbon atoms of the alkyl group is not particularly limited, but is preferably 1 to 15. $R_{12}$ and $R_{13}$ may be bonded to each other to form a ring.

m represents an integer of 1 or more. m is preferably an integer of 1 to 20, and above all, is more preferably an integer of 10 or less due to an increase in DOF.

The average value of m's is preferably 20 or less, more preferably 1 to 10, still more preferably 1 to 8, and particularly preferably 4 to 6 due to an increase in DOF Here, "the average value of m's" has the same definition as the "average value of n's" as described above.

In a case where m is 2 or more, $R_{11}$'s present in plural numbers may be the same as or different from each other.

In one aspect of the present invention, the compound having a partial structure represented by General Formula (1) is preferably alkylene glycol including at least two ether bonds.

The compound (A2) may be used as a commercially available product or may be synthesized according to a known method.

Specific examples of the compound (A2) are shown below but the present invention is not limited thereto.

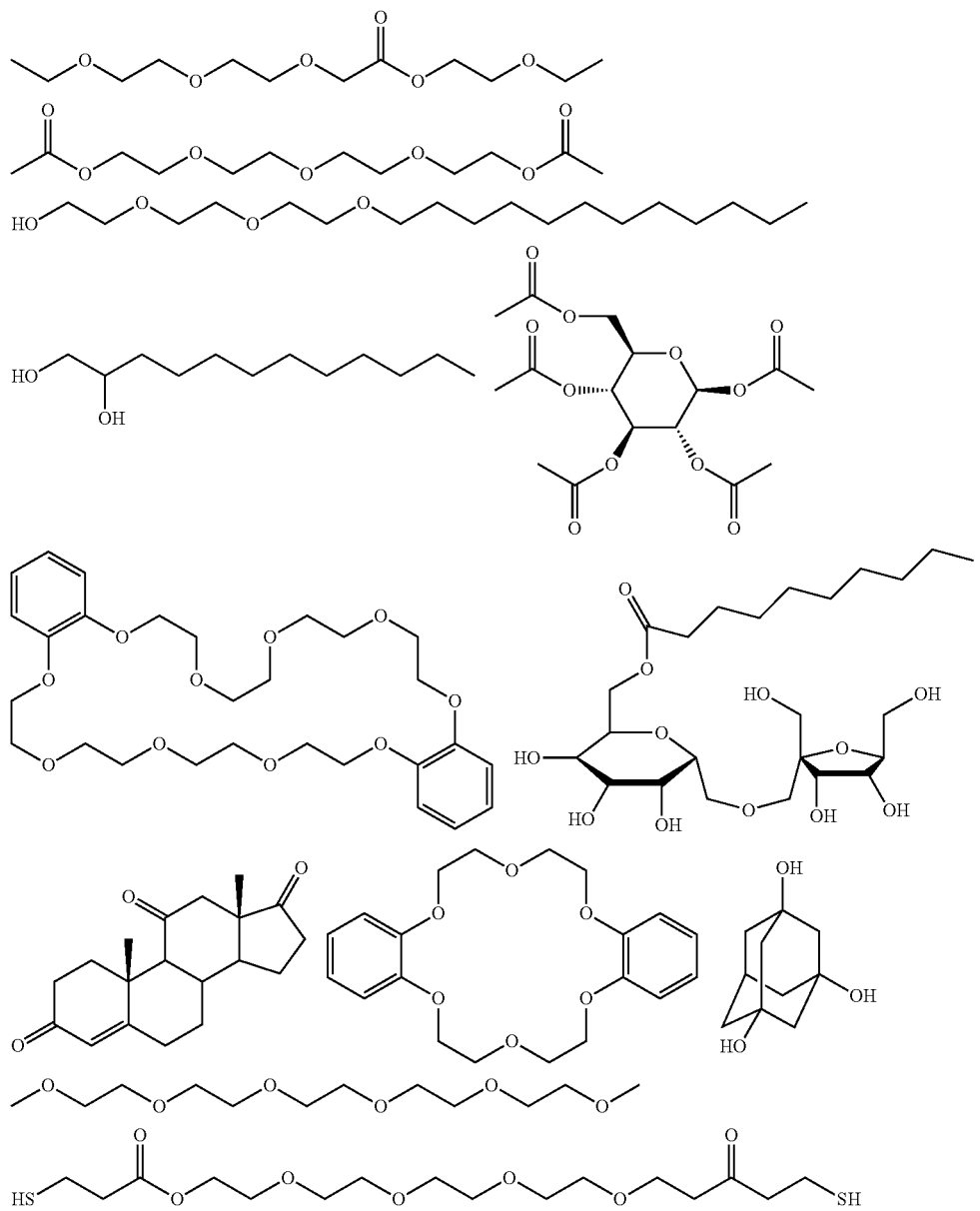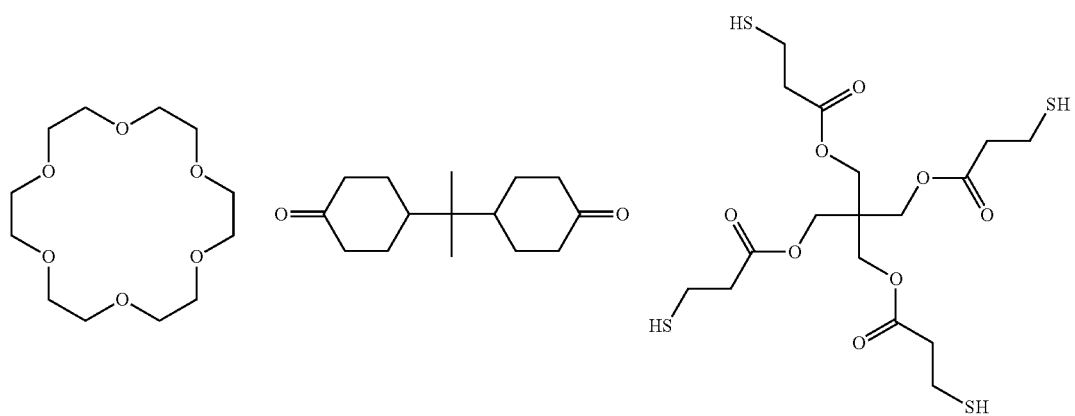

-continued

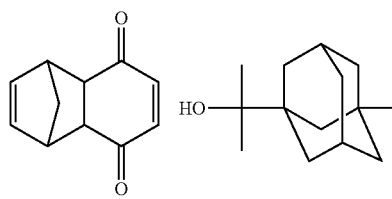

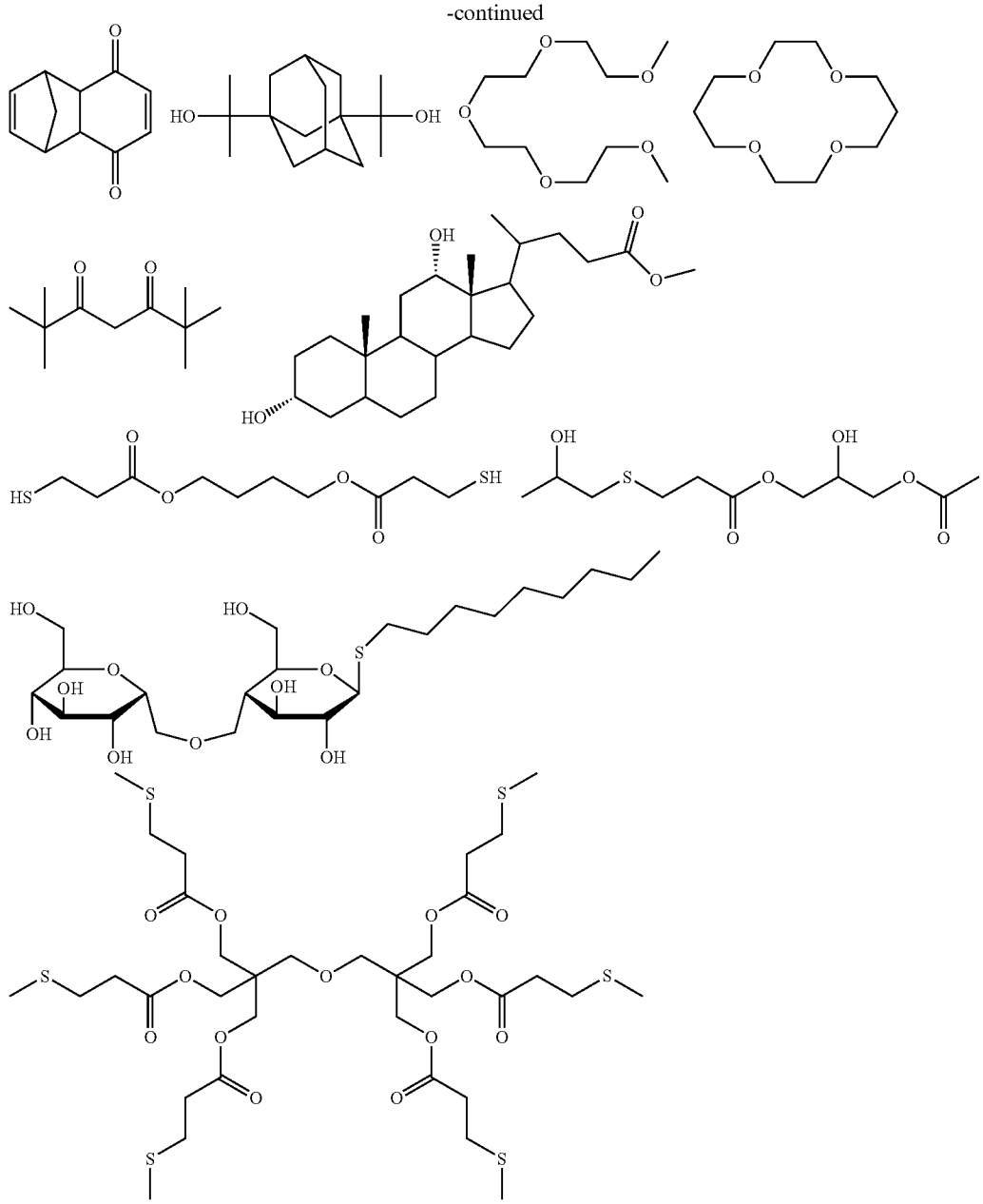

The content of the compound (A2) is preferably 0.1% to 30% by mass, more preferably 1% to 25% by mass, still more preferably 2% to 20% by mass, and particularly preferably 3% to 18% by mass, with respect to the total solid content in the upper layer film.

<Surfactant>

The topcoat composition of the present invention may further include a surfactant.

The surfactant is not particularly limited, and any of an anionic surfactant, a cationic surfactant, and a nonionic surfactant can be used as long as it can form a topcoat composition uniformly, and further, be dissolved in the solvent of the topcoat composition.

The amount of the surfactant to be added is preferably 0.001% to 20% by mass, and more preferably 0.01% to 10% by mass.

The surfactant may be used singly or in combination of two or more kinds thereof.

As the surfactant, for example, one selected from an alkyl cation-based surfactant, an amide type quaternary cation-based surfactant, an ester type quaternary a cation-based surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine- and/or silicon-based surfactant (a fluorine-based surfactant, a silicon-based surfactant, or a surfactant having both of a fluorine atom and a silicon atom) can be appropriately used.

Specific examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether, polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, or the like; and commercially available surfactants mentioned later.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); SURFLON S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA Solutions Inc.); and FTX-204G, 208G, 218G, 230G, 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

<Method for Preparing Topcoat Composition>

It is preferable that the topcoat composition of the present invention is used by dissolving the respective components described above in a solvent, and filtering the solution through a filter. The filter is preferably a polytetrafluoroethylene-, polyethylene-, or nylon-made filter having a pore size of 0.1 µm or less, more preferably 0.05 µm or less, and still more preferably 0.03 µm or less. Further, the filter may be used by connecting a plurality of kinds of filters in series or in parallel. In addition, the composition may be filtered a plurality of times, and the step of performing filtration a plurality of times may be a circular filtration step. Furthermore, the composition may be subjected to a deaeration treatment or the like before and after filtration through a filter. It is preferable that the topcoat composition of the present invention includes no impurities such as a metal. The content of the metal components included in the these materials is preferably 10 ppm or less, more preferably 5 ppm or less, still more preferably 1 ppm or less, and particularly preferably, metal components are not substantially contained (no higher than the detection limit of a measurement device).

[Resist Pattern]

The present invention also relates to a resist pattern formed by the pattern forming method of the present invention as described above.

[Method for Manufacturing Electronic Device, and Electronic Device]

Moreover, the present invention also relates to a method for manufacturing an electronic device, including the pattern forming method of the present invention as described above, and an electronic device manufactured by this manufacturing method.

The electronic device of the present invention is suitably mounted in electrical or electronic equipments (household electronic appliance, OA/media-related equipment, optical equipment, telecommunication equipment, and the like).

EXAMPLES

Hereinafter, the present invention will be described with reference to Examples, but the contents of the present invention are not limited thereto.

Synthesis Example 1: Synthesis of Resin (1)

102.3 parts by mass of cyclohexanone was heated at 80° C. under a nitrogen stream. While stirring this liquid, a mixed solution of 22.2 parts by mass of a monomer represented by the following Structural Formula LM-1, 22.8 parts by mass of a monomer represented by the following Structural Formula PM-1, 6.6 parts by mass of a monomer represented by the following Structural Formula PM-9, 189.9 parts by mass of cyclohexanone, and 2.40 parts by mass of dimethyl 2,2'-azobisisobutyrate [V-601, manufactured by Wako Pure Chemical Industries, Ltd.] was added dropwise to the liquid for 5 hours. After completion of the dropwise addition, the mixture was further stirred at 80° C. for 2 hours. After being left to be cooled, the reaction liquid was reprecipitated with a large amount of hexane/ethyl acetate (mass ratio of 9:1) and filtered, and the obtained solid was dried in vacuum to obtain 41.1 parts by mass of a resin (1).

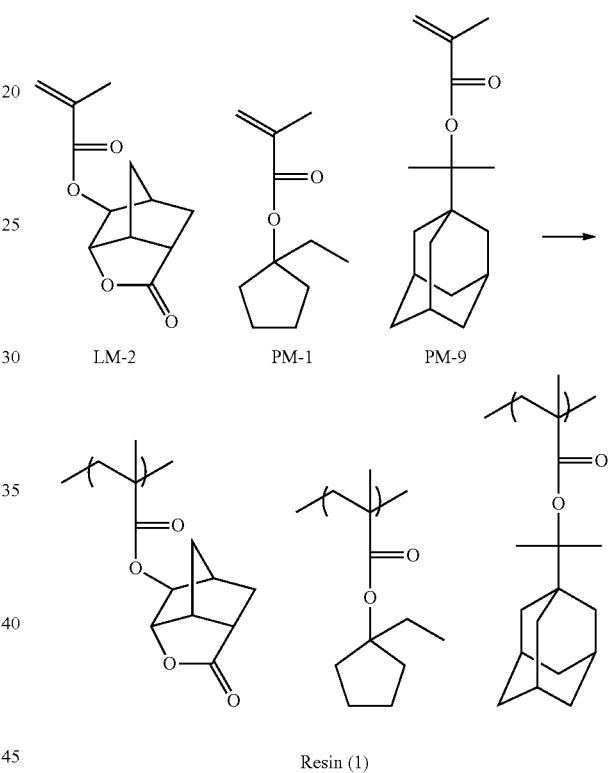

The weight-average molecular weight (Mw: in terms of polystyrene) of the obtained resin (1), as determined by GPC (carrier: tetrahydrofuran (THF)), was Mw=9,500, and the dispersity was Mw/Mn=1.62. The compositional ratio measured by $^{13}$C-nuclear magnetic resonance (NMR) was 40/50/10 in terms of a molar ratio.

Synthesis Example 2: Synthesis of Resins (2) to (12)

By carrying out the same operation as in Synthesis Example 1, the resins (2) to (12) described below were synthesized as an acid-decomposable resin.

Hereinbelow, the compositional ratios (molar ratios; corresponding to the repeating units in order from the left side), the weight-average molecular weights (Mw), and the dispersities (Mw/Mn) of the respective repeating units in the resins (1) to (12) are summarized in Table 1. These were determined by the same methods as for the resin (1) as described above.

TABLE 1
|  | Repeating unit | | | | Compositional ratio (molar raio) | | | | Molecular weight (Mw) | Dispersity (Mw/Mn) |
|---|---|---|---|---|---|---|---|---|---|---|
| Resin (1)  | LM-2 | PM-1  | PM-9  | —    | 40 | 50 | 10 | —  |  9,500 | 1.62 |
| Resin (2)  | LM-2 | PM-12 | PM-13 | —    | 40 | 40 | 20 | —  | 17,000 | 1.70 |
| Resin (3)  | LM-4 | IM-2  | PM-2  | —    | 45 |  5 | 50 | —  | 11,000 | 1.63 |
| Resin (4)  | LM-2 | PM-10 | —     | —    | 40 | 60 | —  | —  | 15,000 | 1.66 |
| Resin (5)  | LM-2 | PM-3  | PM-9  | IM-3 | 40 | 40 | 10 | 10 | 10,500 | 1.62 |
| Resin (6)  | LM-6 | PM-10 | IM-4  | —    | 40 | 50 | 10 | —  | 15,500 | 1.68 |
| Resin (7)  | LM-2 | PM-15 | —     | —    | 40 | 60 | —  | —  | 11,000 | 1.65 |
| Resin (8)  | LM-7 | PM-3  | PM-10 | —    | 40 | 40 | 20 | —  | 10,000 | 1.64 |
| Resin (9)  | LM-7 | PM-12 | PM-15 | —    | 40 | 50 | 10 | —  |  9,000 | 1.60 |
| Resin (10) | LM-7 | PM-13 | —     | —    | 40 | 60 | —  | —  | 10,000 | 1.61 |
| Resin (11) | LM-7 | PM-12 | PM-9  | IM-3 | 40 | 40 | 10 | 10 |  8,500 | 1.60 |
| Resin (12) | LM-7 | PM-12 | PM-14 | —    | 40 | 40 | 20 | —  |  9,500 | 1.61 |
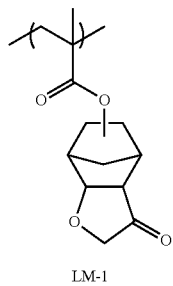
LM-1
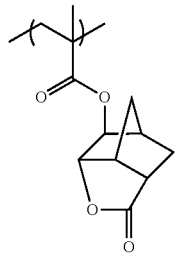
LM-2
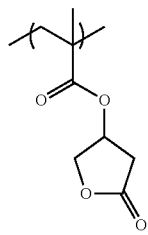
LM-3
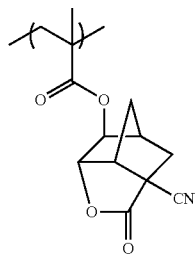
LM-4

TABLE 1-continued
| | Repeating unit | Compositional ratio (molar raio) | Molecular weight (Mw) | Dispersity (Mw/Mn) |
| --- | --- | --- | --- | --- |
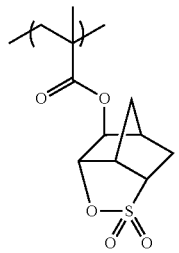
LM-5
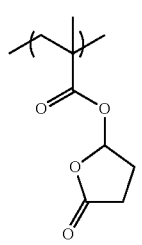
LM-6
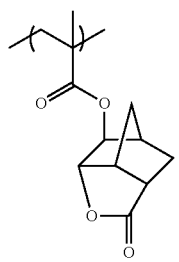
LM-7
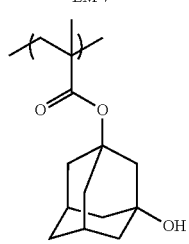
IM-1
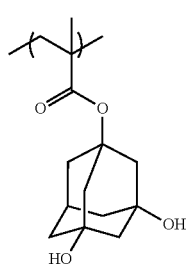
IM-2

TABLE 1-continued
| Repeating unit | Compositional ratio (molar raio) | Molecular weight (Mw) | Dispersity (Mw/Mn) |
| --- | --- | --- | --- |
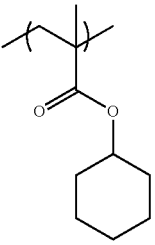
IM-3
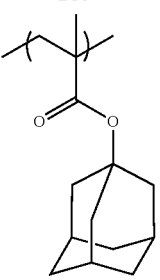
IM-4
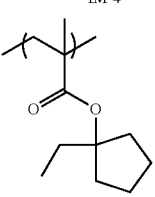
PM-1
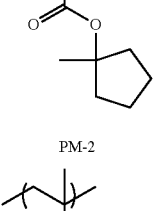
PM-2
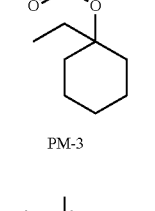
PM-3
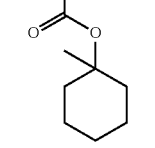
PM-4

TABLE 1-continued
|  | Repeating unit | Compositional ratio (molar raio) | Molecular weight (Mw) | Dispersity (Mw/Mn) |
| --- | --- | --- | --- | --- |
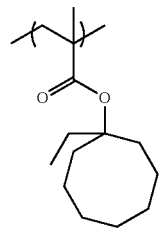
PM-5
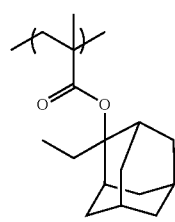
PM-6
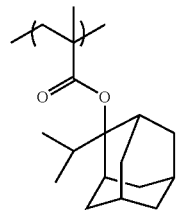
PM-7
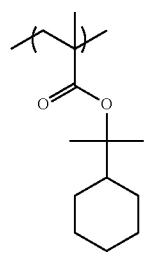
PM-8
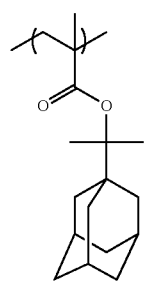
PM-9

TABLE 1-continued

|  | Repeating unit | Compositional ratio (molar raio) | Molecular weight (Mw) | Dispersity (Mw/Mn) |
| --- | --- | --- | --- | --- |

PM-10

PM-11

PM-12

PM-13

PM-14

PM-15

<Preparation of Resist Composition>

The components shown in Table 2 below were dissolved in the solvents shown in Table 2 below to prepare solutions having a concentration of the solid content of 3.5% by mass, and the solutions were filtered through a polyethylene filter having a pore size of 0.03 Lm to obtain resist compositions Re-1 to Re-13.

TABLE 2

|  | Resin | (parts by mass) | Acid generator | (parts by mass) | Hydrophobic resin | (parts by mass) | Basic compound | (parts by mass) | Solvent (mass ratio) | | (mass ratio) | | (mass ratio) | |
|---|---|---|---|---|---|---|---|---|---|---|---|---|---|---|
| Re-1 | Resin (1) | 85.0 | A1 | 12.0 | B-1 | 1.5 | D-1 | 1.5 | SL-1 | 70 | SL-2 | 30 | | |
| Re-2 | Resin (2) | 88.0 | A2 | 10.0 | B-2 | 0.7 | D-1 | 1.3 | SL-1 | 95 | SL-4 | 5 | | |
| Re-3 | Resin (3) | 85.0 | A3 | 9.5 | B-3 | 1.0 | D-1 | 4.5 | SL-1 | 60 | SL-2 | 40 | | |
| Re-4 | Resin (4) | 81.0 | A4 | 15.5 | B-5 | 1.7 | D-3 | 1.8 | SL-1 | 60 | SL-3 | 40 | | |
| Re-5 | Resin (5) | 85.0 | A5 | 13.5 | B-6 | 0.7 | D-4 | 0.8 | SL-1 | 90 | SL-3 | 10 | | |
| Re-6 | Resin (6) | 87.0 | A6 | 10.5 | B-7 | 1.2 | D-5 | 1.3 | SL-2 | 100 | | | | |
| Re-7 | Resin (7) | 87.0 | A7 | 11.0 | B-8 | 0.8 | D-6 | 1.2 | SL-1 | 90 | SL-2 | 5 | SL-4 | 5 |
| Re-8 | Resin (8) | 81.0 | A8 | 10.5 | B-1/B-5 | 1.0/1.5 | D-2 | 6.0 | SL-1 | 80 | SL-2 | 20 | | |
| Re-9 | Resin (9) | 87.0 | A2/A5 | 4.0/5.0 | B-4 | 0.5 | D-1 | 3.5 | SL-1 | 75 | SL-2 | 25 | | |
| Re-10 | Resin (10) | 84.0 | A1 | 14.5 | B-1 | 0.5 | D-1 | 1.0 | SL-1 | 70 | SL-2 | 20 | SL-4 | 10 |
| Re-11 | Resin (11) | 85.0 | A2 | 12.5 | B-2 | 1.1 | D-5 | 1.4 | SL-1 | 100 | | | | |
| Re-12 | Resin (1)/resin (12) | 40.0/40.0 | A3 | 16.0 | B-1 | 3.1 | D-1 | 0.9 | SL-1 | 80 | SL-3 | 20 | | |
| Re-13 | Resin (1) | 86.5 | A1 | 12.0 | | | D-1 | 1.5 | SL-1 | 70 | SL-2 | 30 | | |

The abbreviations in Table 2 are shown below.

<Photoacid Generator>

Furthermore, n-Bu represents an n-butyl group.

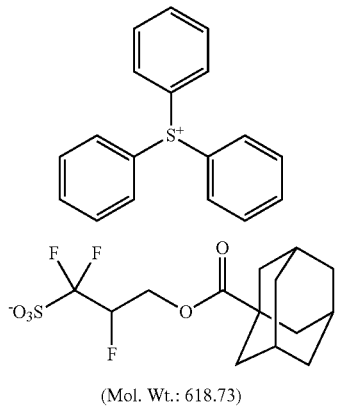

(Mol. Wt.: 618.73)

A1

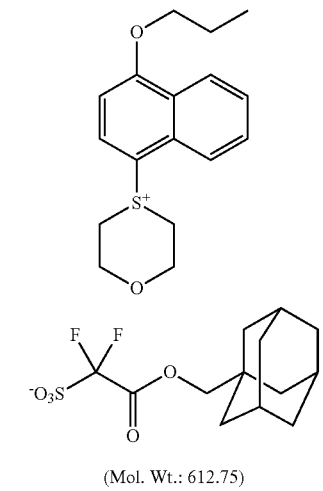

(Mol. Wt.: 612.75)

A3

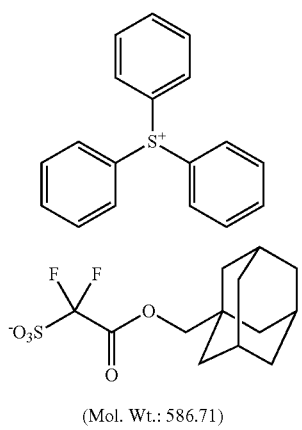

(Mol. Wt.: 586.71)

A2

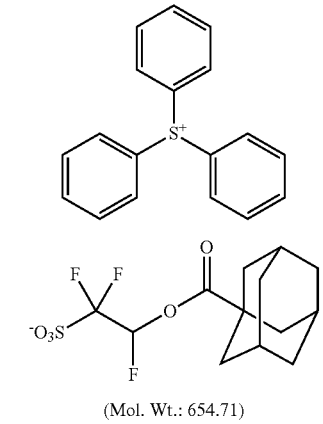

(Mol. Wt.: 654.71)

A4

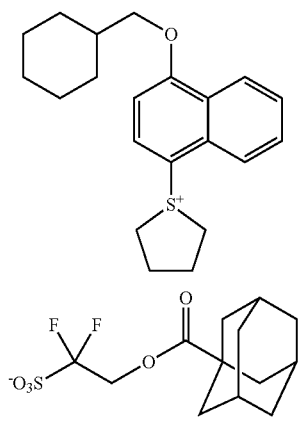
(Mol. Wt.: 650.84)
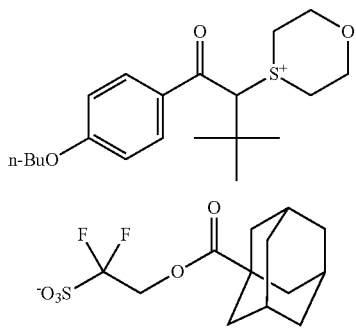
(Mol. Wt.: 674.86)
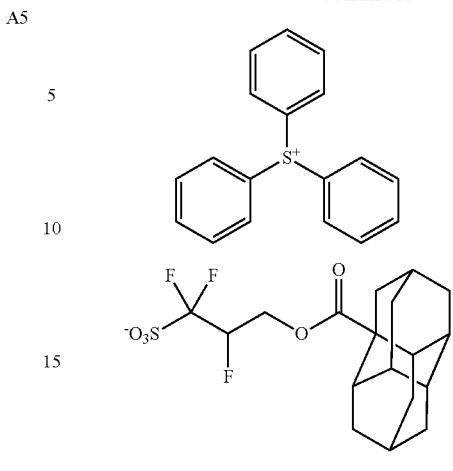
(Mol. Wt.: 670.80)
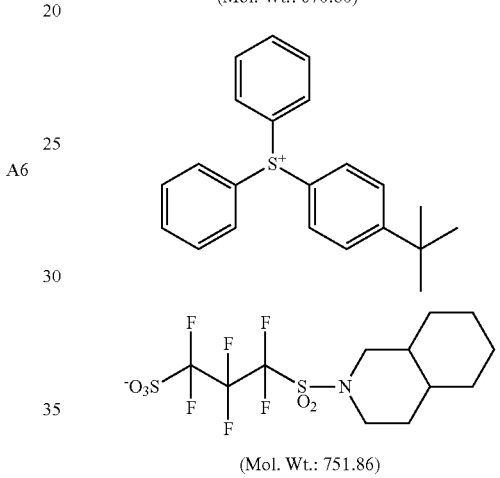
(Mol. Wt.: 751.86)
<Hydrophobic Resin>
As the hydrophobic resin, the resins (B-1) to (B-8) shown in Table 3 were used.
TABLE 3
| Resin | Repeating unit | | | | Compositional ratio (molar ratio) | | | | Molecular weight (Mw) | Dispersity (Mw/Mn) |
|---|---|---|---|---|---|---|---|---|---|---|
| B-1 | AM-4 | | | | 100 | | | | 12,500 | 1.58 |
| B-2 | AM-1 | AM-2 | | | 60 | 40 | | | 20,000 | 1.60 |
| B-3 | AM-2 | AM-7 | AM-8 | | 80 | 15 | 5 | | 13,000 | 1.57 |
| B-4 | AM-5 | AM-6 | BM-2 | | 70 | 20 | 10 | | 15,000 | 1.50 |
| B-5 | FM-1 | BM-1 | AM-8 | AM-3 | 40 | 50 | 5 | 5 | 8,000 | 1.52 |
| B-6 | AM-1 | AM-2 | FM-3 | | 50 | 40 | 10 | | 26,000 | 1.56 |
| B-7 | FM-4 | BM-1 | AM-3 | | 90 | 5 | 5 | | 13,000 | 1.53 |
| B-8 | FM-2 | AM-5 | BM-3 | | 50 | 25 | 25 | | 11,000 | 1.55 |
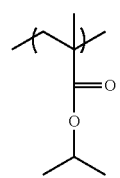
AM-1

TABLE 3-continued

| Resin | Repeating unit | Compositional ratio (molar ratio) | Molecular weight (Mw) | Dispersity (Mw/Mn) |
|---|---|---|---|---|
| AM-2 | | | | |
| AM-3 | | | | |
| AM-4 | | | | |
| AM-5 | | | | |
| AM-6 | | | | |

TABLE 3-continued

| Resin | Repeating unit | Compositional ratio (molar ratio) | Molecular weight (Mw) | Dispersity (Mw/Mn) |
|---|---|---|---|---|
| AM-7 | | | | |
| AM-8 | | | | |
| BM-1 | | | | |
| BM-2 | | | | |
| BM-3 | | | | |
| FM-1 | | | | |
| FM-2 | | | | |

TABLE 3-continued
| Resin | Repeating unit | Compositional ratio (molar ratio) | Molecular weight (Mw) | Dispersity (Mw/Mn) |
|---|---|---|---|---|
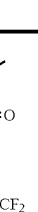
<Basic Compound>
D-1
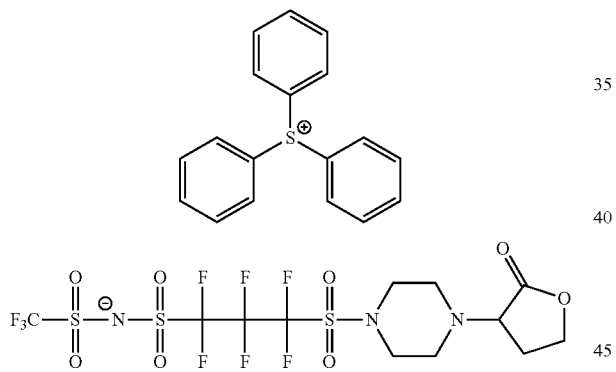
D-2
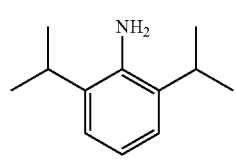
D-3
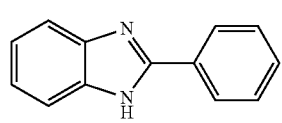
-continued
D-4
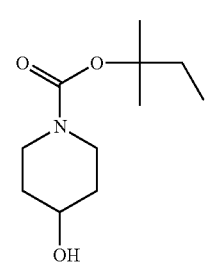
D-5
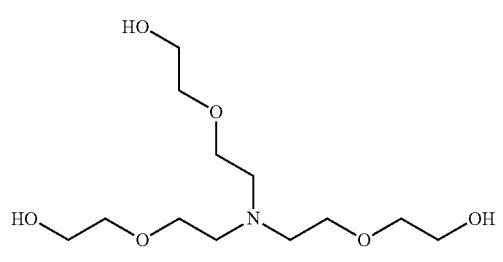
D-6
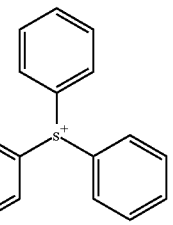
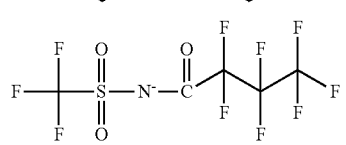

<Solvent>

SL-1: Propylene glycol monomethyl ether acetate (PGMEA)

SL-2: Cyclohexanone

SL-3: Propylene glycol monomethyl ether (PGME)

SL-4: γ-Butyrolactone

Synthesis Example 3: Synthesis of Resins (X1) to (X6)

The same procedure as in Synthesis Example 1 was carried out to synthesize resins (X1) to (X6) described below, which are included in the topcoat composition. The structures of the resins (X1) to (X6) were shown below.

(X1)
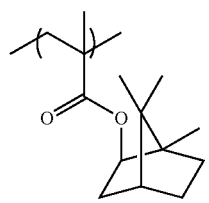
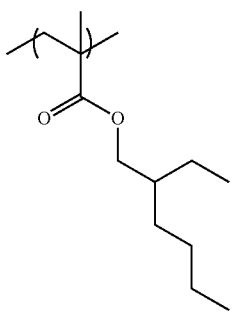

(X2)
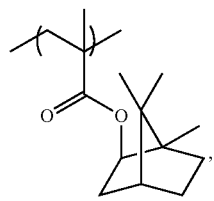

(X3)
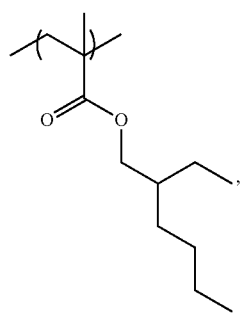

(X4)
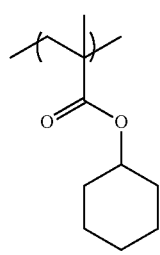

(X5)
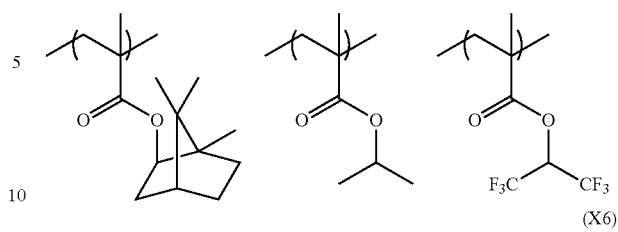

(X6)
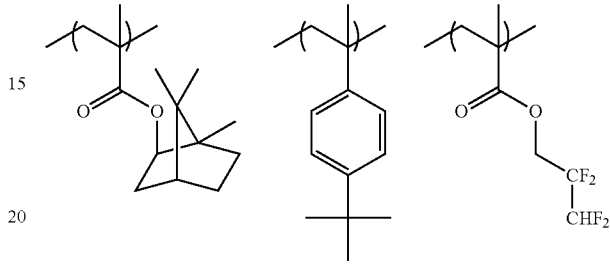

The compositional ratios (molar ratios; corresponding to the repeating units in order from the left side), the weight-average molecular weights (Mw), and the dispersities (Mw/Mn) of the respective repeating units in the resins (X1) to (X6) are summarized in Table 4 below. These were determined by the same methods as for the resin (1) as described above.

[Table 4]

TABLE 4

|  | Compositional ratio (molar ratio) |  |  | Mw | Mw/Mn |
|---|---|---|---|---|---|
| Resin (X1) | 60 | 40 | — | 15,000 | 1.7 |
| Resin (X2) | 60 | 30 | 10 | 17,000 | 1.9 |
| Resin (X3) | 60 | 30 | 10 | 16,500 | 1.5 |
| Resin (X4) | 60 | 30 | 10 | 20,500 | 1.5 |
| Resin (X5) | 60 | 30 | 10 | 19,000 | 1.7 |
| Resin (X6) | 60 | 30 | 10 | 15,000 | 1.5 |

<Preparation of Topcoat Composition>

The components shown in Table 5 below were dissolved in the solvents shown in Table 5 below to prepare solutions having a concentration of the solid content of 2.7% by mass, and the solutions were filtered through a polyethylene filter having a pore size of 0.03 μm to obtain topcoat compositions A-1 to A-11.

TABLE 5

|  |  | Additive | | |
|---|---|---|---|---|
|  | Resin (mass ratio) | Type | Addition amount (with respect to solid content) [% by mass] | Solvent |
| A-1 | X1 | — | — | 4-Methyl-2-pentanol |
| A-2 | X1 | AD-1 | 2.0 | 4-Methyl-2-pentanol |
| A-3 | X1 | AD-2 | 2.5 | 4-Methyl-2-pentanol |
| A-4 | X1 | AD-3 | 2.0 | 4-Methyl-2-pentanol |
| A-5 | X1 | AD-4 | 4.0 | 4-Methyl-2-pentanol |
| A-6 | X2 | AD-1 | 2.0 | 4-Methyl-2-pentanol |
| A-7 | X3 | AD-1 | 3.0 | 4-Methyl-2-pentanol |
| A-8 | X4 | AD-1 | 2.0 | 4-Methyl-2-pentanol |
| A-9 | X5 | AD-1 | 2.5 | 4-Methyl-2-pentanol |

TABLE 5-continued

|  | Resin (mass ratio) | Additive Type | Addition amount (with respect to solid content) [% by mass] | Solvent |
|---|---|---|---|---|
| A-10 | X6 | AD-1 | 2.0 | 1-Butanol |
| A-11 | X1/X6 (50/50) | AD-3/AD-1 | 8.0/1.0 | 4-Methyl-2-pentanol |

The abbvreviations in Table 5 are shown below.
<Additives>

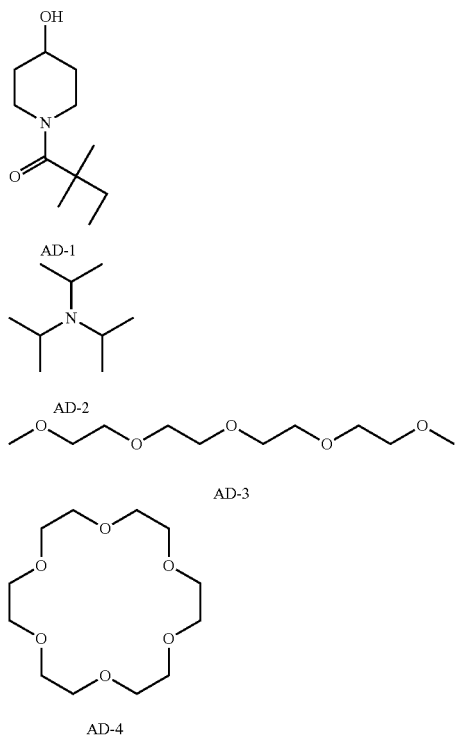

AD-1

AD-2

AD-3

AD-4

Examples 1 to 16 and Comparative Examples 1 and 2

Using the prepared resist compositions and topcoat compositions, resist patterns were formed and evaluated by the following methods.

(Formation of Hole Pattern)

An organic antireflection film ARC29SR (manufactured by Brewer Science, Inc.) was coated on a silicon wafer, and baking was carried out at 205° C. for 60 seconds to form an antireflection film having a film thickness of 86 nm. A resist composition shown in Table 6 below was coated thereon, and baking was carried out at 100° C. for 60 seconds, to form a resist film having a film thickness of 90 nm.

Next, the topcoat composition shown in Table 6 below was coated on the resist film, and then baking was carried out at the PB temperature (unit: ° C.) shown in Table 6 below for 60 seconds to form an upper layer film having a film thickness of 90 nm (however, in Comparative Example 1, the upper layer film was not formed).

Subsequently, the resist film having the upper layer film formed thereon (in Comparative Example 1, the resist film having the upper layer film not formed thereon) was subjected to pattern exposure via a squarely arrayed halftone mask with hole portions of 65 n and pitches between holes of 100 nm (the hole portions were shielded), using an ArF excimer laser liquid immersion scanner (manufactured by ASML; XT1700i, NA1.20, C-Quad, outer sigma 0.730, inner sigma 0.630, and XY inclination). Ultrapure water was used as the immersion liquid. Thereafter, heating (Post Exposure Bake: PEB) was carried out at 105° C. for 60 seconds. Then, development was carried out by paddling for 30 seconds using an organic solvent-based developer (organic developer) described in Table 6 below, and rinsing was carried out by paddling for 30 seconds using a rinsing liquid described in Table 6 below. Subsequently, a hole pattern with a hole diameter of 50 nm was obtained by rotating the wafer at a rotation speed of 2,000 rpm for 30 seconds.

(Depth of Focus (DOF))

In the exposure dose for forming a hole pattern with a hole diameter of 50 nm under the exposure and development conditions in (Formation of Hole Pattern) above, exposure and development were carried out by changing the conditions of the exposure focus at a unit of 20 nm in the focus direction. The hole diameter (CD) of each of the obtained patterns was measured using a line-width critical dimension scanning electron microscope SEM (S-9380, Hitachi, Ltd.), and the minimum value or the maximum value in a curve obtained by plotting the respective CDs was defined as a best focus. When the focus was changed at a center of the best focus, a variation width of the focus with which a line width of 50 nm±10% was available, that is, depth of focus (DOF, unit: nm) was calculated. A larger value thereof indicates better performance. The results are shown in Table 6 below.

(Exposure Latitude (EL))

The hole size was observed using a critical dimension scanning electron microscope SEM (S-938011, Hitachi, Ltd.), and the optimal exposure dose at which a contact hole pattern having an average hole portion of 50 nm was resolved was defined as a sensitivity ($E_{opt}$) (mJ/cm$^2$). Then, based on the determined optimal exposure dose ($E_{opt}$), the exposure dose when the hole size became ±10% of 50 nm (that is, 45 nm and 55 nm) which were target values was determined. Then, the exposure latitude (EL, unit: %) defined by the following equation was calculated. As the value of EL was increased, the change in performance due to a change in the exposure dose was decreased, which is thus good. The results are shown in Table 6.

[EL (%)]=[(Exposure dose when a hole portion becomes 45 nm)−(Exposure dose when a hole portion becomes 55 nm)]/$E_{opt}$×100

TABLE 6

|  | Resist composition | Topcoat composition | PB temperature [° C.] | Organic developer | Rinsing liquid | DOF [nm] | EL [%] |
|---|---|---|---|---|---|---|---|
| Example 1 | Re-1 | A-1 | 90 | Butyl acetate | 4-Methyl-2-heptanol | 100 | 15 |
| Example 2 | Re-2 | A-2 | 100 | Butyl acetate | 4-Methyl-2-heptanol | 110 | 19 |
| Example 3 | Re-3 | A-3 | 100 | Butyl acetate | 4-Methyl-2-heptanol | 115 | 18 |
| Example 4 | Re-4 | A-4 | 95 | Butyl acetate | 4-Methyl-2-heptanol | 105 | 17 |

TABLE 6-continued

|  | Resist composition | Topcoat composition | PB temperature [° C.] | Organic developer | Rinsing liquid | DOF [nm] | EL [%] |
|---|---|---|---|---|---|---|---|
| Example 5 | Re-5 | A-5 | 100 | 2-Heptanone | 4-Methyl-2-heptanol | 110 | 17 |
| Example 6 | Re-6 | A-6 | 100 | Butyl acetate | 4-Methyl-2-heptanol | 115 | 17 |
| Example 7 | Re-7 | A-7 | 90 | Butyl acetate | 4-Methyl-2-heptanol | 105 | 16 |
| Example 8 | Re-8 | A-8 | 90 | Butyl acetate | 4-Methyl-2-heptanol | 110 | 15 |
| Example 9 | Re-9 | A-9 | 90 | 2-Heptanone | 4-Methyl-2-heptanol | 105 | 16 |
| Example 10 | Re-10 | A-10 | 100 | Butyl propionate | n-Decane | 110 | 17 |
| Example 11 | Re-11 | A-11 | 100 | Butyl acetate | n-Decane | 120 | 17 |
| Example 12 | Re-12 | A-2 | 100 | Butyl acetate | n-Decane | 115 | 18 |
| Example 13 | Re-1 | A-2 | 100 | Butyl acetate | 4-Methyl-2-heptanol | 120 | 17 |
| Example 14 | Re-1 | A-2 | 110 | Butyl acetate | 4-Methyl-2-heptanol | 120 | 18 |
| Example 15 | Re-1 | A-2 | 120 | Butyl acetate | 4-Methyl-2-heptanol | 125 | 18 |
| Example 16 | Re-1 | A-2 | 130 | Butyl acetate | 4-Methyl-2-heptanol | 130 | 20 |
| Comparative Example 1 | Re-1 |  | 90 | Butyl acetate | 4-Methyl-2-heptanol | 45 | 9 |
| Comparative Example 2 | Re-13 | A-2 | 90 | Butyl acetate | 4-Methyl-2-heptanol | 50 | 12 |

As apparent from the results shown in Table 6, the patterns (Examples 1 to 16) formed by the pattern forming method of the present invention, DOF and EL are excellent.

What is claimed is:

1. A pattern forming method comprising:
a step a of coating an active-light-sensitive or radiation-sensitive resin composition onto a substrate to form a resist film;
a step b of coating a composition for forming an upper layer film onto the resist film to form an upper layer film on the resist film;
a step c of exposing the resist film having the upper layer film formed thereon; and
a step d of developing the exposed resist film using a developer to form a pattern,
wherein the active-light-sensitive or radiation-sensitive resin composition contains a hydrophobic resin, and
a content of the hydrophobic resin is 0.1% to 7% by mass with respect to the total solid content of the active-light-sensitive or radiation-sensitive resin composition.

2. The pattern forming method according to claim 1, wherein the hydrophobic resin contains at least one selected from the group consisting of a fluorine atom, a silicon atom, and a $CH_3$ partial structure contained in the side chain moiety of the resin.

3. The pattern forming method according to claim 2, wherein the hydrophobic resin includes a resin containing 0% to 20% by mole of fluorine atom-containing repeating units with respect to all the repeating units.

4. The pattern forming method according to claim 2, wherein the composition for forming an upper layer film contains a resin including 0% to 20% by mole of fluorine atom-containing repeating units with respect to all the repeating units.

5. The pattern forming method according to claim 1, wherein the hydrophobic resin includes a resin containing 0% to 20% by mole of fluorine atom-containing repeating units with respect to all the repeating units.

6. The pattern forming method according to claim 5, wherein the composition for forming an upper layer film contains a resin including 0% to 20% by mole of fluorine atom-containing repeating units with respect to all the repeating units.

7. The pattern forming method according to claim 1, wherein the composition for forming an upper layer film contains a resin including 0% to 20% by mole of fluorine atom-containing repeating units with respect to all the repeating units.

8. The pattern forming method according to claim 1, wherein the composition for forming an upper layer film contains a resin including repeating units having at least three $CH_3$ partial structures in the side chain moiety.

9. The pattern forming method according to claim 1, wherein the composition for forming an upper layer film contains a resin including repeating units having a monocyclic or polycyclic cycloalkyl group.

10. The pattern forming method according to claim 1, wherein the composition for forming an upper layer film contains a resin having a glass transition temperature of 50° C. or higher.

11. The pattern forming method according to claim 1, wherein the composition for forming an upper layer film contains at least one compound selected from the group consisting of the following (A1) and (A2):
(A1) a basic compound or a base generator; and
(A2) a compound containing a bond or group selected from the group consisting of an ether bond, a thioether bond, a hydroxyl group, a thiol group, a carbonyl bond, and an ester bond.

12. The pattern forming method according to claim 1, wherein the step b is a step of coating a composition for forming an upper layer film onto the resist film, followed by carrying out heating to 100° C. or higher, to form an upper layer film on the resist film.

13. The pattern forming method according to claim 1, wherein the developer is a developer including an organic solvent.

14. The pattern forming method according to claim 1, wherein a weight-average molecular weight of the hydrophobic resin in terms of standard polystyrene is 1,000 to 50,000.

15. The pattern forming method according to claim 1, wherein a weight-average molecular weight of the hydrophobic resin in terms of standard polystyrene is 2,000 to 15,000.

16. A method for manufacturing an electronic device, comprising:
- a step of preparing a substrate, wherein the substrate is an inorganic substrate,
  or
  - a substrate used in a process for manufacturing a semiconductor, in a process for manufacturing a circuit board, or in lithographic processes of photo-fabrication; and
- a step of forming a pattern on the prepared substrate using the pattern forming method according to claim 1.

17. A pattern forming method comprising:
- a step a of coating an active-light-sensitive or radiation-sensitive resin composition onto a substrate to form a resist film;
- a step b of coating a composition for forming an upper layer film onto the resist film to form an upper layer film on the resist film;
- a step c of exposing the resist film having the upper layer film formed thereon; and
- a step d of developing the exposed resist film using a developer including an organic solvent to form a pattern,
- wherein the active-light-sensitive or radiation-sensitive resin composition contains a hydrophobic resin, and
- a content of the hydrophobic resin is 0.1 to 7% by mass with respect to the total solid content of the active-light-sensitive or radiation-sensitive resin composition.

* * * * *